US009414503B2

(12) United States Patent
Lee et al.

(10) Patent No.: US 9,414,503 B2
(45) Date of Patent: Aug. 9, 2016

(54) MULTI-DISPLAY DEVICE

(71) Applicant: LG ELECTRONICS INC., Seoul (KR)

(72) Inventors: Jaekwan Lee, Seoul (KR); Sangpil Byun, Seoul (KR); Donghyun Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 131 days.

(21) Appl. No.: 13/693,324

(22) Filed: Dec. 4, 2012

(65) Prior Publication Data

US 2014/0078685 A1 Mar. 20, 2014

(30) Foreign Application Priority Data

Sep. 14, 2012 (KR) ........................ 10-2012-0102393
Sep. 14, 2012 (KR) ........................ 10-2012-0102394
Sep. 14, 2012 (KR) ........................ 10-2012-0102397

(51) Int. Cl.
*H05K 5/00* (2006.01)
*G09F 9/302* (2006.01)

(52) U.S. Cl.
CPC ............ *H05K 5/0017* (2013.01); *G09F 9/3026* (2013.01)

(58) Field of Classification Search
None
See application file for complete search history.

(56) References Cited

U.S. PATENT DOCUMENTS 3,426,913 A * 2/1969 Abatiell, Jr. ........ G09F 15/0068 211/194
4,785,565 A * 11/1988 Kuffner .......................... 40/605
5,299,017 A * 3/1994 Furuno ......................... 348/786
5,317,344 A * 5/1994 Beaman et al. ............... 347/237
5,321,505 A * 6/1994 Leddy ........................... 348/383
5,494,178 A * 2/1996 Maharg ................. A47F 5/0815 211/182
5,523,769 A * 6/1996 Lauer et al. .................... 345/1.3
5,600,910 A * 2/1997 Blackburn ...................... 40/605
6,054,968 A * 4/2000 De Matteo ...................... 312/7.2
6,144,438 A * 11/2000 Izumi ........................... 349/155
6,314,669 B1 * 11/2001 Tucker ............................ 40/448
6,634,124 B1 * 10/2003 Bierschbach ................... 40/452
6,729,054 B1 * 5/2004 VanderTuin .............. G09F 9/30 16/236
6,817,123 B2 * 11/2004 Okazaki et al. ................. 40/452
6,951,068 B1 * 10/2005 Weatherill ................ G09F 1/12 40/605

(Continued)

FOREIGN PATENT DOCUMENTS

CN 201894525 U 7/2011
CN 102263049 A 11/2011

(Continued)

OTHER PUBLICATIONS

European Search Report dated Aug. 6, 2014 issued in Application No. 12008105.4.

(Continued)

*Primary Examiner* — Xanthia C Cunningham
(74) *Attorney, Agent, or Firm* — KED & Associates, LLP

(57) ABSTRACT

A multi-display device includes a main frame, a plurality of module supporters disposed on the main frame, a plurality of display modules which are hung on the plurality of module supporters, and a spacer positioned between the two adjacent display modules. Each of the plurality of display modules includes a display panel. The spacer includes a base plate extending in a width direction of the display modules, a first protrusion extending from a first surface of the base plate, and a second protrusion extending from a second surface opposite the first surface of the base plate. The base plate includes a portion which protrudes further than the two adjacent display modules in the width direction of the display modules.

19 Claims, 61 Drawing Sheets

(56) References Cited

U.S. PATENT DOCUMENTS

| | | | | |
|---|---|---|---|---|
| 6,956,541 | B2 * | 10/2005 | McClintock | 345/1.1 |
| 7,064,673 | B1 * | 6/2006 | Bonham | 340/815.4 |
| 7,142,181 | B2 * | 11/2006 | Wang et al. | 345/82 |
| 7,411,566 | B2 * | 8/2008 | Chang et al. | 345/1.1 |
| 7,548,415 | B2 * | 6/2009 | Kim | 361/679.27 |
| 7,777,699 | B2 * | 8/2010 | Varrin et al. | 345/76 |
| 7,877,910 | B2 * | 2/2011 | Thorjussen et al. | 40/452 |
| 8,042,698 | B2 * | 10/2011 | Kim | F16M 13/02 211/78 |
| D669,532 | S * | 10/2012 | Killian | D19/52 |
| 8,317,146 | B2 * | 11/2012 | Jung et al. | 248/286.1 |
| 8,539,705 | B2 * | 9/2013 | Bullister | 40/733 |
| 8,595,968 | B2 * | 12/2013 | Byfield | 40/732 |
| 8,599,108 | B2 * | 12/2013 | Kline et al. | 345/46 |
| 2003/0067418 | A1 * | 4/2003 | McClintock | 345/1.1 |
| 2005/0134524 | A1 * | 6/2005 | Parker et al. | 345/1.1 |
| 2006/0232496 | A1 * | 10/2006 | Sato | G02F 1/13336 345/1.3 |
| 2006/0238440 | A1 * | 10/2006 | Kim et al. | 345/1.1 |
| 2007/0000849 | A1 * | 1/2007 | Lutz | G09F 9/3026 211/26 |
| 2007/0164923 | A1 * | 7/2007 | Kanai et al. | 345/1.1 |
| 2008/0012790 | A1 * | 1/2008 | Matsuyama | 345/1.3 |
| 2008/0024387 | A1 * | 1/2008 | Maskeny et al. | 345/1.1 |
| 2008/0128310 | A1 * | 6/2008 | Kao et al. | 206/521 |
| 2009/0016806 | A1 * | 1/2009 | Wolf et al. | 403/24 |
| 2009/0091512 | A1 * | 4/2009 | Jung et al. | 345/1.1 |
| 2009/0167634 | A1 * | 7/2009 | Han | 345/1.3 |
| 2009/0225506 | A1 * | 9/2009 | Lee et al. | 361/679.21 |
| 2009/0322985 | A1 * | 12/2009 | Mizuuchi | 349/62 |
| 2010/0011646 | A1 * | 1/2010 | Tang | 40/725 |
| 2010/0321917 | A1 | 12/2010 | Kim et al. | 361/829 |
| 2011/0084892 | A1 * | 4/2011 | Han et al. | 345/1.3 |
| 2011/0128208 | A1 * | 6/2011 | Choi | 345/1.1 |
| 2011/0298690 | A1 * | 12/2011 | Reilly | 345/1.1 |
| 2011/0309934 | A1 * | 12/2011 | Henson et al. | 340/568.2 |
| 2012/0013562 | A1 * | 1/2012 | Jyonoshita et al. | 345/173 |
| 2012/0127405 | A1 * | 5/2012 | Lee et al. | 349/106 |
| 2012/0224311 | A1 * | 9/2012 | Sutherland et al. | 361/679.01 |
| 2013/0009852 | A1 * | 1/2013 | Moscovitch | 345/1.1 |
| 2013/0188327 | A1 * | 7/2013 | Lee et al. | 361/807 |

FOREIGN PATENT DOCUMENTS

| | | | |
|---|---|---|---|
| CN | 102272812 | A | 12/2011 |
| KR | 10-1043987 | B1 | 6/2011 |

OTHER PUBLICATIONS

Chinese Office Action issued in related Application No. 201310014745.9 dated Jun. 12, 2015 (English Translation Attached).

* cited by examiner (A)

(B)

MULTI-DISPLAY DEVICE

This application claims the benefit of Korean Patent Application Nos. 10-2012-0102397 filed on Sep. 14, 2012, 10-2012-0102394 filed on Sep. 14, 2012; and 10-2012-0102393 filed on Sep. 14, 2012, the entire contents of which are incorporated herein by reference for all purposes as if fully set forth herein.

BACKGROUND OF THE INVENTION

1. Field of the Invention

Embodiments of the invention relate to a multi-display device.

2. Discussion of the Related Art

A multi-display device may be manufactured by disposing a plurality of display modules to be adjacent to one another.

The multi-display device may implement the large-sized screen using the small-sized display modules.

SUMMARY OF THE INVENTION

In one aspect, there is a multi-display device including a main frame, a plurality of module supporters disposed on the main frame, a plurality of display modules which are hung on the plurality of module supporters, each of the plurality of display modules including a display panel, and a spacer positioned between the two adjacent display modules, wherein the spacer includes a base plate extending in a width direction of the display modules, a first protrusion extending from a first surface of the base plate, and a second protrusion extending from a second surface opposite the first surface of the base plate, wherein the base plate includes a portion which protrudes further than the two adjacent display modules in the width direction of the display modules.

The first protrusion has spirals, wherein a diameter of the first protrusion is greater than a diameter of the second protrusion, wherein a length of the second protrusion is equal to or greater than a length of the first protrusion.

A surface roughness of a third surface adjacent to the first and second surfaces of the base plate is greater than a surface roughness of the first and second surfaces of the base plate.

Each of first and second display modules, which are adjacent to each other, has a hole, wherein the first protrusion is inserted into the hole of the first display module, and the second protrusion is inserted into the hole of the second display module.

Each of the first and second display modules includes: the display panel; a frame attached to a back surface of the display panel; a back cover positioned in the rear of the frame; and a structure positioned between the frame and the back cover, the structure having a hole.

A diameter of the base plate in the width direction of the display modules is greater than a width of the structure in the width direction of the display modules.

The base plate includes a portion, which protrudes further than the structure to the backward at a boundary of the first and second display modules in the width direction of the display modules.

The multi-display device further includes a substrate positioned in the front of the display module; and a side cover which is positioned on the side of the display module and the side of the substrate and is connected to the display module and the substrate.

The side cover includes an outer cover and an inner cover positioned between the outer cover and the substrate, wherein elasticity of the inner cover is greater than elasticity of the outer cover.

The outer cover includes a first hole for fastening the outer cover to the display module and a first rail corresponding to the substrate, wherein the inner cover includes a second rail positioned on the first rail, wherein an end of the substrate is inserted into the second rail.

A length of the inner cover is less than a length of the outer cover.

The display module includes: the display panel; a frame attached to a back surface of the display panel; a back cover positioned in the rear of the frame; and a structure which is positioned between the frame and the back cover and connects the frame to the back cover, the structure having a second hole corresponding to the first hole of the outer cover.

The plurality of substrates are inserted into the second rail of at least one of the plurality of inner covers.

The number of substrates is equal to or less than the number of display modules.

The plurality of module supporters include: at least one horizontal portion connected to the main frame in a horizontal direction; and at least one vertical portion which is hung on the horizontal portion in a vertical direction.

The at least one horizontal portion includes a horizontal rail formed in the horizontal direction, wherein the at least one vertical portion includes a roller which is movable along the horizontal rail.

The at least one horizontal portion includes first and second horizontal portions, which are positioned on the main frame in the horizontal direction and are parallel to each other, the first horizontal portion being positioned above the second horizontal portion in the vertical direction, wherein the roller includes a first roller corresponding to the horizontal rail formed in the first horizontal portion and a second roller corresponding to the horizontal rail formed in the second horizontal portion.

An axis of the first roller extends in a direction vertical to the horizontal direction and the vertical direction, wherein an axis of the second roller extends in the vertical direction.

The at least one vertical portion includes first and second vertical portions, which are hung on the first and second horizontal portions in the vertical direction and are positioned parallel to each other.

The at least one vertical portion includes: a base having a hole; a spring part fixed to the base; and a supporter connected to the spring part using a connection rod, a protrusion of the display module passing through the hole of the base and being hung on the supporter.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
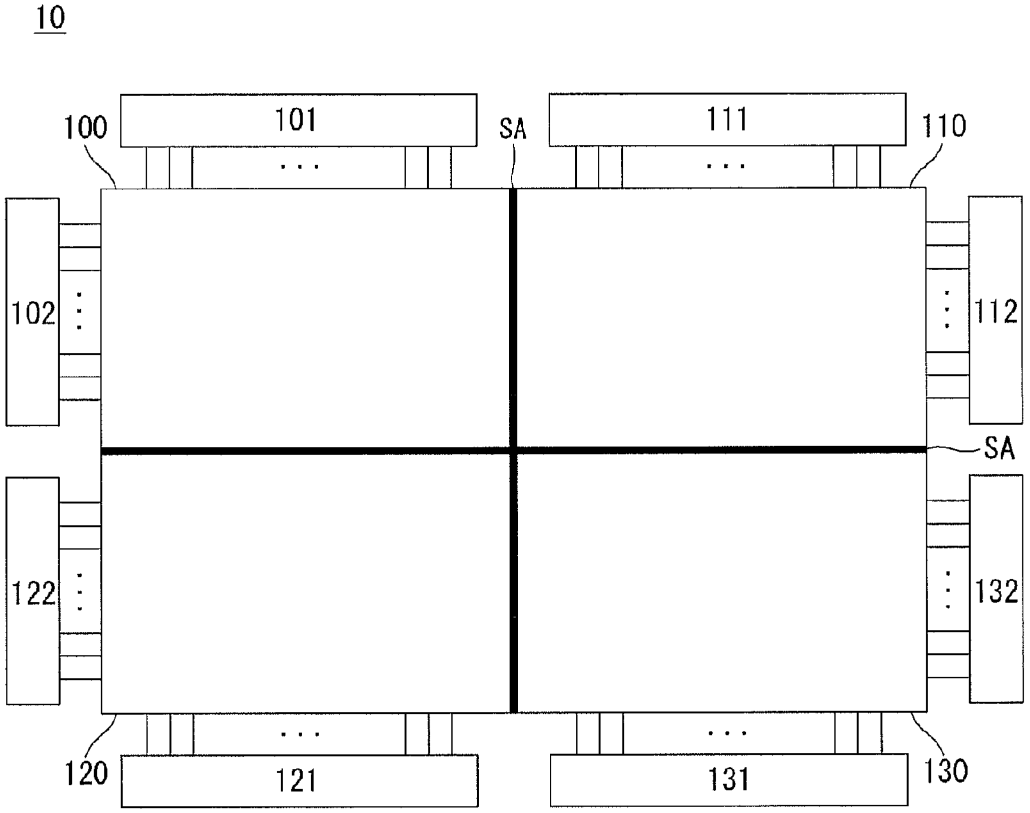
FIGS. 1 to 13 illustrate a configuration and a manufacturing method of a multi-display device according to an example embodiment of the invention.

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to "or" being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity.

Hereinafter, a plasma display panel (PDP) is used as an example of a display panel. Other display panels may be used. For example, a liquid crystal display (LCD) panel, a field emission display (FED) panel, and an organic light emitting diode (OLED) display panel may be used.

FIGS. 1 to 13 illustrate a configuration and a manufacturing method of a multi-display device according to an example embodiment of the invention.

As shown in FIG. 1, a multi-plasma display device 10 according to an example embodiment of the invention may include a plurality of plasma display panels 100, 110, 120, and 130 which are positioned adjacent to one another.

A 1-1 driver 101 and a 1-2 driver 102 may supply driving signals to the first plasma display panel 100 of the plurality of plasma display panels 100, 110, 120, and 130. The 1-1 driver 101 and the 1-2 driver 102 may be integrated into one integrated driver.

Further, a 2-1 driver 111 and a 2-2 driver 112 may supply driving signals to the second plasma display panel 110.

In other words, the multi-plasma display device 10 may be configured so that the plasma display panels 100, 110, 120, and 130 included in the multi-plasma display device 10 receive the driving signals from different drivers, respectively.

A boundary area, i.e., a seam SA may be formed between the two adjacent plasma display panels.

Because the multi-plasma display device 10 implements an image by disposing the individual plasma display panels 100, 110, 120, and 130 to be adjacent to one another, the seam SA may be formed between the two adjacent plasma display panels.

Each of the drivers shown in FIG. 1 may be a driving board.

Figure 2:
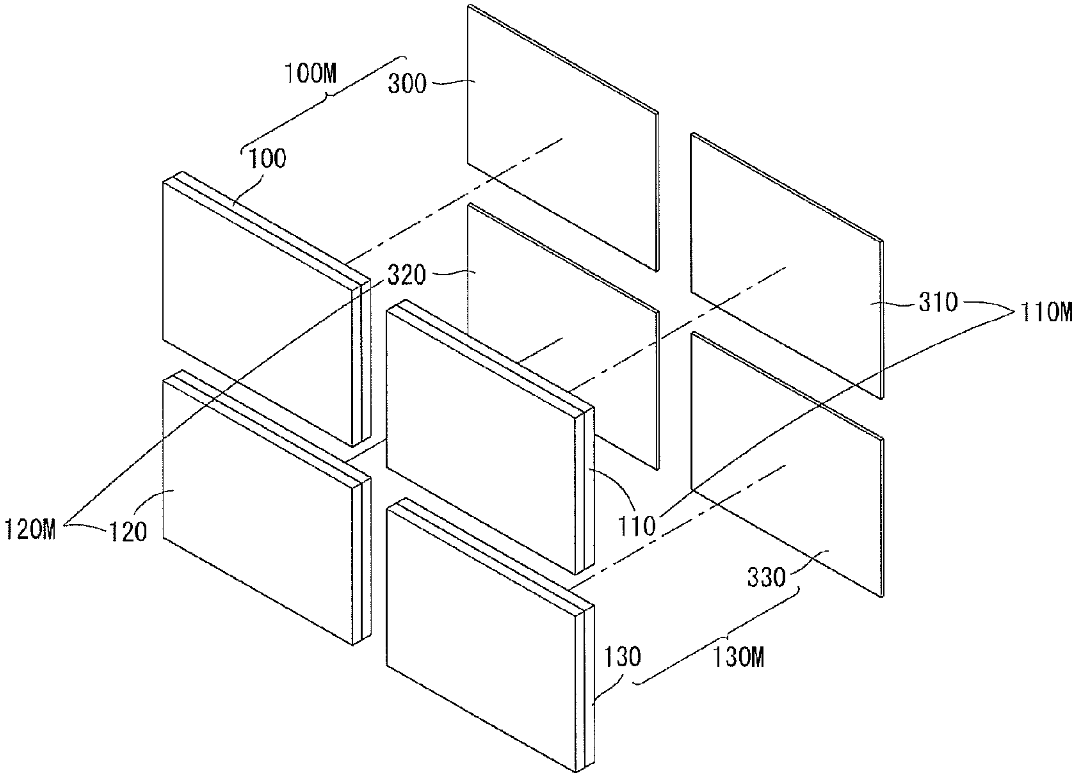

As shown in FIG. 2, a first plate 300 may be positioned on a back surface (i.e., a back surface of a back substrate of the first plasma display panel 100) of the first plasma display panel 100. A second plate 310 may be positioned on a back surface of the second plasma display panel 110, a third plate 320 may be positioned on a back surface of the third plasma display panel 120, and a fourth plate 330 may be positioned on a back surface of the fourth plasma display panel 130. The first to fourth plates 300 to 330 may be formed of a metal material. The first to fourth plates 300 to 330 may indicate a frame, a heat dissipation plate, a heat dissipation frame, a chassis, etc.

Figure 3:
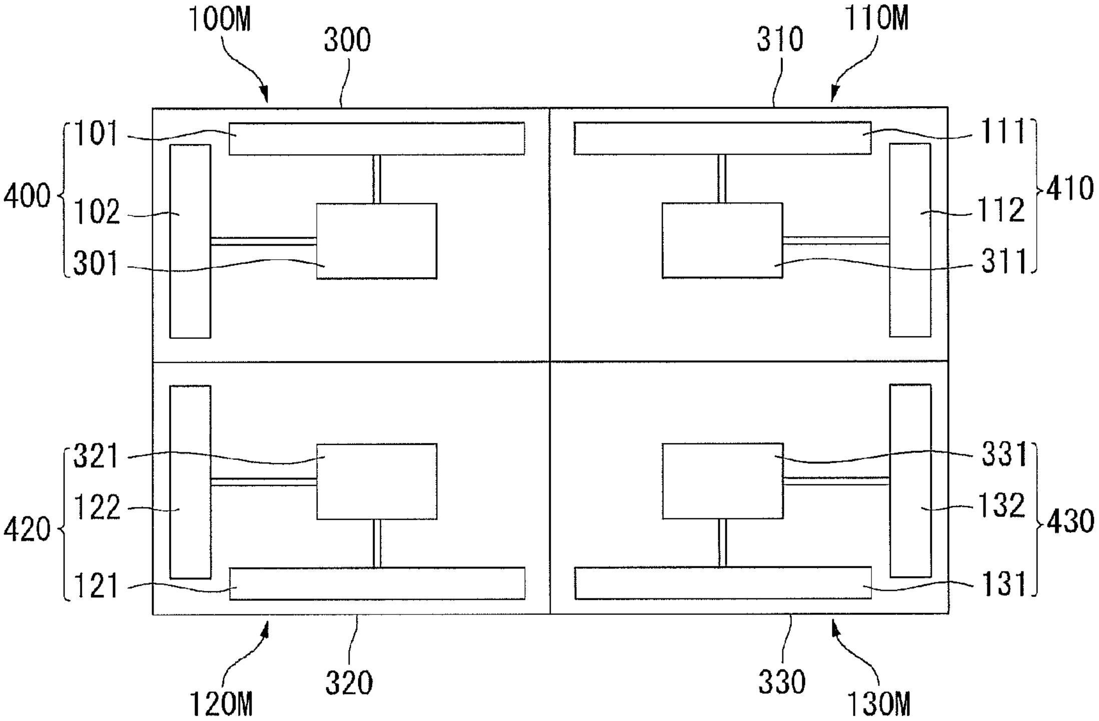

Driving boards for supplying the driving signals to the first to fourth plasma display panels 100 to 130 may be positioned on back surfaces of the first to fourth plates 300 to 330. For example, as shown in FIG. 3, a 1-1 driver 101, a 1-2 driver 102, and a first controller 301 may be positioned on the back surface of the first plate 300 in a board form. A 2-1 driver 111, a 2-2 driver 112, and a second controller 311 may be positioned on the back surface of the second plate 310 in a board form. A 3-1 driver 121, a 3-2 driver 122, and a third controller 321 may be positioned on the back surface of the third plate 320 in a board form. A 4-1 driver 131, a 4-2 driver 132, and a fourth controller 331 may be positioned on the back surface of the fourth plate 330 in a board form.

The 1-1, 2-1, 3-1, and 4-1 drivers 101, 111, 121, and 131 may supply driving signals to address electrodes of the first to fourth plasma display panels 100 to 130. The 1-2, 2-2, 3-2, and 4-2 drivers 102, 112, 122, and 132 may supply driving signals to scan electrodes and sustain electrodes of the first to fourth plasma display panels 100 to 130. The first to fourth controllers 301, 311, 321, 331 may control the 1-1, 2-1, 3-1, and 4-1 drivers 101, 111, 121, and 131 and the 1-2, 2-2, 3-2, and 4-2 drivers 102, 112, 122, and 132.

Hereinafter, the 1-1 driver 101, the 1-2 driver 102, and the first controller 301 may be referred to as a first driver 400. The first driver 400 may supply the driving signals to the first plasma display panel 100.

Hereinafter, the 2-1 driver 111, the 2-2 driver 112, and the second controller 311 may be referred to as a second driver 410. The second driver 410 may supply the driving signals to the second plasma display panel 110.

Hereinafter, the 3-1 driver 121, the 3-2 driver 122, and the third controller 321 may be referred to as a third driver 420. The third driver 420 may supply the driving signals to the third plasma display panel 120.

Hereinafter, the 4-1 driver 131, the 4-2 driver 132, and the fourth controller 331 may be referred to as a fourth driver 430. The fourth driver 430 may supply the driving signals to the fourth plasma display panel 130.

FIG. 3 shows that the first to fourth controllers 301 to 331 are respectively positioned on the back surfaces of the first to fourth plates 300 to 330. However, the first to fourth controllers 301 to 331 may be integrated into one board.

The panel, the plate, and the driving board may configure a display module. In other words, the multi-plasma display device 10 includes a plurality of display modules 100M, 110M, 120M, and 130M which are positioned adjacent to one another. The plurality of display modules 100M, 110M, 120M, and 130M may include the plasma display panels, the plates, the driving boards, and a back cover (not shown). More specifically, the plurality of display modules 100M, 110M, 120M, and 130M may include the plasma display panels, the plates, the driving boards, the back cover, and at least one structure between the back cover and the plasma display panels.

Figure 4:
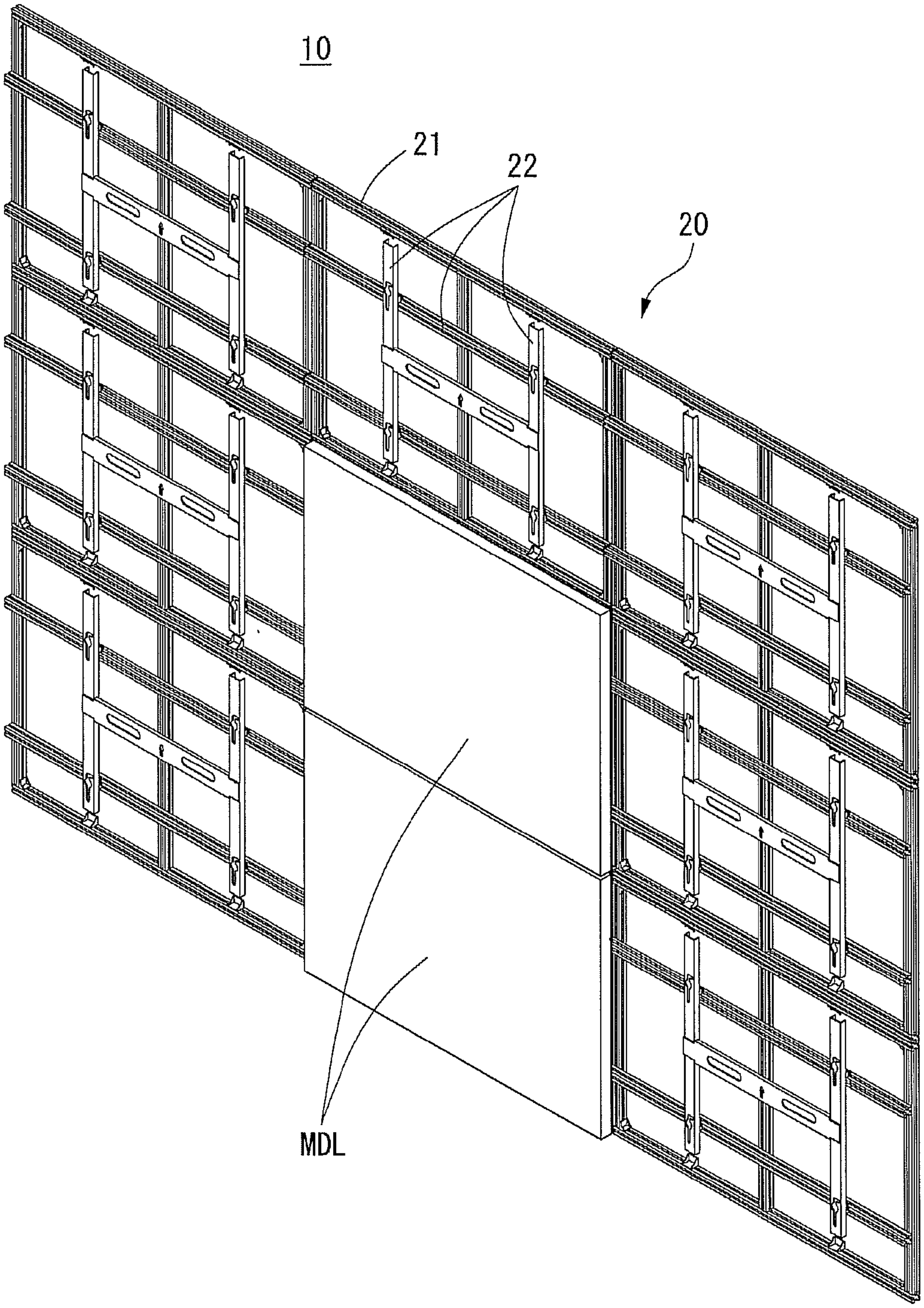

As shown in FIG. 4, a plurality of display modules MDL may hang on a multi-supporter 20.

As shown in FIG. 4, the multi-plasma display device 10 according to the embodiment of the invention may include the multi-supporter 20 and the plurality of display modules MDL hanging on the multi-supporter 20.

The multi-supporter 20 may include a main frame 21 and a plurality of module supporters 22 connected to the main frame 21.

The plurality of display modules MDL may respectively hang on the plurality of module supporters 22.

Figure 5:
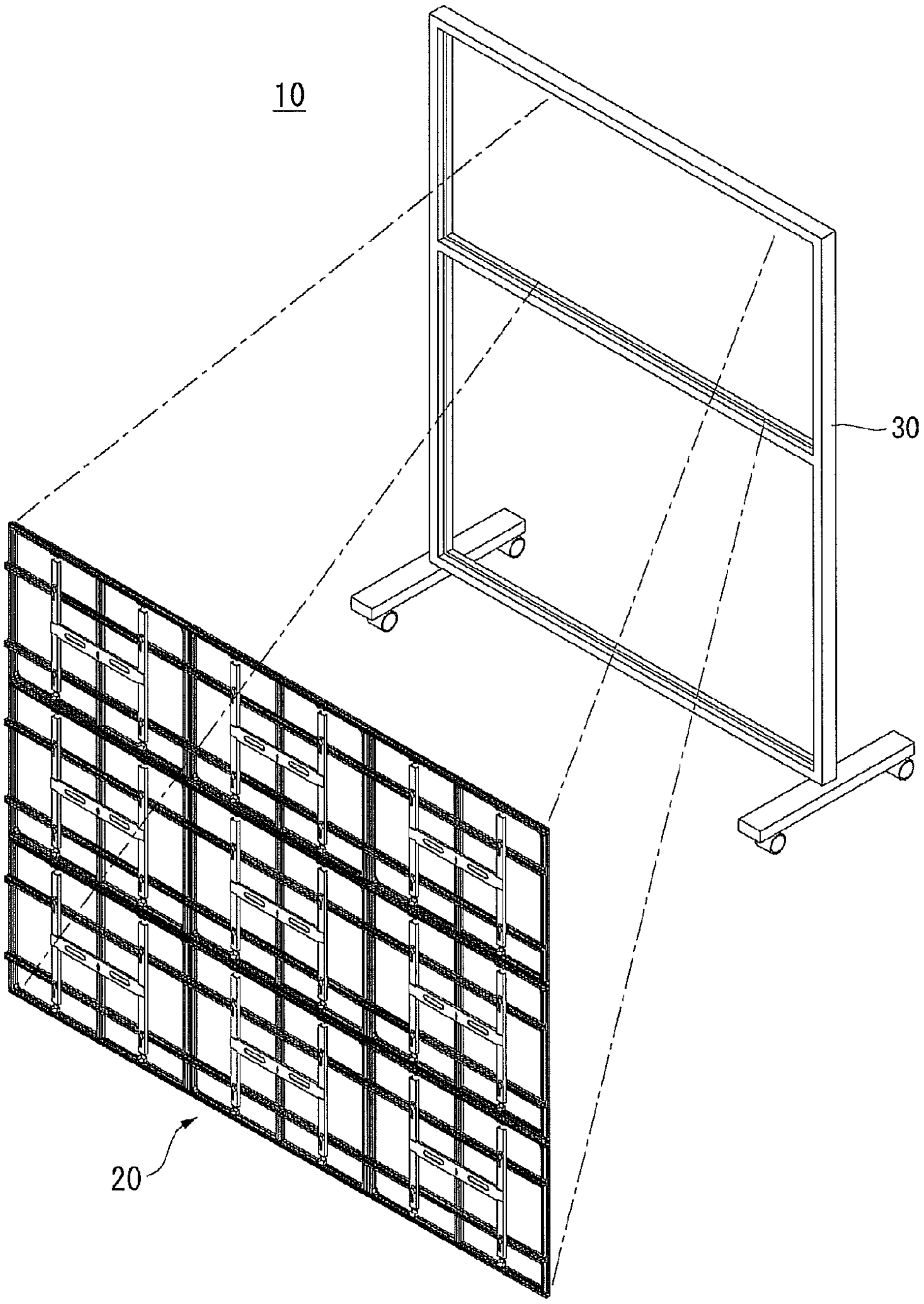

As shown in FIG. 5, the multi-supporter 20 may be connected to a stand 30. In this instance, the multi-plasma display device 10 may include the stand 30, to which the multi-supporter 20 is connected, and thus may be called a stand type multi-plasma display device.

On the contrary, the stand 30 may be omitted in the multi-plasma display device 10. For example, the multi-plasma display device 10 may be installed by hanging the multi-supporter 20 on a predetermined wall. In this instance, the multi-plasma display device 10 may be called a wall mounted type multi-plasma display device.

The plasma display panel may display an image in a frame including a plurality of subfields.

Figure 6:
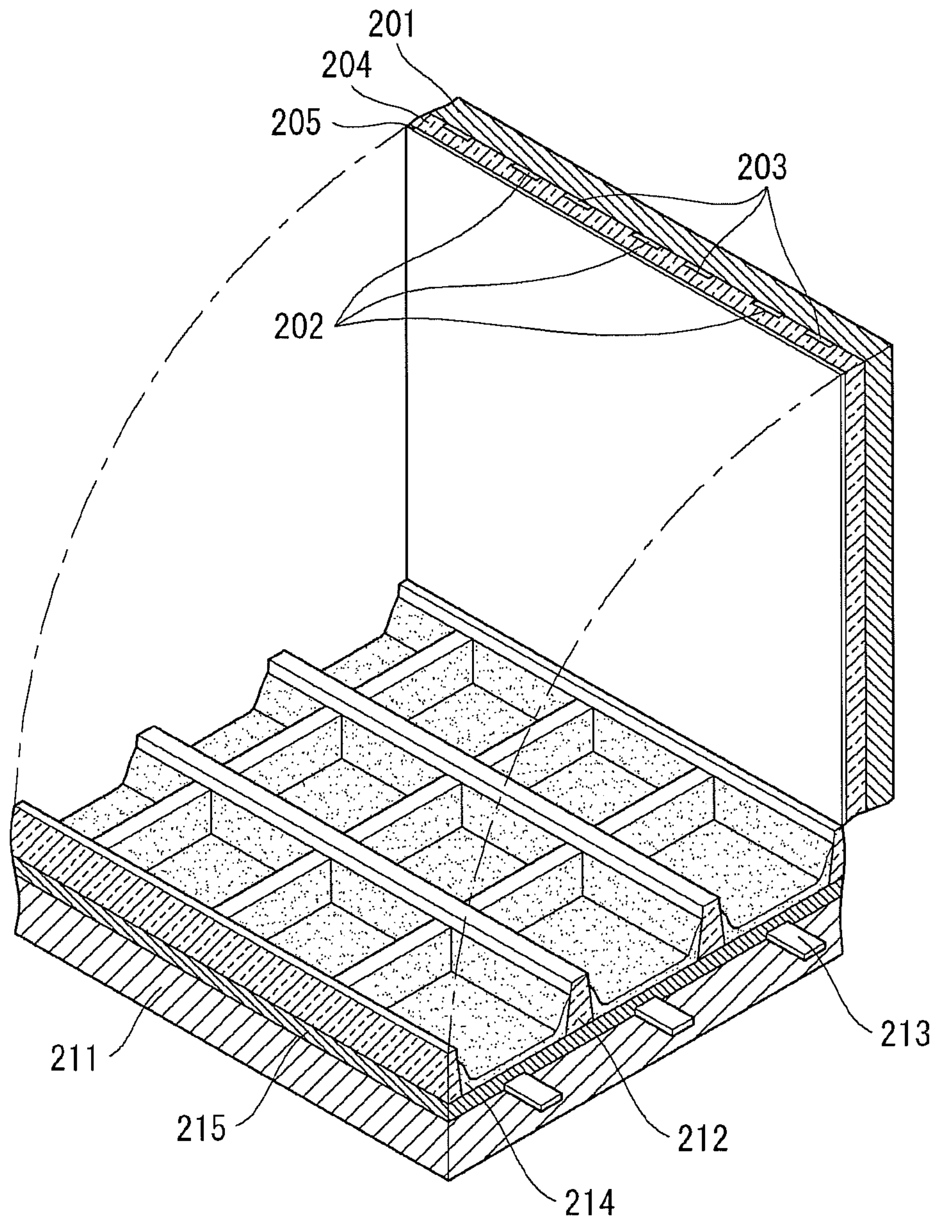

As shown in FIG. 6, each of the first to fourth plasma display panels 100 to 130 may include a front substrate 201, on which a plurality of first electrodes 202 (or Y) and 203 (or Z) are formed, and a back substrate 211 on which a plurality of second electrodes 213 (or X) are formed to cross the first electrodes 202 and 203.

In the embodiment of the invention, the first electrodes 202 and 203 may include scan electrodes 202 and sustain electrodes 203 parallel to each other, and the second electrodes 213 may be called address electrodes.

An upper dielectric layer 204 may be formed on the scan electrode 202 and the sustain electrode 203 to limit a discharge current of the scan electrode 202 and the sustain electrode 203 and to provide insulation between the scan electrode 202 and the sustain electrode 203.

A protective layer 205 may be formed on the upper dielectric layer 204 to facilitate discharge conditions. The protective layer 205 may be formed of a material having a high secondary electron emission coefficient, for example, magnesium oxide (MgO).

A lower dielectric layer 215 may be formed on the address electrode 213 to provide insulation between the address electrodes 213.

Barrier ribs 212 of a stripe type, a well type, a delta type, a honeycomb type, etc. may be formed on the lower dielectric layer 215 to provide discharge spaces (i.e., discharge cells). Hence, a first discharge cell emitting red light, a second discharge cell emitting blue light, and a third discharge cell emitting green light, etc. may be formed between the front substrate 201 and the back substrate 211. The first, second, and third discharge cells may configure a pixel.

The address electrode 213 may cross the scan electrode 202 and the sustain electrode 203 in one discharge cell. Namely, each discharge cell is formed at a crossing of the scan electrode 202, the sustain electrode 203, and the address electrode 213.

Each of the discharge cells provided by the barrier ribs 212 may be filled with a predetermined discharge gas.

A phosphor layer 214 may be formed inside the discharge cells to emit visible light for an image display during an address discharge. For example, first, second, and third phosphor layers that respectively generate red, blue, and green light may be formed inside the discharge cells.

While the address electrode 213 may have a substantially constant width or thickness, a width or thickness of the address electrode 213 inside the discharge cell may be different from a width or thickness of the address electrode 213 outside the discharge cell. For example, a width or thickness of the address electrode 213 inside the discharge cell may be greater than a width or thickness of the address electrode 213 outside the discharge cell.

When a predetermined signal is supplied to at least one of the scan electrode 202, the sustain electrode 203, and the address electrode 213, a discharge may occur inside the discharge cell. The discharge may allow the discharge gas filled in the discharge cell to generate ultraviolet rays. The ultraviolet rays may be incident on phosphor particles of the phosphor layer 214, and then the phosphor particles may emit visible light. Hence, an image may be displayed on the screen of the plasma display panel 100.

A frame for achieving a gray scale of an image displayed in the plasma display module described with reference to FIG. 7.

Figure 7:
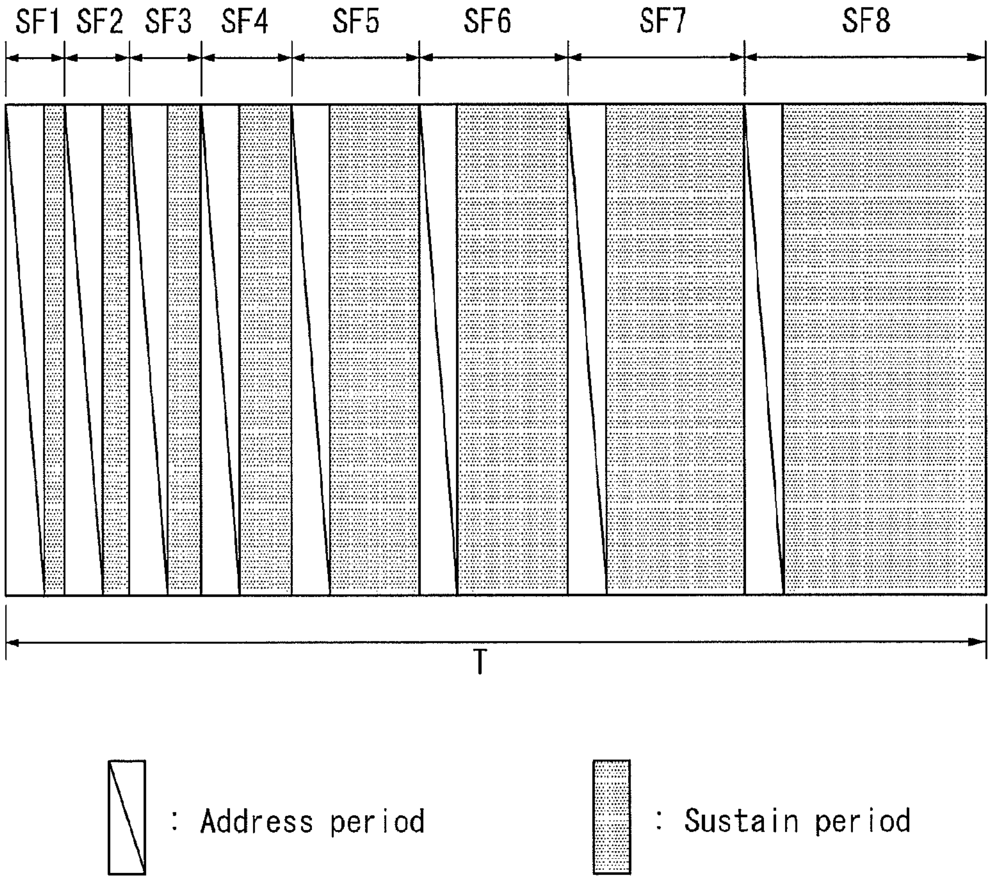

As shown in FIG. 7, a frame for achieving a gray scale of an image may include a plurality of subfields.

Each of the plurality of subfields may be divided into an address period and a sustain period. During the address period, the discharge cells not to generate a discharge may be selected or the discharge cells to generate a discharge may be selected. During the sustain period, a gray scale may be achieved depending on the number of discharges.

For example, if an image with 256-gray level is to be displayed, as shown in FIG. 7, a frame may be divided into 8 subfields SF1 to SF8. Each of the 8 subfields SF1 to SF8 may include an address period and a sustain period.

Furthermore, at least one of a plurality of subfields of a frame may further include a reset period for initialization.

At least one of a plurality of subfields of a frame may not include a sustain period.

The number of sustain signals supplied during the sustain period may determine a gray level of each of the subfields. For example, in such a method of setting a gray level of a first subfield at $2^0$ and a gray level of a second subfield at $2^1$, the sustain period increases in a ratio of $2^n$ (where, n=0, 1, 2, 3, 4, 5, 6, 7) in each of the subfields. Hence, various gray levels of an image may be achieved by controlling the number of sustain signals supplied during the sustain period of each subfield depending on a gray level of each subfield.

Although FIG. 7 shows that one frame includes 8 subfields, the number of subfields constituting a frame may vary. For example, a frame may include 10 or 12 subfields.

Further, although FIG. 7 shows that the subfields of the frame are arranged in increasing order of gray level weight, the subfields may be arranged in decreasing order of gray level weight or may be arranged regardless of gray level weight.

Figure 8:
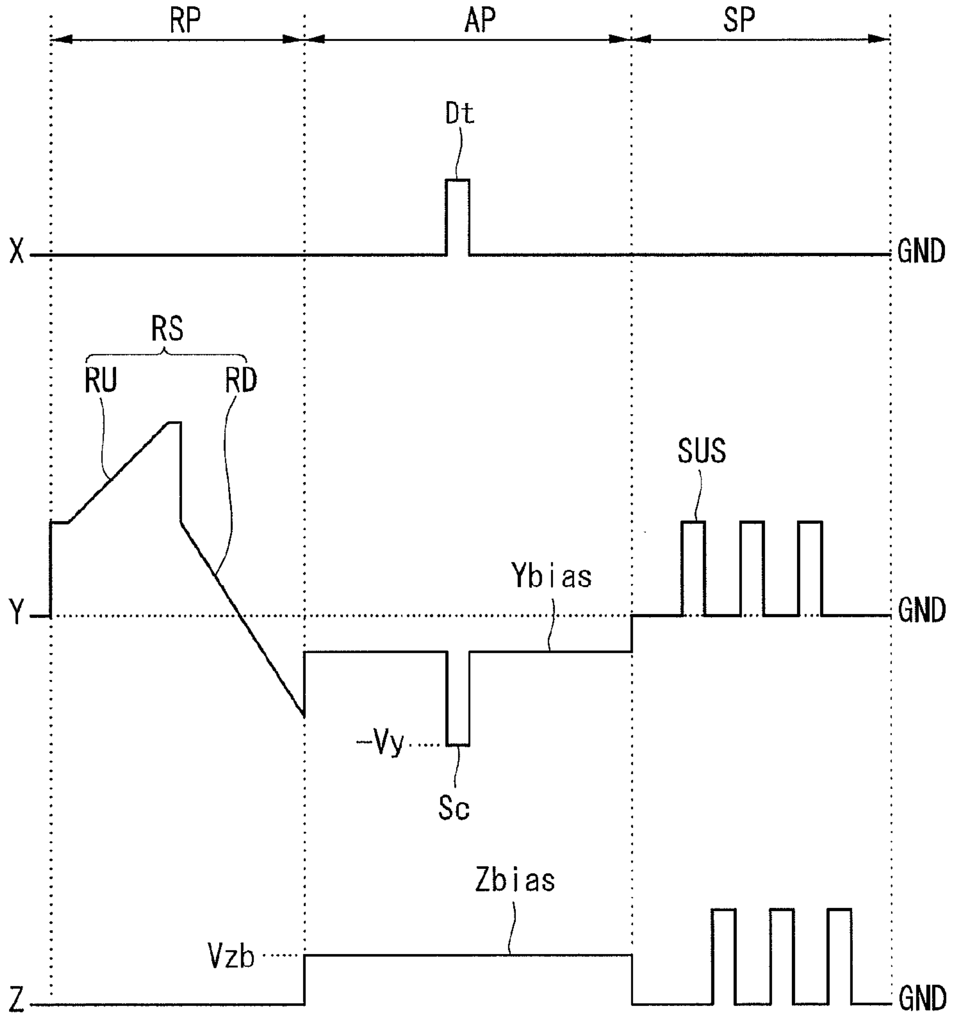

A driving waveform for driving the plasma display module is illustrated in FIG. 8.

As shown in FIG. 8, a reset signal RS may be supplied to the scan electrode Y during a reset period RP for initialization of at least one of a plurality of subfields of a frame. The reset signal RS may include a ramp-up signal RU with a gradually rising voltage and a ramp-down signal RD with a gradually falling voltage.

More specifically, the ramp-up signal RU may be supplied to the scan electrode Y during a setup period of the reset period RP, and the ramp-down signal RD may be supplied to the scan electrode Y during a set-down period following the setup period SU.

The ramp-up signal RU may generate a weak dark discharge (i.e., a setup discharge) inside the discharge cells. Hence, the wall charges may be uniformly distributed inside the discharge cells.

The ramp-down signal RD subsequent to the ramp-up signal RU may generate a weak erase discharge (i.e., a set-down discharge) inside the discharge cells. Hence, the remaining wall charges may be uniformly distributed inside the discharge cells to the extent that an address discharge occurs stably.

During an address period AP following the reset period RP, a scan reference signal Ybias having a voltage greater than a minimum voltage of the ramp-down signal RD may be supplied to the scan electrode Y.

In addition, a scan signal Sc falling from a voltage of the scan reference signal Ybias may be supplied to the scan electrode Y.

A pulse width of a scan signal supplied to the scan electrode during an address period of at least one subfield of a frame may be different from pulse widths of scan signals supplied during address periods of the other subfields of the frame. A pulse width of a scan signal in a subfield may be greater than a pulse width of a scan signal in a next subfield. For example, a pulse width of the scan signal may be gradually reduced in the order of 2.6 μs, 2.3 μs, 2.1 μs, 1.9 μs, etc. or may be reduced in the order of 2.6 μs, 2.3 μs, 2.3 μs, 2.1 μs, . . . , 1.9 μs, 1.9 μs, etc. in the successively arranged subfields.

As above, when the scan signal Sc is supplied to the scan electrode Y, a data signal Dt corresponding to the scan signal Sc may be supplied to the address electrode X.

As a voltage difference between the scan signal Sc and the data signal Dt is added to a wall voltage obtained by the wall charges produced during the reset period RP, an address discharge may occur inside the discharge cell to which the data signal Dt is supplied.

In addition, during the address period AP, a sustain reference signal Zbias may be supplied to the sustain electrode Z, so that the address discharge efficiently occurs between the scan electrode Y and the address electrode X.

During a sustain period SP following the address period AP, a sustain signal SUS may be supplied to at least one of the scan electrode Y or the sustain electrode Z. For example, the sustain signal SUS may be alternately supplied to the scan electrode Y and the sustain electrode Z.

Further, the address electrode X may be electrically floated during the sustain period SP. As the wall voltage inside the discharge cell selected by performing the address discharge is added to a sustain voltage Vs of the sustain signal SUS, every time the sustain signal SUS is supplied, a sustain discharge, i.e., a display discharge may occur between the scan electrode Y and the sustain electrode Z.

A method for manufacturing the multi-plasma display device according to the embodiment of the invention is schematically described below.

Figure 9:
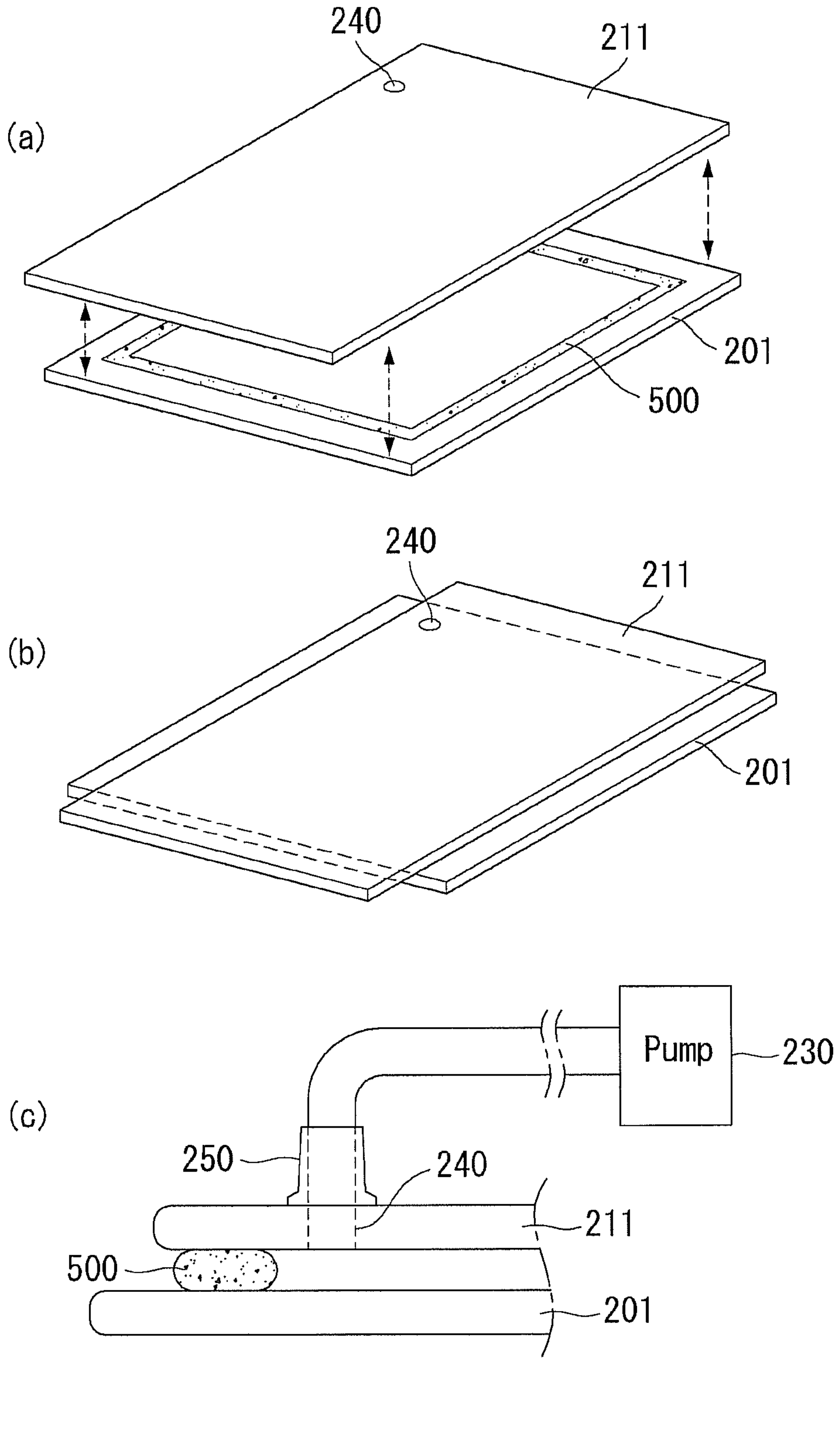

As shown in (a) of FIG. 9, a seal portion 500 may be formed at an edge of at least one of the front substrate 201 and the back substrate 211, on which an exhaust hole 240 is formed. As shown in (b) of FIG. 9, the front substrate 201 and the back substrate 211 may be attached to each other through the seal portion 500.

Subsequently, as shown in (c) of FIG. 9, an exhaust tip 250 may be connected to the exhaust hole 240, and an exhaust pump 230 may be connected to the exhaust tip 250.

The exhaust pump 230 may exhaust an impurity gas remaining in a discharge space between the front substrate 201 and the back substrate 211 to the outside and may inject a discharge gas such as argon (Ar), neon (Ne), and xenon (Xe) into the discharge space.

The discharge space between the front substrate 201 and the back substrate 211 may be sealed through the above-described method.

Figure 10:
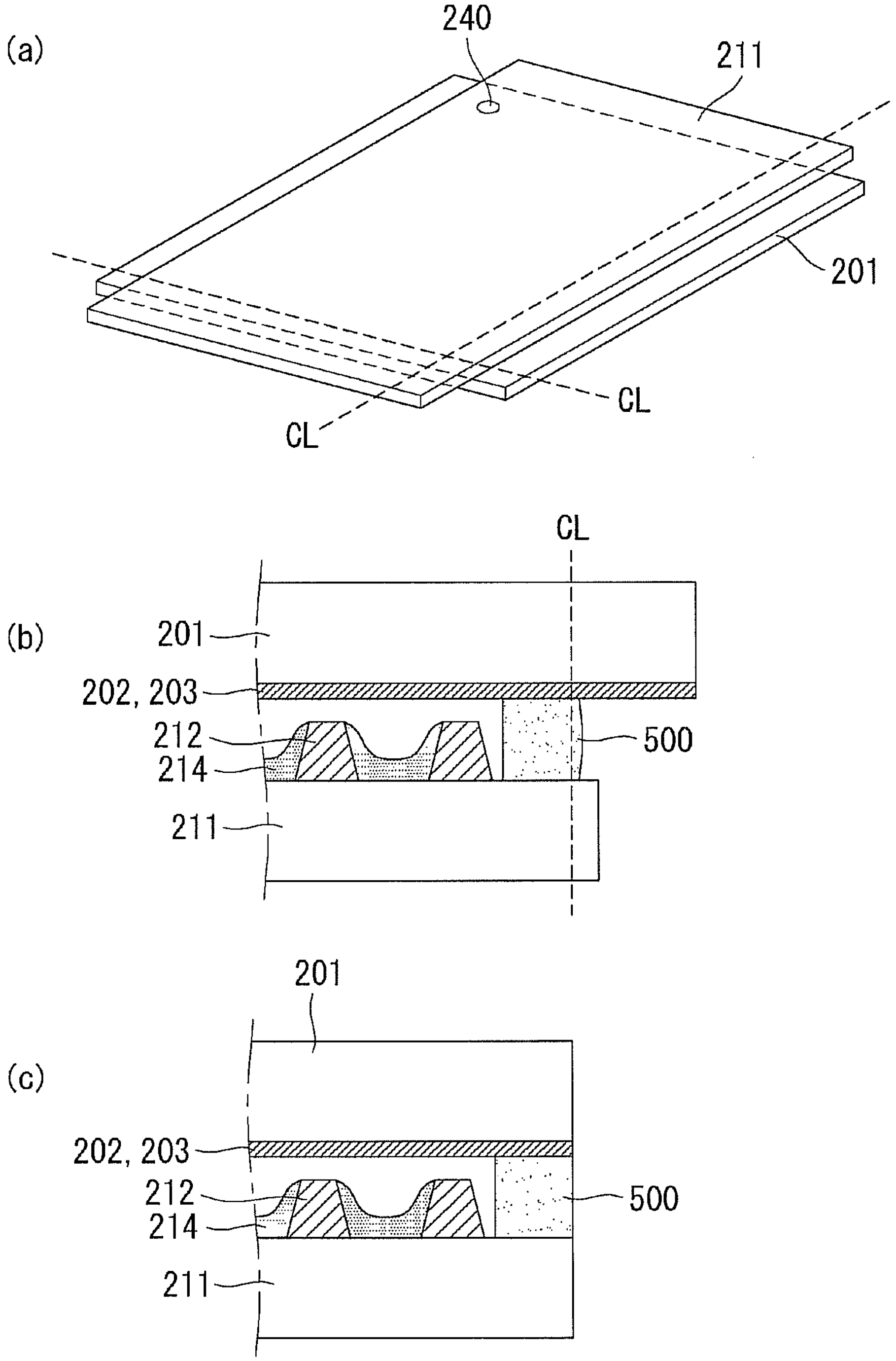

Next, as shown in (a) of FIG. 10, after the front substrate 201 and the back substrate 211 are attached to each other by sealing the discharge space between the front substrate 201 and the back substrate 211, the front substrate 201 and the back substrate 211 may be partially cut along a predetermined cutting line CL. The grinding may be carried out along with the cutting. For example, one long side and one short side of each of the front substrate 201 and the back substrate 211 may be cut and ground.

As shown in (b) and (c) of FIG. 10, cutting portions of the substrates 201 and 211 may prevent at least one of the front substrate 201 and the back substrate 211 from excessively protruding. Hence, the size of the plasma display panel, on which the image is not displayed, may be reduced.

Further, as shown in (b) and (c) of FIG. 10, the seal portion 500 may be cut in a process for partially cutting the front substrate 201 and the back substrate 211. As above, when the seal portion 500 is cut, the size of the plasma display panel, on which the image is not displayed, may be further reduced.

The display modules each including the plasma display panel manufactured using the method illustrated in FIG. 10 may be disposed adjacent to one another to manufacture the multi-plasma display panel.

Figure 11:
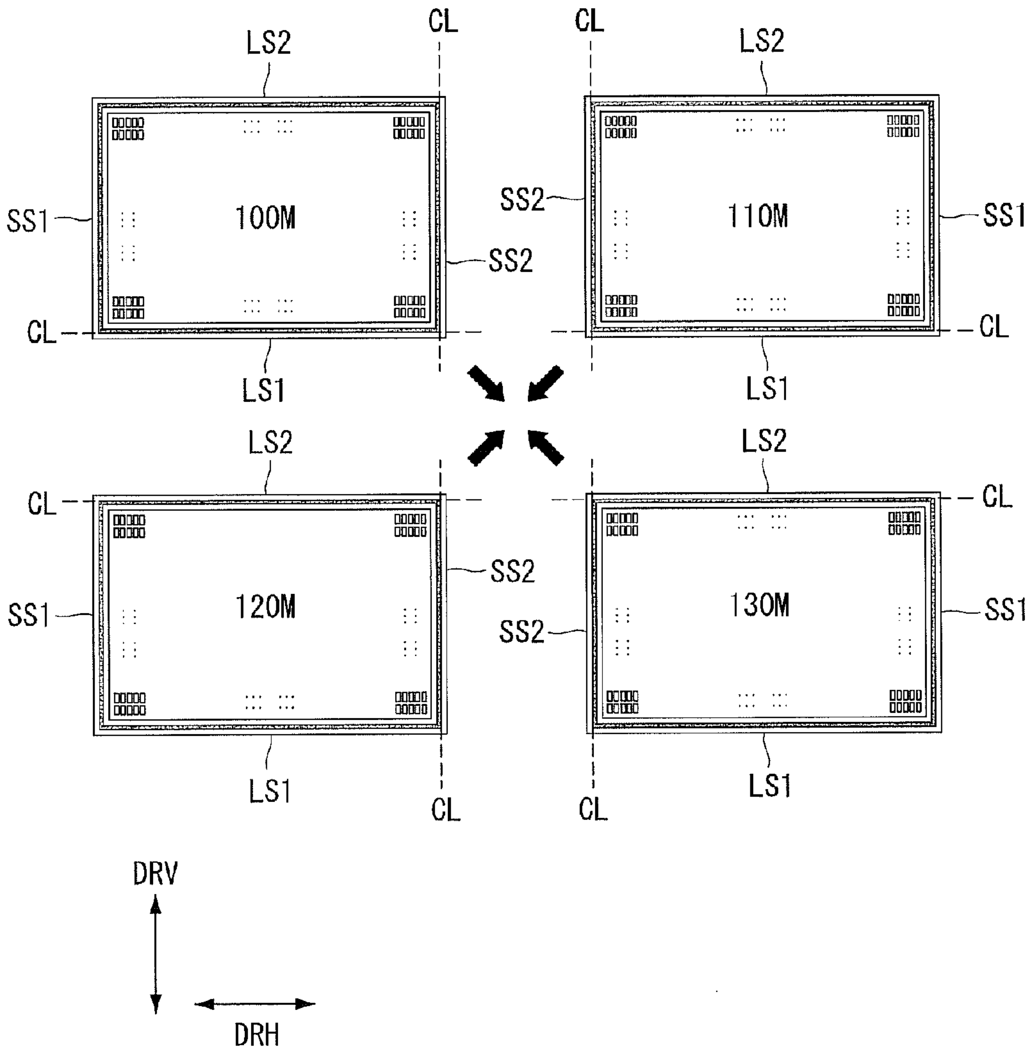

For example, as shown in FIG. 11, the first to fourth display modules 100M, 110M, 120M, and 130M may be arranged in a 2×2 matrix.

Further, the first to fourth display modules 100M, 110M, 120M, and 130M may be disposed, so that their cutting surfaces are adjacent to one another.

For example, the cutting and grinding processes may be performed on a second short side SS2 and a second long side LS2 of each of the first to fourth display modules 100M, 110M, 120M, and 130M.

More specifically, the second short side SS2 of the first display module 100M and the second short side SS2 of the second display module 110M may be positioned adjacent to each other. The second short side SS2 of the third display module 120M and the second short side SS2 of the fourth display module 130M may be positioned adjacent to each other.

Further, the second long side LS2 of the first display module 100M and the second long side LS2 of the third display module 120M may be positioned adjacent to each other. The second long side LS2 of the second display module 110M and the second long side LS2 of the fourth display module 130M may be positioned adjacent to each other.

As described above, when the first to fourth display modules 100M, 110M, 120M, and 130M are disposed so that their cutting surfaces are adjacent to one another, the size of the seam SA of the multi-plasma display device 10 may be reduced. Hence, the more natural image may be implemented.

FIG. 11 shows that the first to fourth display modules 100M, 110M, 120M, and 130M are arranged in a 2×2 matrix. Other matrix structures may be used. For example, the first to fourth display modules 100M, 110M, 120M, and 130M may be arranged in a 1×2 matrix or a 2×1 matrix.

Figure 12:
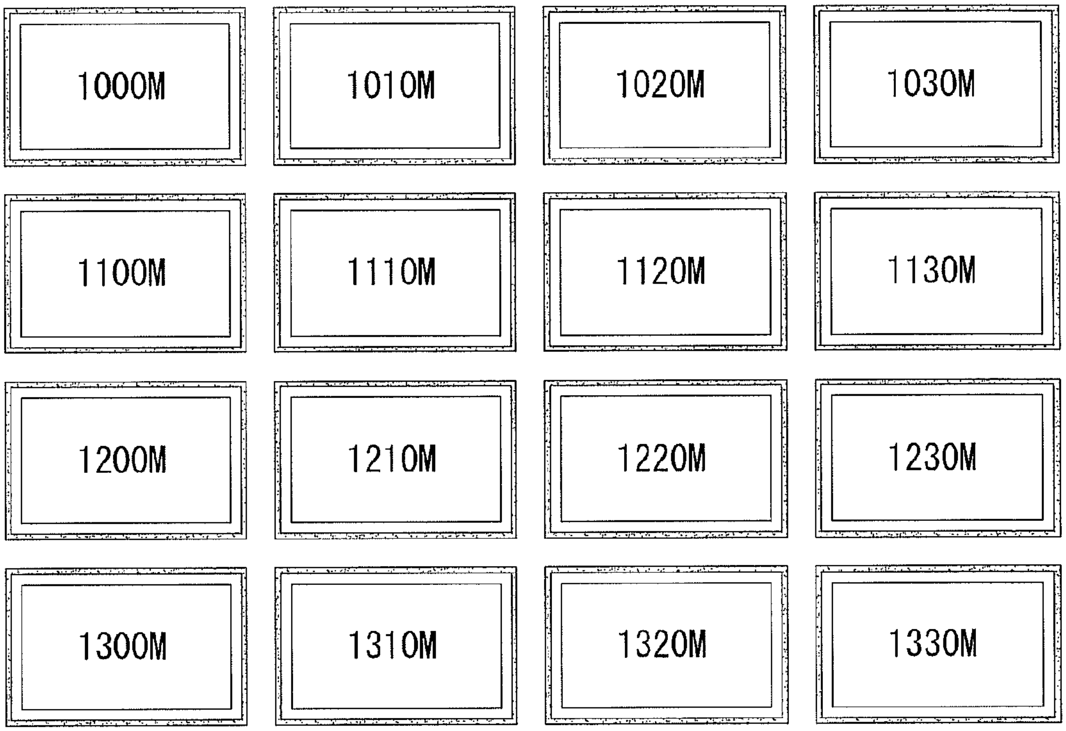

Alternatively, as shown in FIG. 12, the first to fourth display modules 100M, 110M, 120M, and 130M are arranged in a 4×4 matrix. The structure of the 4×4 matrix may be applied to (3 or more rows)×(3 or more columns) matrixes.

Among first to sixteenth display modules 1000M to 1330M of the 4×4 matrix shown in FIG. 12, the first, second, fifth, and sixth display modules 1000M, 1010M, 1100M, and 1110M are described below as an example with reference to FIG. 13.

Figure 13:
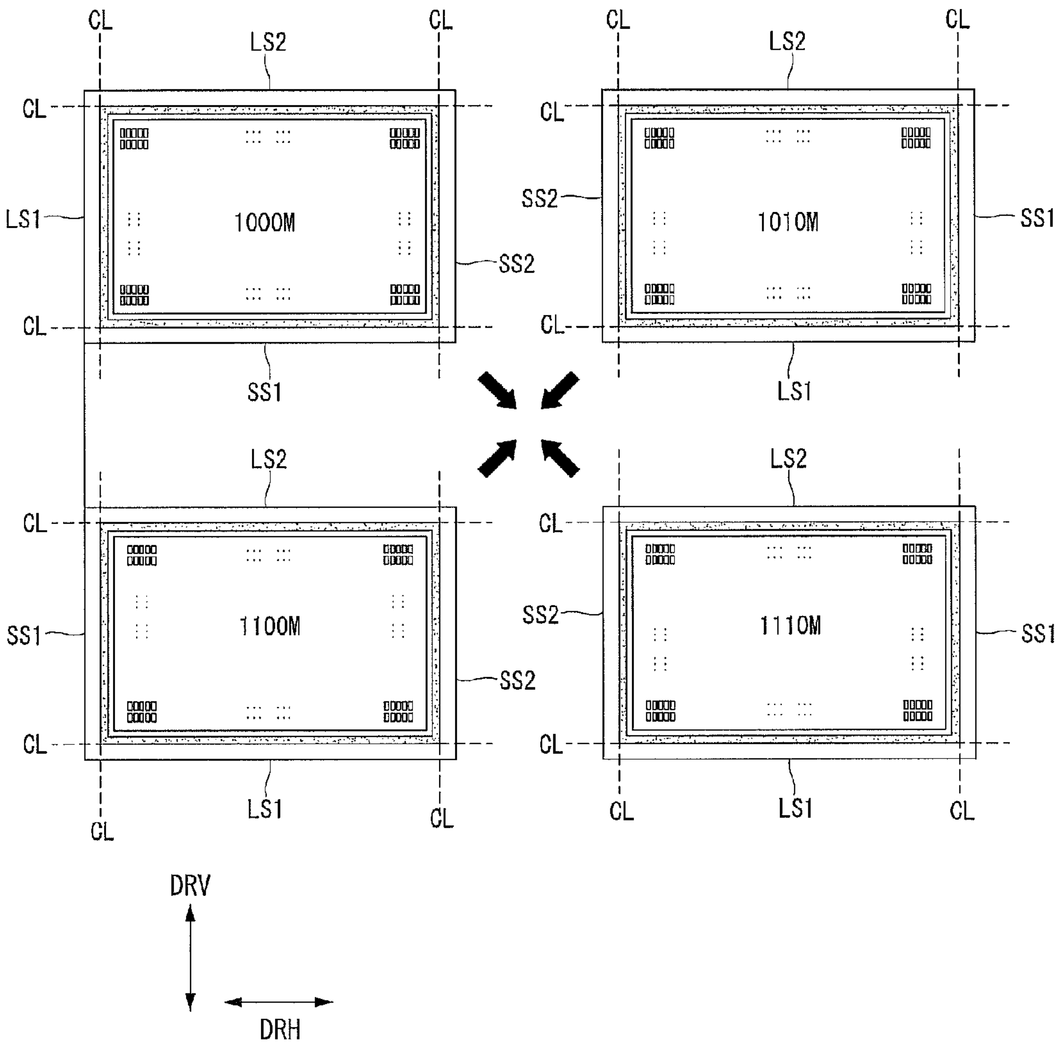

As shown in FIG. 13, the first and second display modules 1000M and 1010M may be positioned adjacent to each other in a first direction (or a horizontal direction) DRH, and the first and fifth display modules 1000M and 1100M may be positioned adjacent to each other in a second direction (or a vertical direction) DRV crossing the first direction DRH. Further, the sixth and second display modules 1110M and 1010M may be positioned adjacent to each other in the second direction. DRV, and the sixth and fifth display modules 1110M and 1100M may be positioned adjacent to each other in the first direction DRH.

The cutting and grinding processes may be performed on first and second short sides SS1 and SS2 and first and second long sides LS1 and LS2 of each of the first, second, fifth, and sixth display modules 1000M, 1010M, 1100M, and 1110M.

The second short side SS2 of the first display module 1000M and the first short side SS1 of the second display module 1010M may be positioned adjacent to each other. The second short side SS2 of the fifth display module 1100M and the first short side SS1 of the sixth display module 1110M may be positioned adjacent to each other.

The first long sides LS1 of the first, second, and fifth display modules 1000M, 1010M, and 1100M may be positioned adjacent to each other, and the second long side LS2 of the second display module 1010M and the first long side LS1 of the sixth display module 1110M may be positioned adjacent to each other.

FIGS. 14 to 30 illustrate a method for disposing a substrate in the front of a display module. In the following description, the descriptions of the configuration and the structure described above are omitted.

Figure 14:
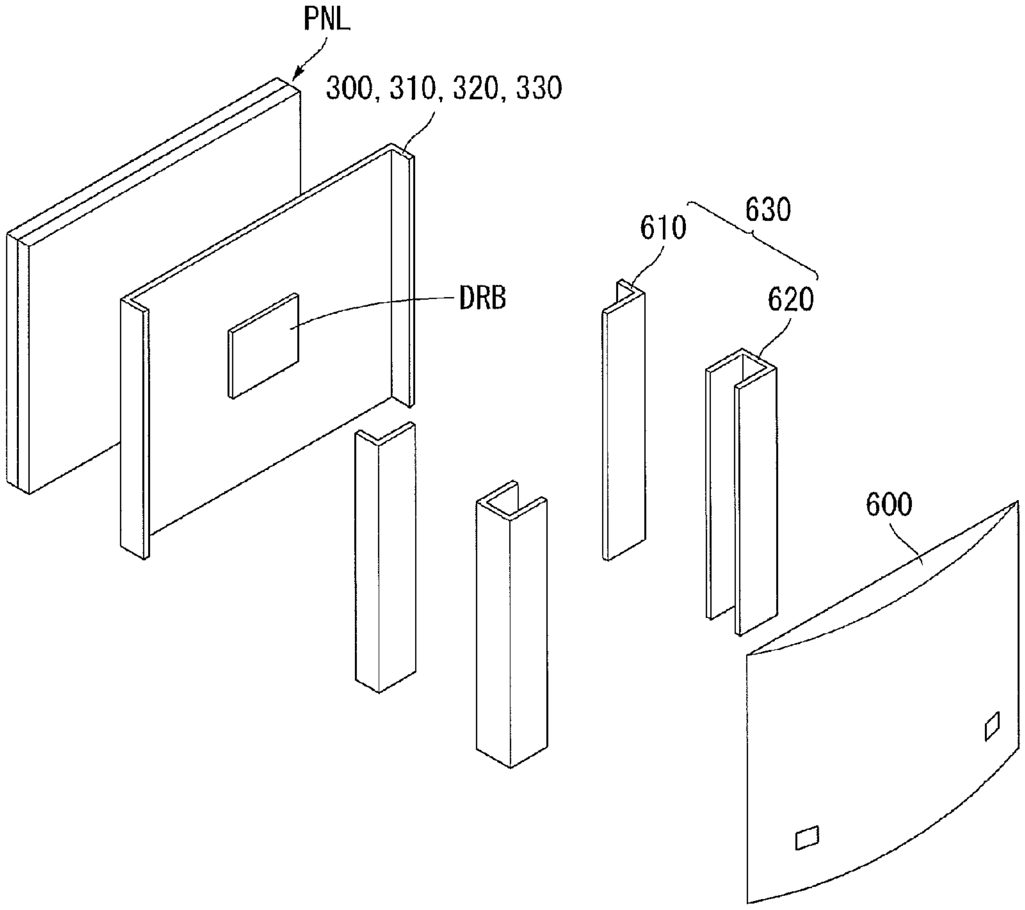
FIGS. 14 to 30 illustrate a method for disposing a substrate in the front of a display module.

As shown in FIG. 14, each of a plurality of display modules MDL included in the multi-plasma display device according to the embodiment of the invention may include a display panel PNL for displaying an image, plates 300, 310, 320, and 330 positioned in the rear of the display panel PNL, and a back cover 600 positioned in the rear of the plates 300 to 330. The display panel PNL may be a plasma display panel.

Hereinafter, each of the plates 300 to 330 is referred to as a frame.

Each display module MDL may include at least one structure 630 between the frames 300 to 330 and the back cover 600. The structure 630 may include a first auxiliary frame 610 and a second auxiliary frame 620.

Figure 15:
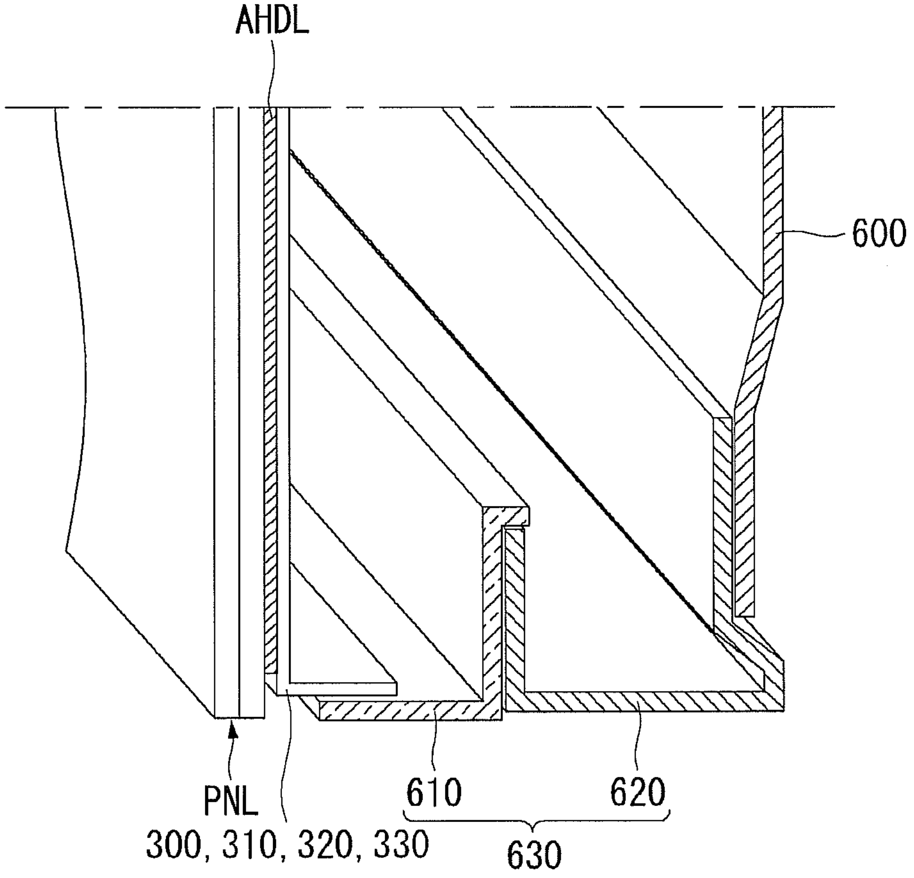
Figure 16:
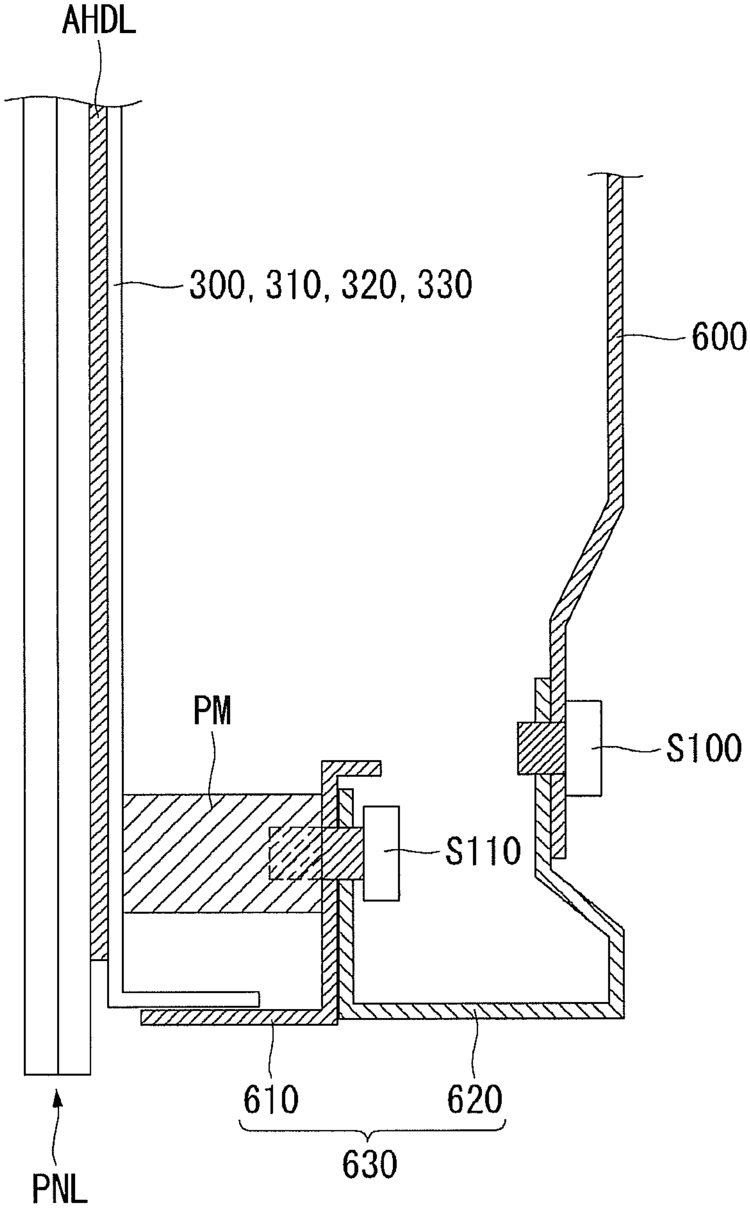

As shown in FIGS. 15 and 16, an adhesive layer AHDL may be positioned between the frames 300 to 330 and the display panel PNL. Namely, the frames 300 to 330 may be attached to a back substrate of the display panel PNL using the adhesive layer AHDL.

The first auxiliary frame 610 may be connected to the frames 300 to 330. For example, as shown in FIG. 16, a supporter PM such as a pem nut may be positioned on the frames 300 to 330, and the first auxiliary frame 610 may be fastened to the supporter PM using a fastener S110 such as a screw. FIG. 16 shows that the screw is used as the fastener. Other fasteners may be used. For example, a pin, a clip, etc. may be used.

The fastener S110 may fasten both the first auxiliary frame 610 and the second auxiliary frame 620 to the frames 300 to 330.

Alternatively, although not shown, the supporter PM may be omitted, and the first auxiliary frame 610 may be fastened to the frames 300 to 330 using a predetermined fastener.

Further, the second auxiliary frame 620 may be connected to the back cover 600. For example, as shown in FIG. 16, the second auxiliary frame 620 may be fastened to the back cover 600 using the fastener S110.

Alternatively, although not shown, the first auxiliary frame 610 and the second auxiliary frame 620 may form an integral body.

Figure 17:
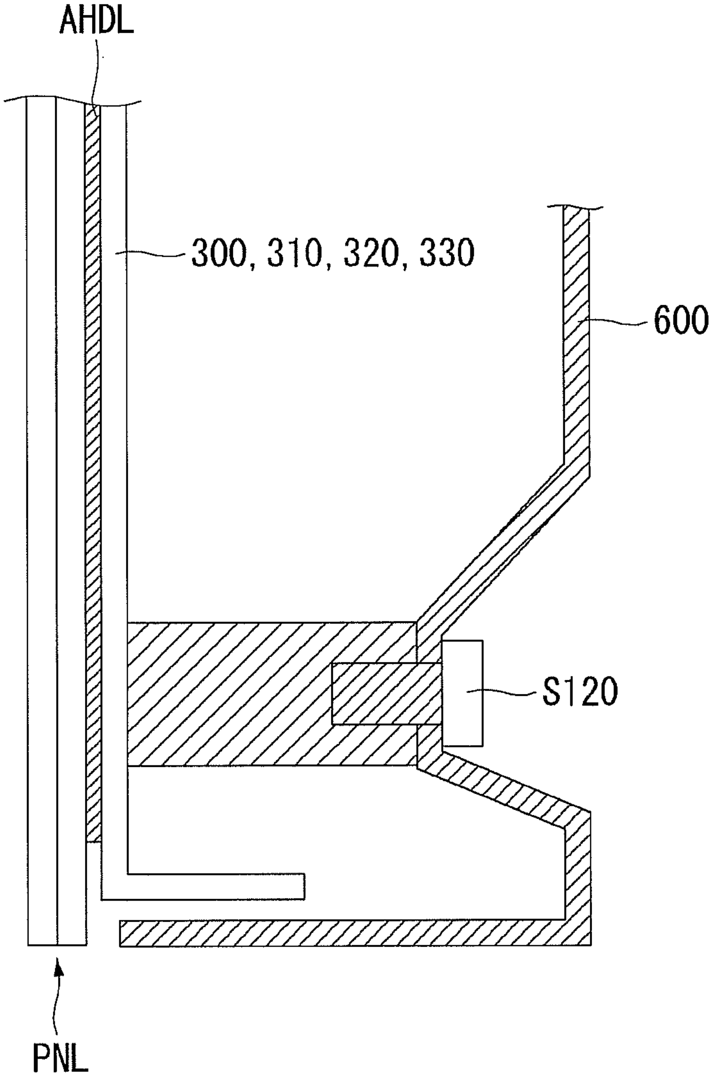

Alternatively, the first auxiliary frame 610 and the second auxiliary frame 620 may be omitted. In this instance, as shown in FIG. 17, the frames 300 to 330 may be connected to the back cover 600. For example, the supporter PM may be positioned on the frames 300 to 330, and the back cover 600 may be fastened to the supporter PM using a fastener S120.

Figure 18:
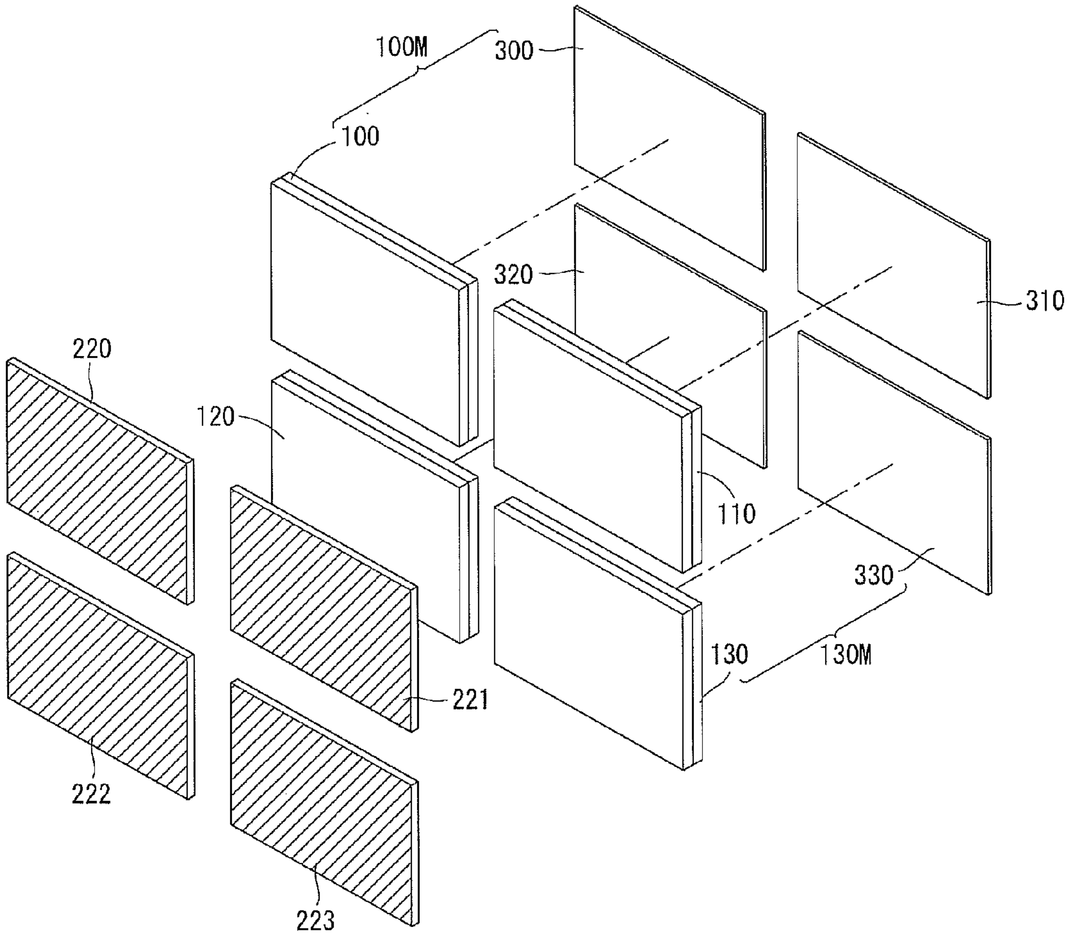

As shown in FIG. 18, substrates 220 to 223 may be respectively positioned in the front of the display modules 100M, 110M, 120M, and 130M. The substrates 220 to 223 may be a glass substrate or a plastic substrate. It may be preferable that the substrates 220 to 223 are the glass substrate so as to prevent the deformation by heat and/or external force.

In other words, the substrates 220 to 223 may be respectively positioned in the front of the front substrates of the display panels 100 to 130.

Figure 19:
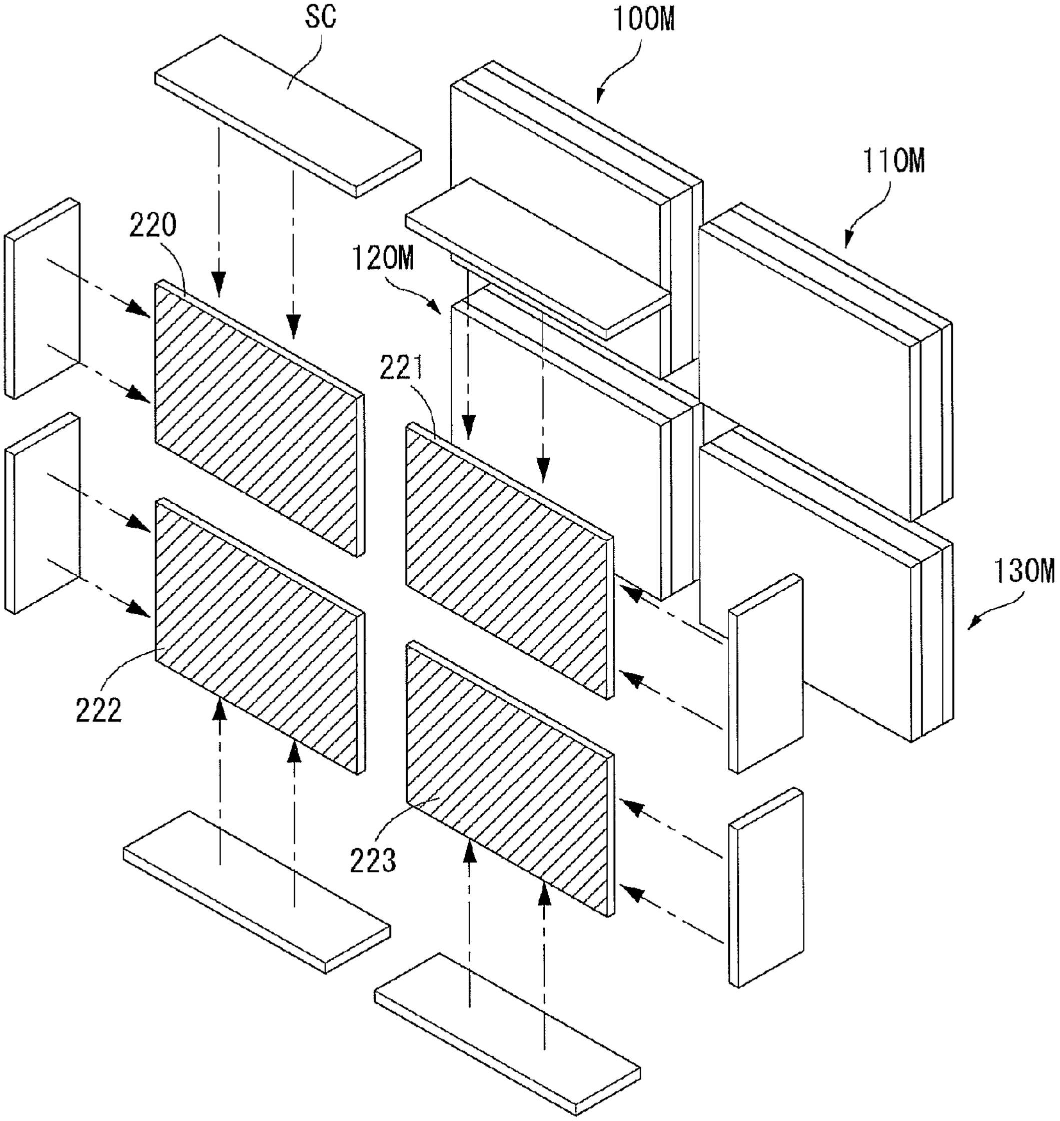

As shown in FIG. 19, a side cover SC may be used to fix the substrates 220 to 223.

As shown in FIG. 19, the side cover SC may be not positioned between the adjacent display modules 100M to 130M and may be positioned at an edge of the multi-plasma display device.

The side cover SC may be positioned on the sides of the display modules 100M to 130M and the sides of the substrates 220 to 223 and may be connected to the display modules 100M to 130M. The side cover SC may include a portion into which the substrates 220 to 223 are inserted.

Figure 20:
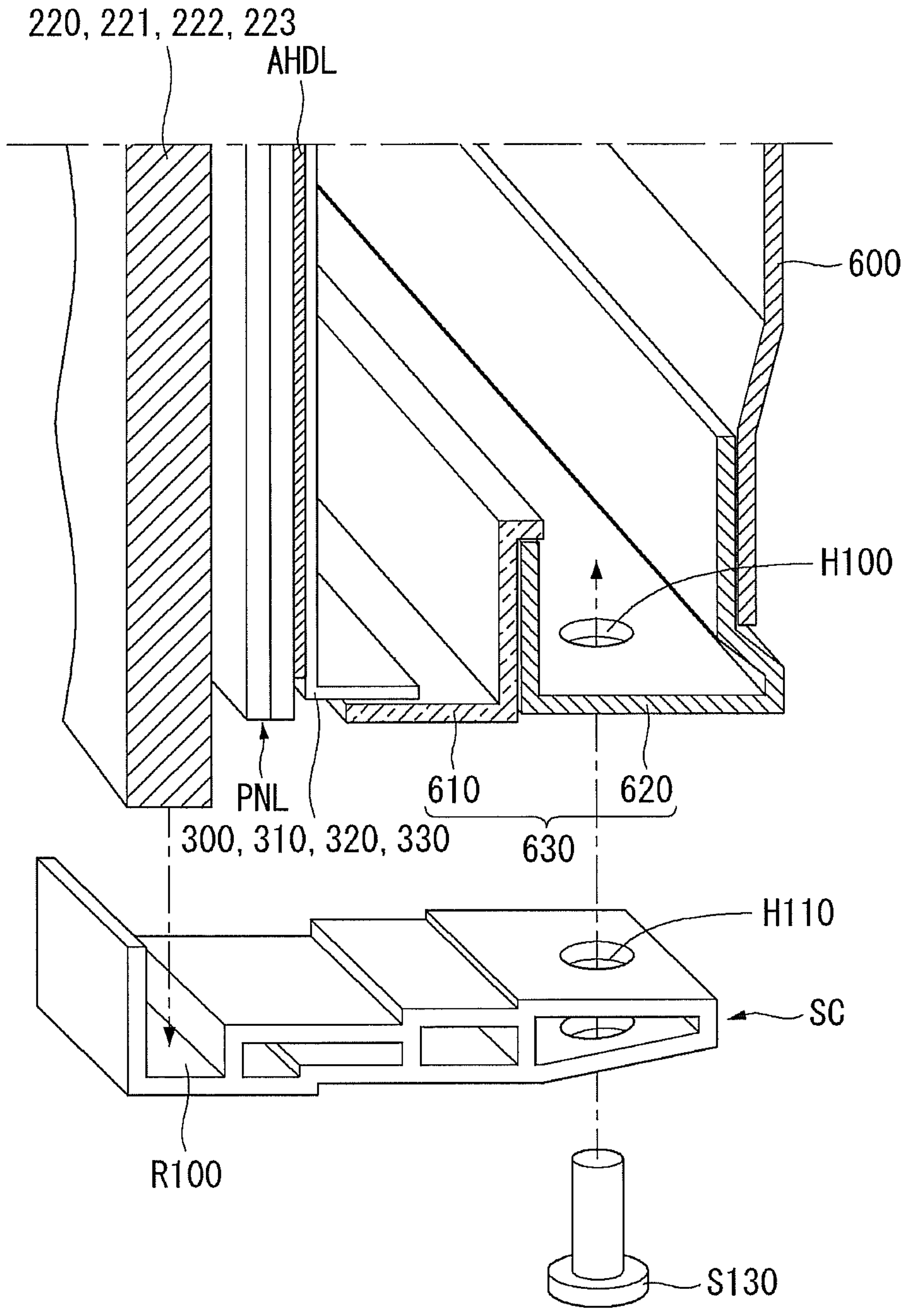

For example, as shown in FIG. 20, the substrates 220 to 223 may be positioned in the front of the display panel PNL, and the side cover SC may include a portion R100 into which ends of the substrates 220 to 223 are inserted. The portion R100 of the side cover SC may be referred to as a rail.

The side cover SC may include a portion positioned on the side of the display panel PNL and a hole H110 used in the connection between the display module MDL and the side cover SC.

The display module MDL may include a hole H100 used in the connection between the display module MDL and the side cover SC. For example, as shown in FIG. 20, the hole H100 of the display module MDL may be formed in the structure 630, which is positioned between the frames 300 to 330 and the back cover 600 and connects the frames 300 to 330 to the back cover 600. FIG. 20 shows that the hole H100 is formed in the second auxiliary frame 620 of the structure 630. However, a position of the hole H100 may be changed. For example, the hole H100 may be formed in the first auxiliary frame 610 of the structure 630.

The hole H110 of the side cover SC may correspond to the hole H100 of the structure 630. Hence, a fastener S130 may pass through the hole H110 of the side cover SC and the hole H100 of the structure 630 and may connect the side cover SC to the display module MDL.

In this instance, an air gap 2000 may be formed between the substrates 220 to 223 and the display panel PNL.

Alternatively, a hole used to fasten the display module MDL to the side cover SC may be formed in the back cover 600 of the display module MDL.

Figure 21:
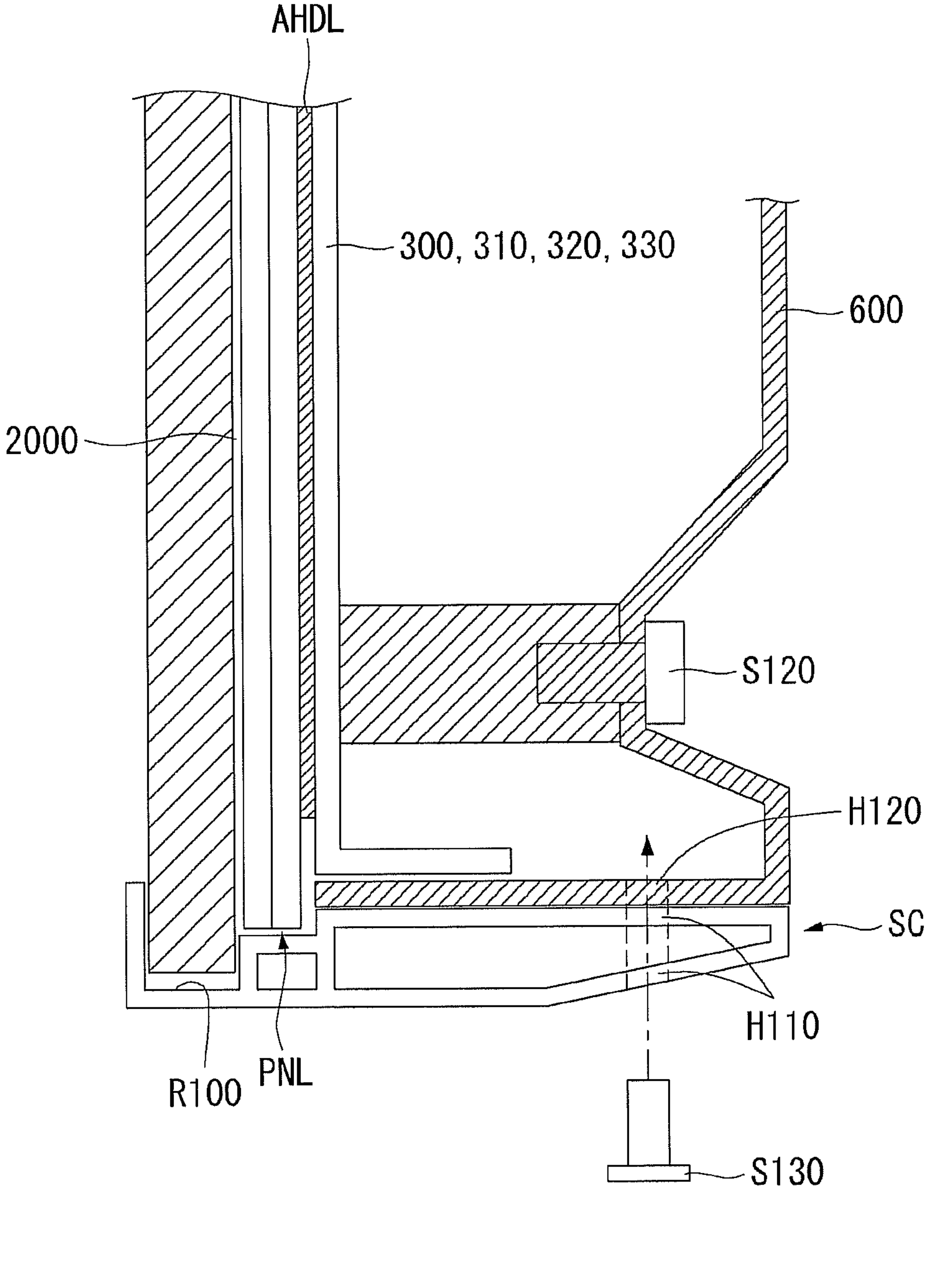

For example, as shown in FIG. 21, a hole H120 used to connect the display module MDL to the side cover SC may be formed in the back cover 600. The fastener S130 pass through the hole H120 of the back cover 600 and the hole H110 of the side cover SC and may fasten the side cover SC to the display module MDL.

In this instance, the back cover 600 may be connected to the frames 300 to 330.

The embodiment of the invention is described below, on the assumption that the structure 630 is positioned between the back cover 600 and the frames 300 to 330 and the structure 630 has the hole H100, for the sake of brevity and ease of reading. However, the embodiment of the invention is not limited thereto.

The side cover SC may include an outer cover and an inner cover.

Figure 22:
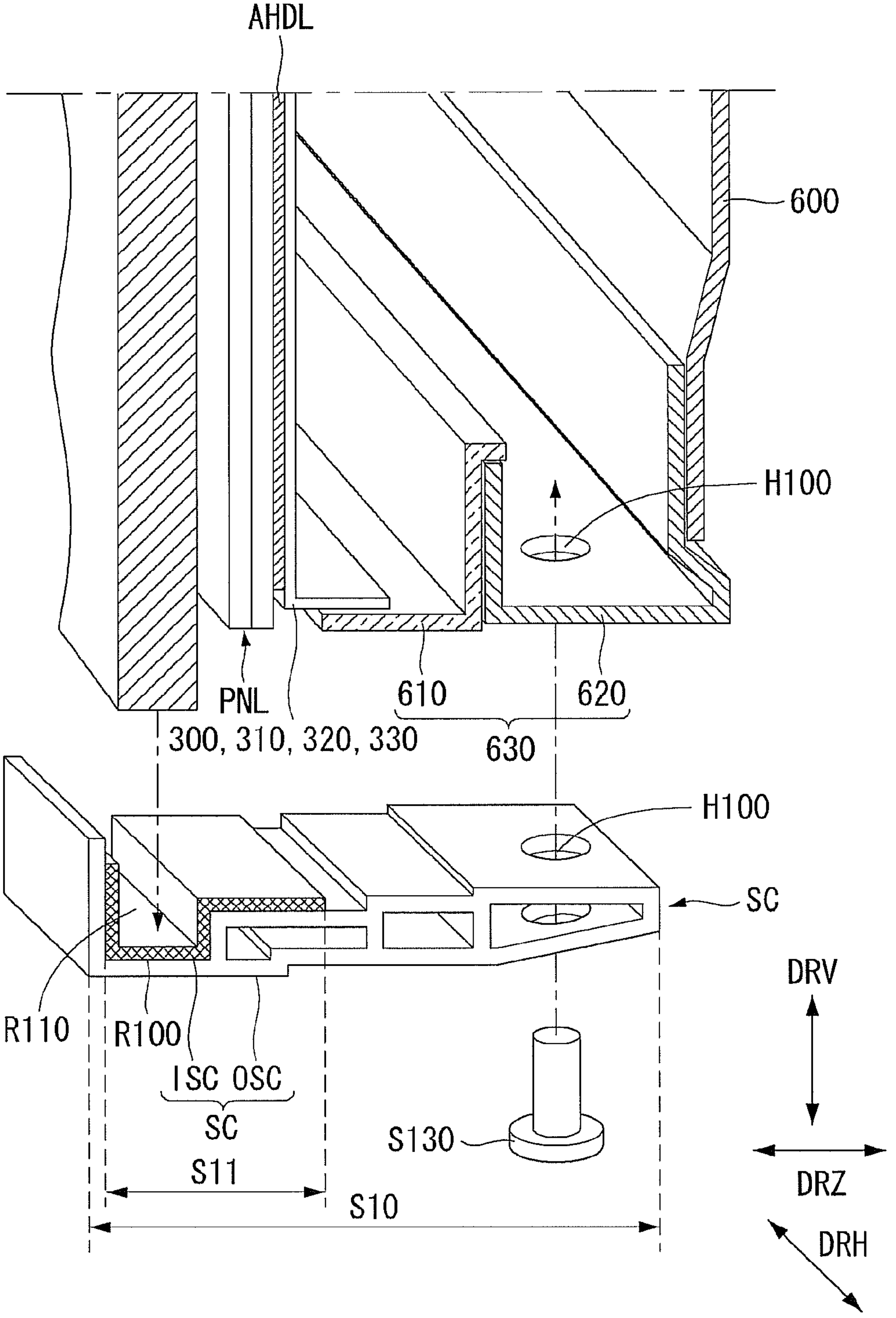

For example, as shown in FIG. 22, the side cover SC may include an outer cover OSC and an inner cover ISC between the outer cover OSC and the substrates 220 to 223. The inner cover ISC is detachable from the outer cover OSC.

Elasticity of the inner cover ISC may be greater than elasticity of the outer cover OSC. For this, the inner cover ISC may contain a flexible material, for example, a silicon material and a resin material. In this instance, the inner cover ISC may effectively protect an end of the display panel PNL for the damage. The outer cover OSC may contain a metal material, for example, aluminum.

A length S10 of the outer cover OSC may be greater than a length S11 of the inner cover ISC. More specifically, the length S10 of the outer cover OSC in a third direction DRZ crossing the first and second directions DRH and DRV may be greater than the length S11 of the inner cover ISC in the third direction DRZ. Further, the outer cover OSC may include a portion positioned on the sides of the substrates 220 to 223 and a portion positioned on the side of the display module MDL.

The outer cover OSC may include a hole H110, which is used to connect the display module MDL to the side cover SC, and a rail R100 corresponding to the substrates 220 to 223. The rail R100 of the outer cover OSC may be referred to as a first rail.

The inner cover ISC may include a second rail R110 positioned on the first rail R100 of the outer cover OSC. The ends of the substrates 220 to 223 may be inserted into the second rail R110 of the inner cover ISC.

Figure 23:
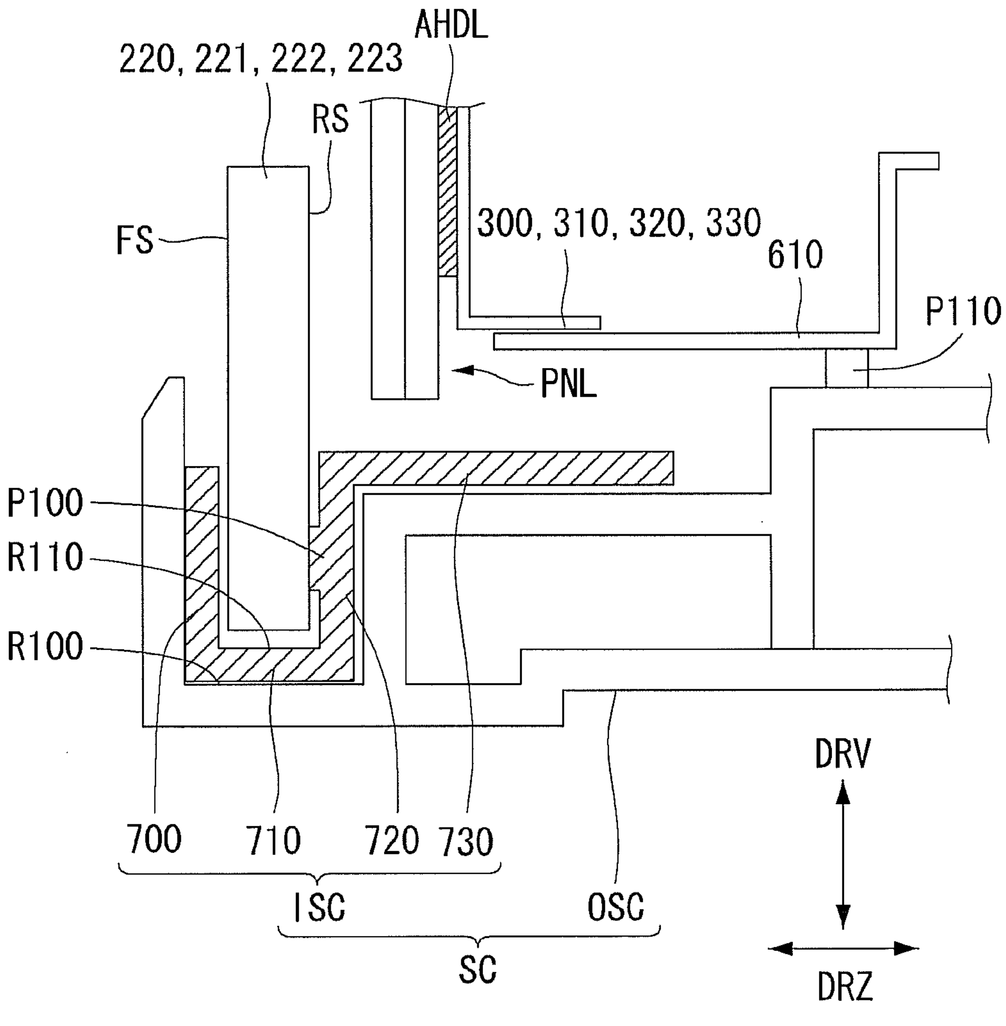

As shown in FIG. 23, a cross section of the inner cover ISC may include a first portion 700 which is positioned on front surfaces FS of the substrates 220 to 223 and extends in the second direction DRV, a second portion 710 which extends from the first portion 700 in the third direction DRZ and is positioned on the sides of the substrates 220 to 223, a third portion 720 which extends from the second portion 710 in the second direction DRV and is positioned on back surfaces RS of the substrates 220 to 223, and a fourth portion 730 extending from the third portion 720 in the third direction DRZ.

The inner cover ISC may include a protrusion P100 so as to reduce a contact area between the substrates 220 to 223 and the inner cover ISC. For example, the protrusion P100 may protrude from the third portion 720 of the inner cover ISC to the substrates 220 to 223. In this instance, the substrates 220 to 223 may easily move in the inner cover ISC, and an impact applied to the substrates 220 to 223 may be reduced.

The inner cover ISC may include a portion positioned on the side of the display panel PNL of the display module MDL. For example, the fourth portion 730 of the inner cover ISC may include a portion positioned on the side of the display panel PNL.

FIG. 23 shows that the protrusion P100 is formed in the third portion 720 of the inner cover ISC. However, the protrusion P100 may be formed in at least one of the first and second portions 700 and 710 of the inner cover ISC and may protrude to the substrates 220 to 223.

The outer cover OSC may include at least one protrusion P110 which extends to the display module MDL and is formed in an area not overlapping the inner cover ISC. The protrusion P110 of the outer cover OSC may prevent a damage resulting from a collision between the side cover SC and the display module MDL.

So far, the embodiment of the invention described that the plurality of display modules respectively correspond to the substrates 220 to 223. However, the plurality of display modules may correspond to one substrate. For example, as shown in FIG. 24, the multi-display device according to the embodiment of the invention may include a first common substrate CG1 corresponding to the first and third display modules 100M and 120M and a second common substrate CG2 corresponding to the second and fourth display modules 110M and 130M.

Figure 24:
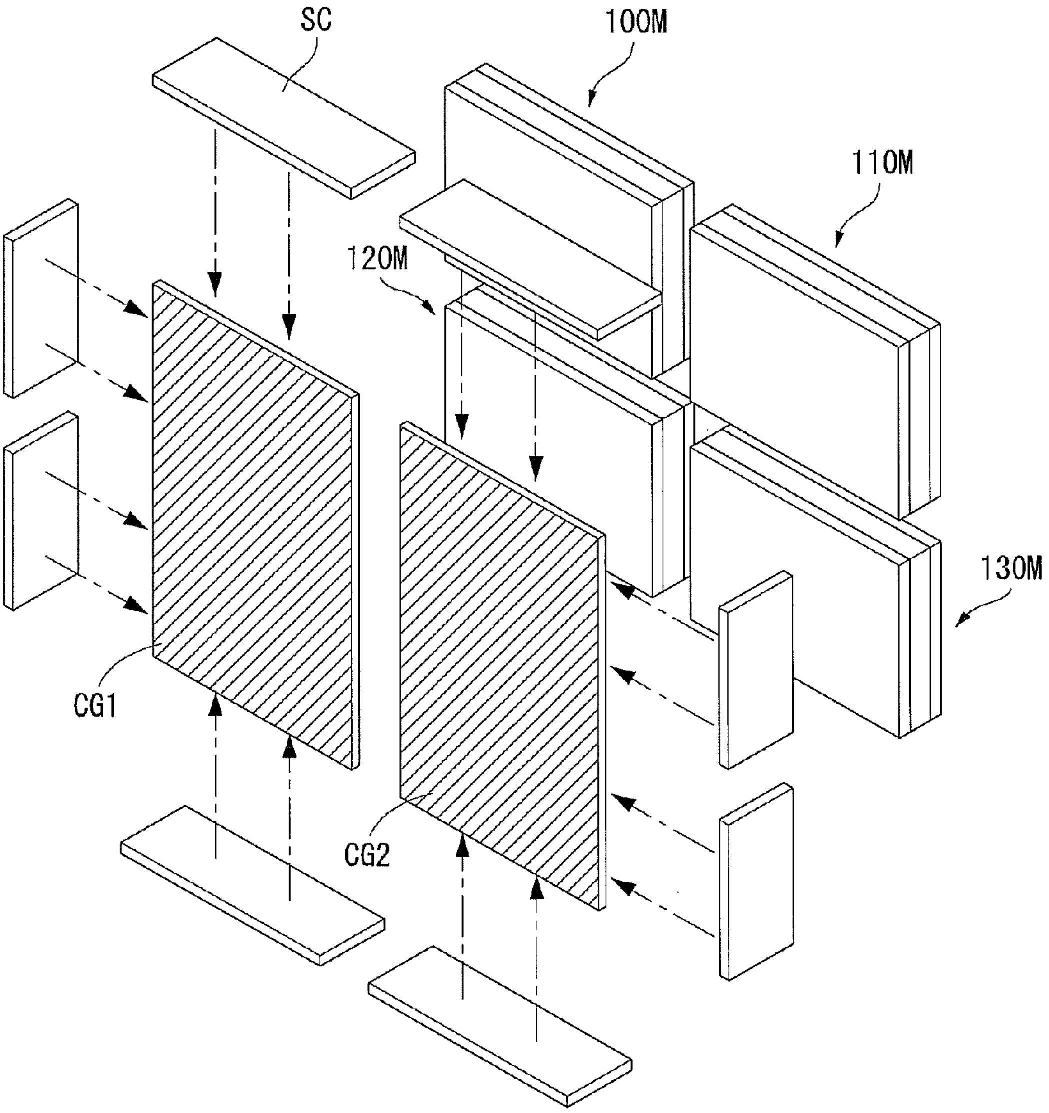

Comparing the structure of FIG. 24 with the structure of FIG. 19, the first common substrate CG1 may replace the first and third substrates 220 and 222 of FIG. 19, and the second common substrate CG2 may replace the second and fourth substrates 221 and 223 of FIG. 19.

In the above structure, the number of substrates CG1 and CG2 may be less than the number of display modules 100M to 130M.

Even in this instance, the side cover SC may be positioned so as to dispose the first common substrate CG1 in the front of the first and third display modules 100M and 120M. Further, the side cover SC may be positioned so as to dispose the second common substrate CG2 in the front of the second and fourth display modules 110M and 130M.

Figure 25:
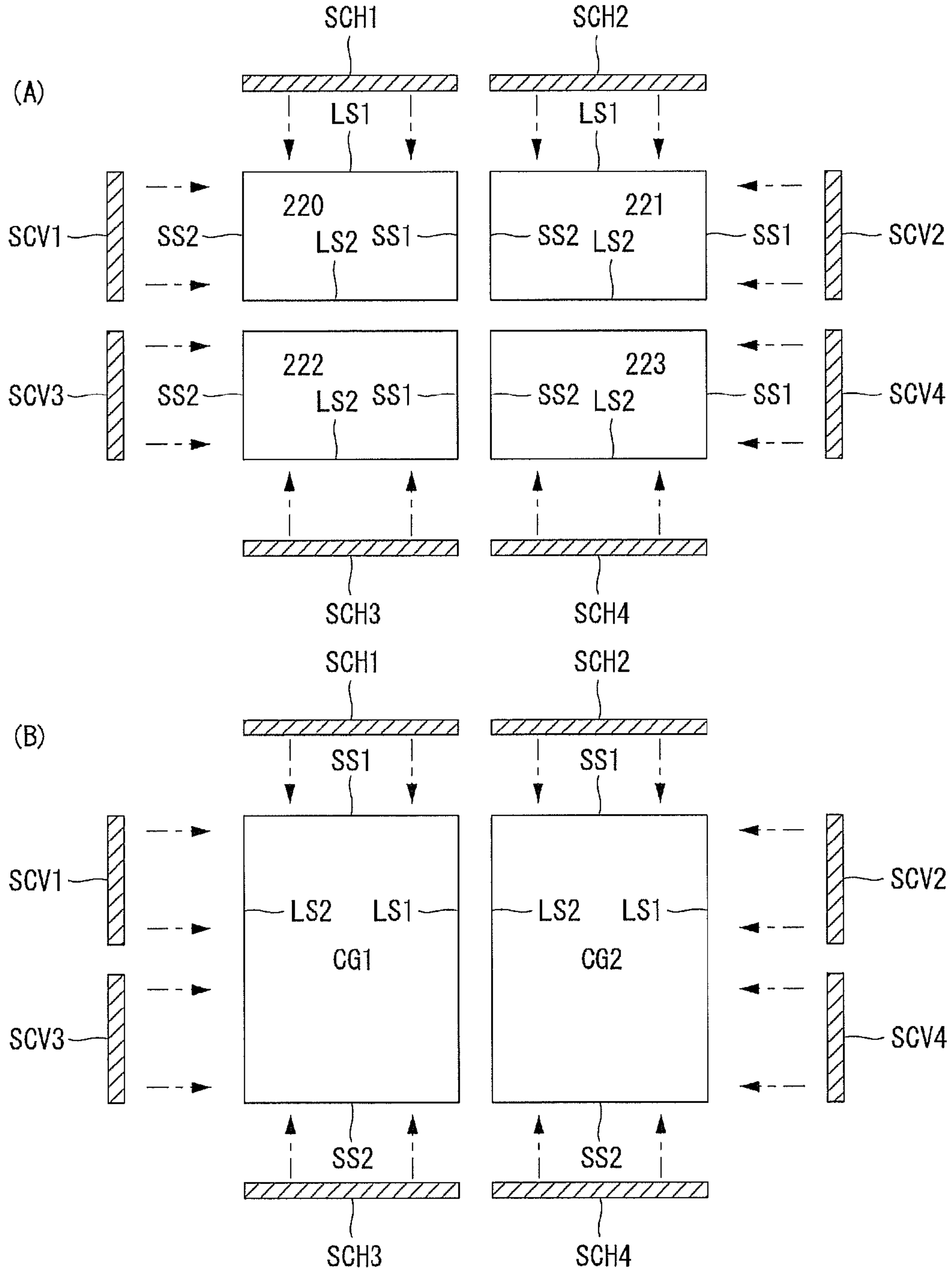

In the structure illustrated in FIG. 19, as shown in (A) of FIG. 25, a first horizontal side cover SCH1 of the side cover SC may be positioned on the first long side LS1 of the first substrate 220, and a first vertical side cover SCV1 of the side cover SC may be positioned on the second short side SS2 of the first substrate 220. Further, a third vertical side cover SCV3 of the side cover SC may be positioned on the second short side SS2 of the third substrate 222, and a third horizontal side cover SCH3 of the side cover SC may be positioned on the second long side LS2 of the third substrate 222. In (A) of FIG. 25, 'SCH2' denotes a second horizontal side cover, 'SCH4' a fourth horizontal side cover, 'SCV2' a second vertical side cover, and 'SCV4' a fourth vertical side cover.

On the other hand, in the structure illustrated in FIG. 24, as shown in (B) of FIG. 25, a first horizontal side cover SCH1 may be positioned on a first short side SS1 of the first common substrate CG1, and a third horizontal side cover SCH3l may be positioned on a second short side SS2 of the first common substrate CG1. A first vertical side cover SCV1 and a third vertical side cover SCV3 may be positioned on a second long side LS2 of the first common substrate CG1. Further, a second horizontal side cover SCH2 may be positioned on a first short side SS1 of the second common substrate CG2, and a fourth horizontal side cover SCH4 may be positioned on a second short side SS2 of the second common substrate CG2. A second vertical side cover SCV2 and a third vertical side cover SCV3 may be positioned on a first long side LS1 of the second common substrate CG2.

A first long side LS1 of the first common substrate CG1 and a second long side LS2 of the second common substrate CG2 may be positioned adjacent to each other.

Figure 26:
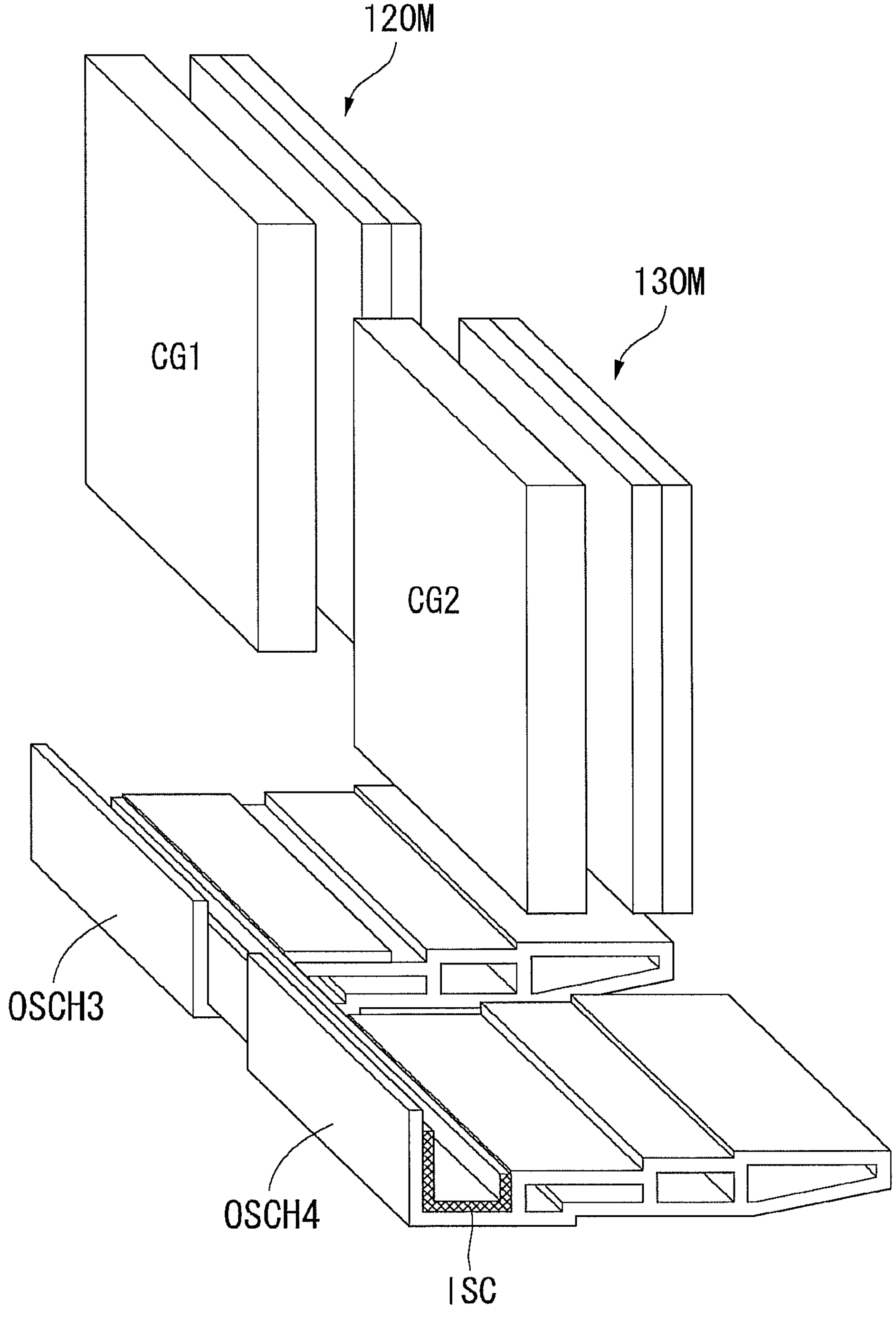

At least one of a plurality of inner covers ISC may correspond to the plurality of substrates. In other words, as shown in FIG. 26, the plurality of substrates may be inserted into a second rail R110 of at least one inner cover ISC. Namely, at least one inner cover ISC may commonly overlap the two adjacent display modules MDL.

Figure 27:
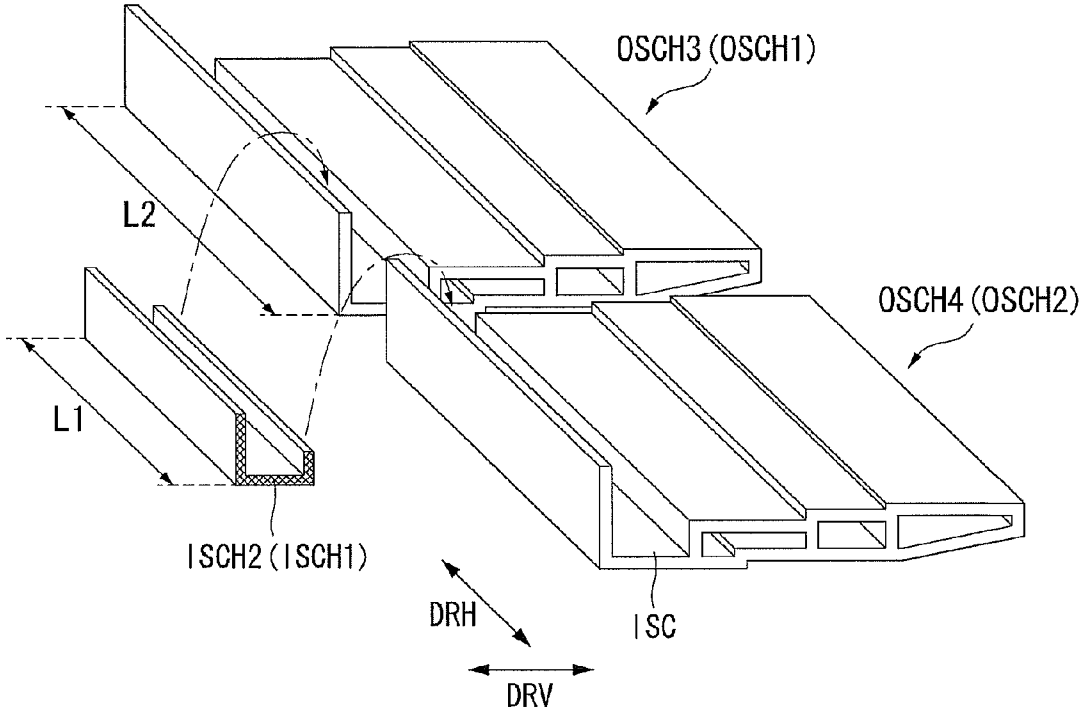

For example, as shown in FIGS. 26 and 27, a third horizontal outer cover OSCH3 and a fourth horizontal outer cover OSCH4 may be positioned adjacent to each other. A second horizontal inner cover ISCH2 may be positioned in first rails of the third and fourth horizontal outer covers OSCH3 and OSCH4.

Ends of the first and second common substrates CG1 and CG2 may be inserted into a second rail of the second horizontal inner cover ISCH2.

In this instance, it is easy to align the first and second common substrates CG1 and CG2 in the multi-display device.

Considering that the inner cover ISC is formed so as to easily move the first and second common substrates CG1 and CG2 while preventing a damage of ends of the first and second common substrates CG1 and CG2, a length L1 of the inner cover ISC in the first direction DRH may be less than a length L2 of the outer cover OSC in the first direction DRH as shown in FIG. 27. Alternatively, a length of the inner cover ISC in the second direction DRV may be less than a length of the outer cover OSC in the second direction DRV.

Figure 28:
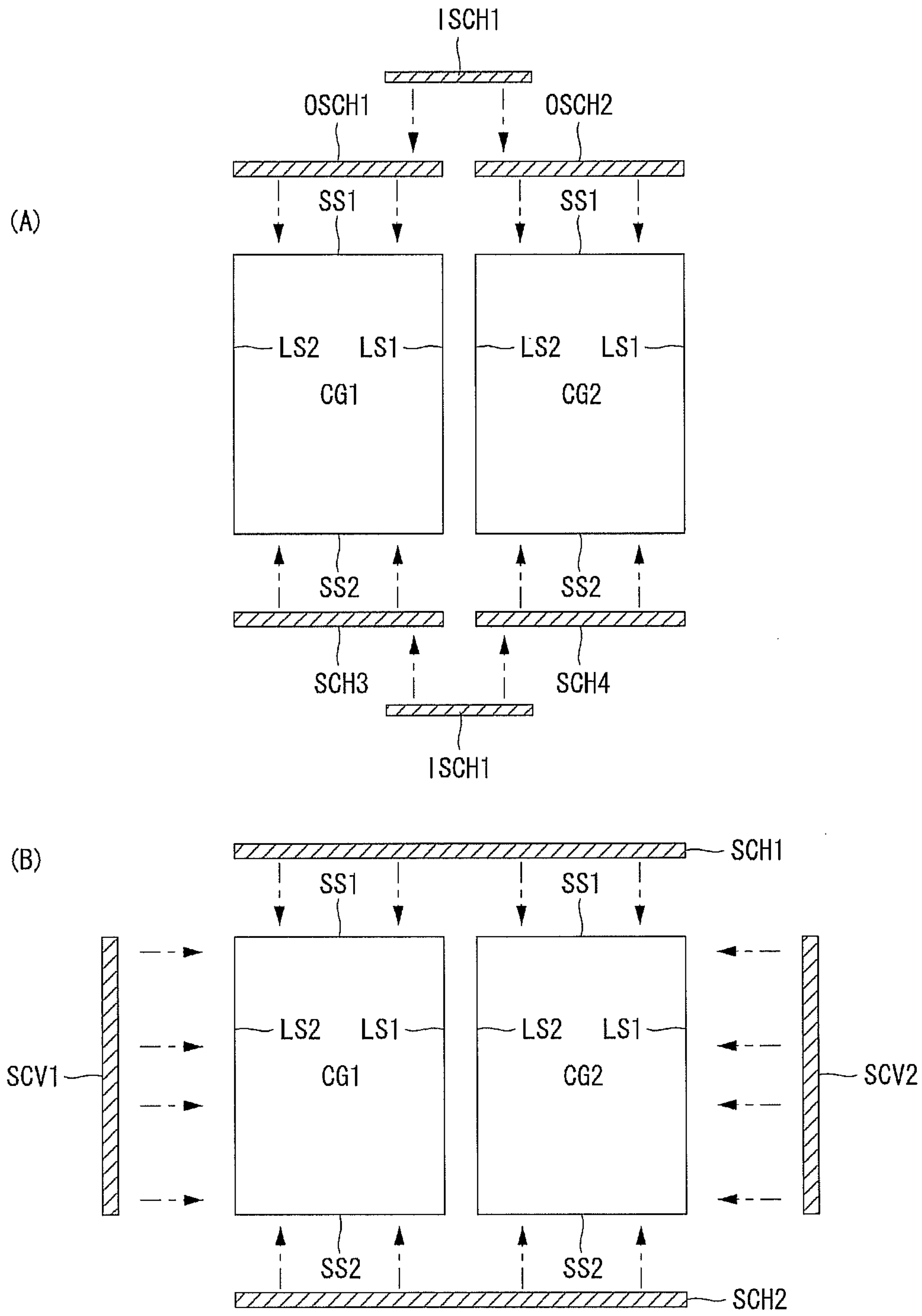

In this instance, as shown in (A) of FIG. 28, a first horizontal outer cover OSCH1 may be positioned on the first short side SS1 of the first common substrate CG1, and a third horizontal outer cover OSCH3 may be positioned on the second short side SS2 of the first common substrate CG1. Further, a second horizontal outer cover OSCH2 may be positioned on the first short side SS1 of the second common substrate CG2, and a fourth horizontal outer cover OSCH4 may be positioned on the second short side SS2 of the second common substrate CG2.

A first horizontal inner cover ISCH1 may be positioned in rails of the first and second horizontal outer covers OSCH1 and OSCH2. A second horizontal inner cover ISCH2 may be positioned in rails of the third and fourth horizontal outer covers OSCH3 and OSCH4.

The first long side LS1 of the first common substrate CG1 and the second long side LS2 of the second common substrate CG2 may be positioned adjacent to each other.

Alternatively, as shown in (B) of FIG. 28, a first horizontal side cover SCH1 may be positioned on the first short side SS1 of the first common substrate CG1 and the first short side SS1 of the second common substrate CG2. Further, a second horizontal side cover SCH2 may be positioned on the second short side SS2 of the first common substrate CG1 and the second short side SS2 of the second common substrate CG2.

The first horizontal side cover SCH1 shown in (B) of FIG. 28 may be obtained by integrating the first and second horizontal outer covers OSCH1 and OSCH2 shown in (A) of FIG. 28 into one part and then disposing the first horizontal inner cover ISCH1 in a rail of the integrated first and second horizontal outer covers OSCH1 and OSCH2.

As shown in (B) of FIG. 28, the first vertical side cover SCV1 may be positioned on the second long side LS2 of the first common substrate CG1, and the second vertical side cover SCV2 may be positioned on the first long side LS1 of the second common substrate CG2.

Figure 29:
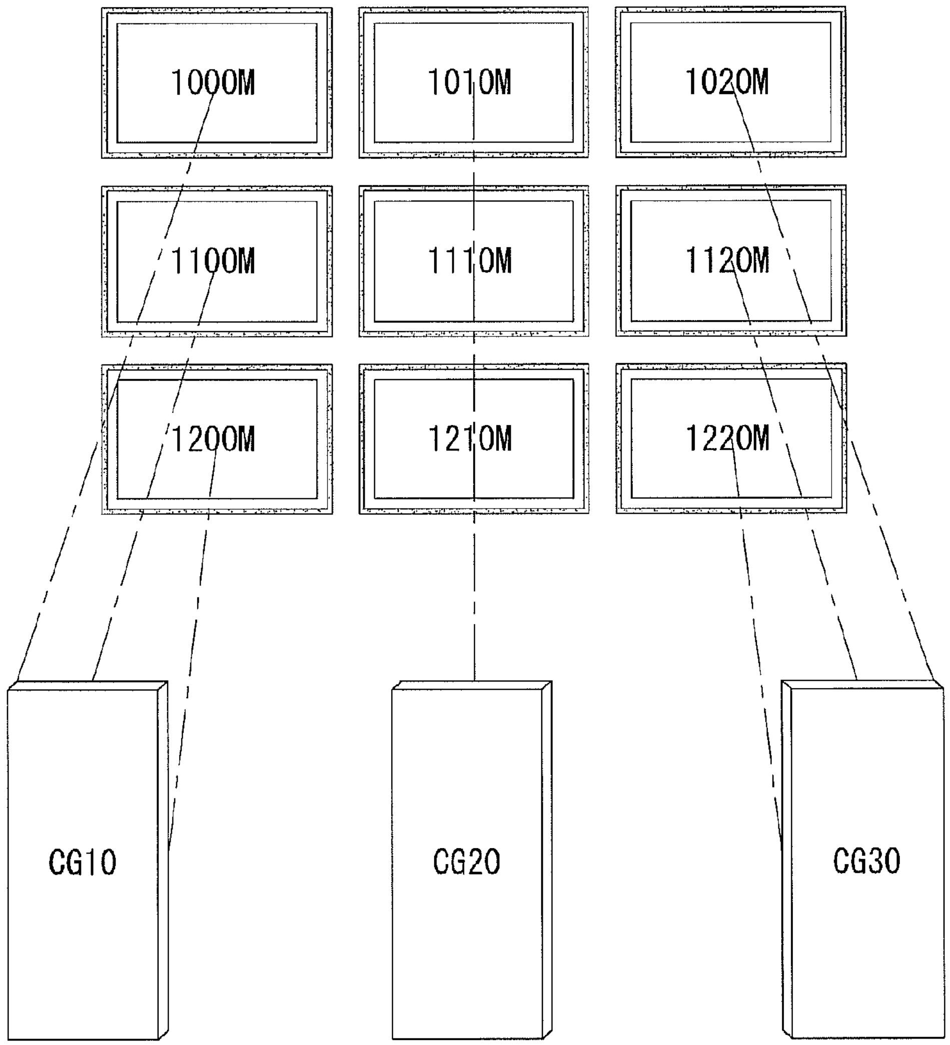

As shown in FIG. 29, it is assumed that first to ninth display modules 1000M to 1220M are arranged in a 3×3 matrix.

In this instance, a first common substrate CG10 may be disposed in the front of the first, fourth, and seventh display modules 1000M, 1100M, and 1200M, and a second common substrate CG20 may be disposed in the front of the second, fifth, and eighth display modules 1010M, 1110M, and 1210M. A third common substrate CG30 may be disposed in the front of the third, sixth, and ninth display modules 1020M, 1120M, and 1220M.

Figure 30:
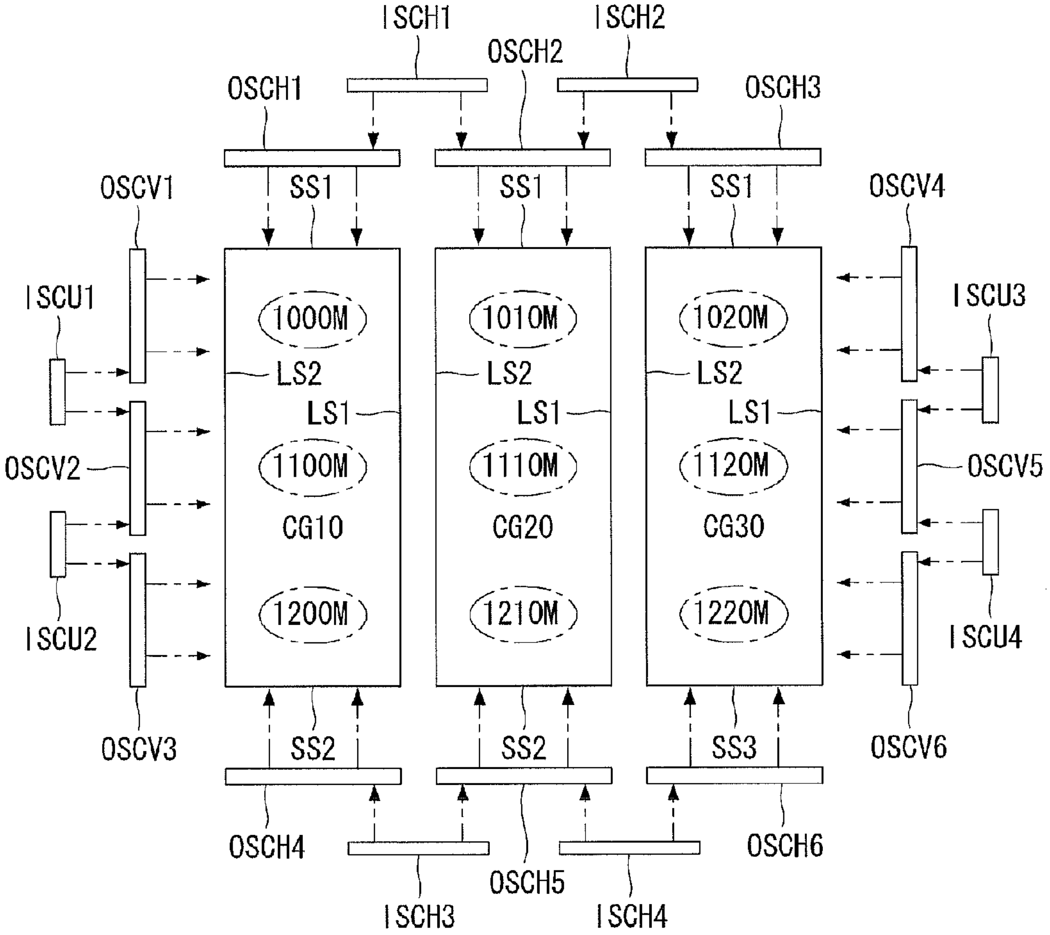

In this instance, as shown in FIG. 30, a first horizontal outer cover OSCH1 may be positioned on a first short side SS1 of the first common substrate CG10, and a fourth horizontal outer cover OSCH4 may be positioned on a second short side SS2 of the first common substrate CG10. A second horizontal outer cover OSCH2 may be positioned on a first short side SS1 of the second common substrate CG20, and a fifth horizontal outer cover OSCH5 may be positioned on a second short side SS2 of the second common substrate CG20. A third horizontal outer cover OSCH3 may be positioned on a first short side SS1 of the third common substrate CG30, and a sixth horizontal outer cover OSCH6 may be positioned on a second short side SS2 of the third common substrate CG30.

A first horizontal inner cover ISCH1 may be positioned in rails of the first and second horizontal outer covers OSCH1 and OSCH2, and a second horizontal inner cover ISCH2 may be positioned in rails of the second and third horizontal outer covers OSCH2 and OSCH3. A third horizontal inner cover ISCH3 may be positioned in rails of the fourth and fifth horizontal outer covers OSCH4 and OSCH5, and a fourth horizontal inner cover ISCH4 may be positioned in rails of the fifth and sixth horizontal outer covers OSCH5 and OSCH6.

A first long side LS1 of the first common substrate CG10 and a second long side LS2 of the second common substrate CG20 may be adjacent to each other. A first long side LS1 of the second common substrate CG20 and a second long side LS2 of the third common substrate CG30 may be adjacent to each other.

First, second, and third vertical outer covers OSCV1, OSCV2, and OSCV3 may be positioned on a second long side LS2 of the first common substrate CG10. Further, fourth, fifth, and sixth vertical outer covers OSCV4, OSCV5, and OSCV6 may be positioned on a first long side LS1 of the third common substrate CG30.

A first vertical inner cover ISCV1 may be positioned in rails of the first and second vertical outer covers OSCV1 and OSCV2, and a second vertical inner cover ISCV2 may be positioned in rails of the second and third vertical outer covers OSCV2 and OSCV3. A third vertical inner cover ISCV3 may be positioned in rails of the fourth and fifth vertical outer covers OSCV4 and OSCV5, and a fourth vertical inner cover ISCV4 may be positioned in rails of the fifth and sixth vertical outer covers OSCV5 and OSCV6.

The first to sixth vertical outer covers OSCV1 to OSCV6 and the first to fourth vertical inner covers ISCV1 to ISCV4 may be omitted in the embodiment of the invention.

FIGS. 31 to 42 illustrate in detail a spacer. In the following description, the descriptions of the configuration and the structure described above are omitted. For example, the structure described below may be applied to the descriptions of FIGS. 1 to 30.

Figure 31:
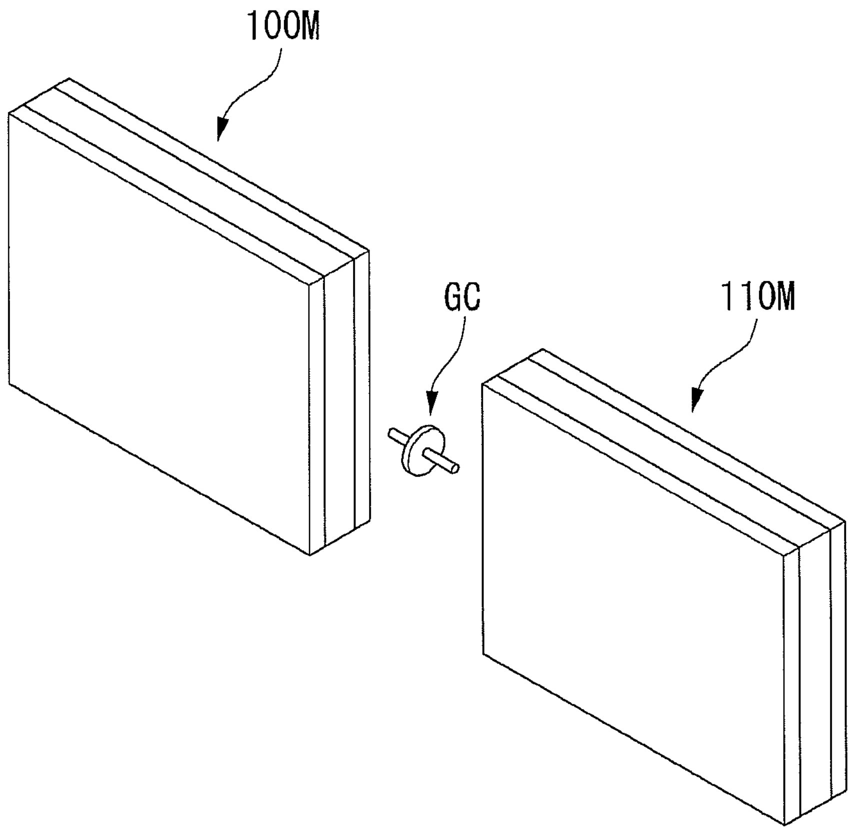
FIGS. 31 to 42 illustrate in detail a spacer.

As shown in FIG. 31, a spacer GC may be positioned between the two adjacent display modules MDL to adjust a distance between the two adjacent display modules MDL.

Figure 32:
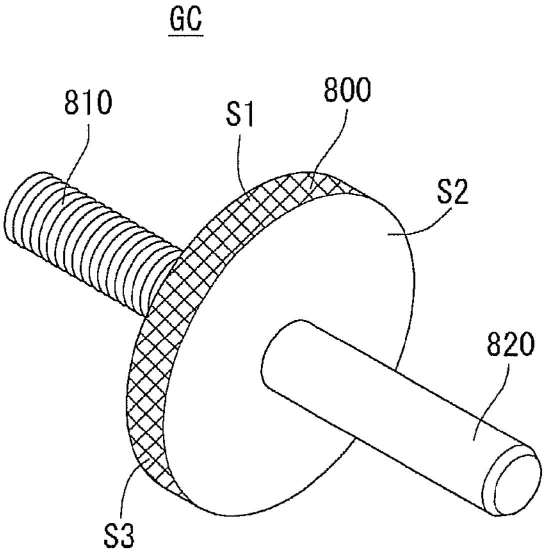

As shown in FIG. 32, the spacer GC may include a base plate 800, a first protrusion 810 positioned on a first surface S1 of the base plate 800, and a second protrusion 820 positioned on a second surface S2 opposite the first surface S1 of the base plate 800.

In other words, the first protrusion 810 may protrude from the first surface S1 of the base plate 800, and the second protrusion 820 may protrude from the second surface S2 of the base plate 800.

An axis of the first protrusion 810 may be substantially the same as an axis of the second protrusion 820.

One of the first protrusion 810 and the second protrusion 820 may have spirals. In the following description, the first protrusion 810 has the spirals as an example.

Figure 33:
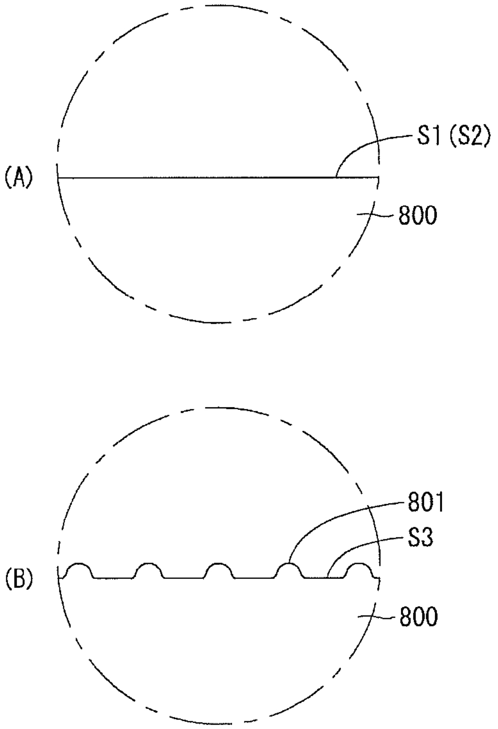

A surface roughness of a third surface S3 adjacent to the first and second surfaces S1 and S2 of the base plate 800 as shown in (B) of FIG. 33 may be greater than a surface roughness of the first and second surfaces S1 and S2 of the base plate 800 as shown in (A) of FIG. 33, so as to easily rotate the spacer GC.

In other words, the third surface S3 of the base plate 800 of the spacer GC may have protuberances 801.

The first and second protrusions 810 and 820 of the spacer GC may be inserted into holes of the display module MDL.

Figure 34:
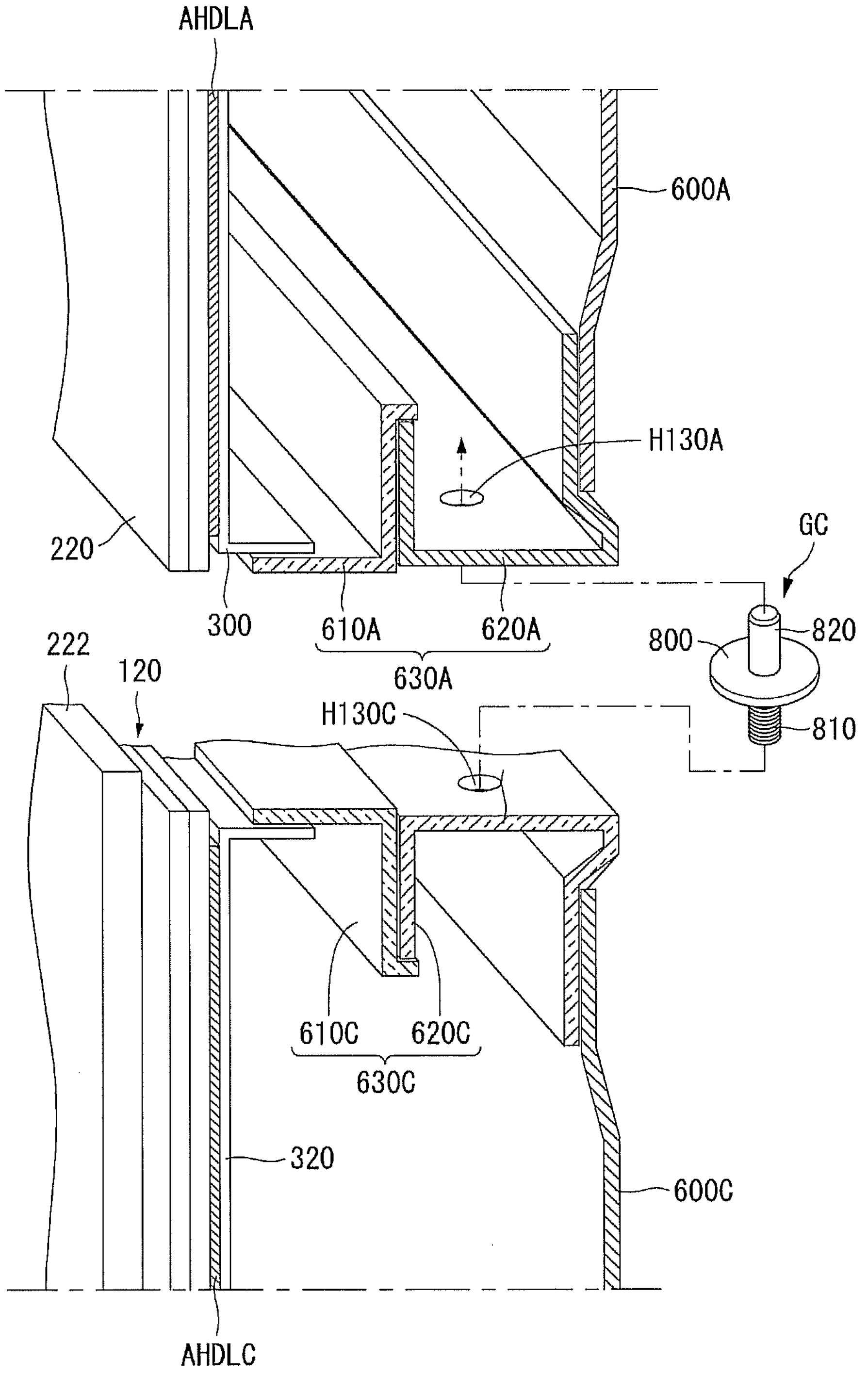

For example, as shown in FIG. 34, a structure 630A of a first display module including a first display panel 100 may have a hole H130A corresponding to the spacer GC, and a structure 630C of a third display module, which includes a third display panel 120 and is adjacent to the first display module, may have a hole H130C corresponding to the spacer GC. The hole H130A and H130C, which are formed in the structures 630A and 630C and correspond to the first and second protrusions 810 and 820 of the spacer GC, may be different from the hole H100 shown in FIG. 20.

The disposition structure of the first and third display modules of FIG. 34 may correspond to at least one of FIGS. 11, 13, 18, 19, 24, 25, 28, 29, and 30.

FIG. 34 shows that the holes H130A and H130C are formed in second auxiliary frames 620A and 620C of the structures 630A and 630C. However, a position of the holes H130A and H130C may be changed. For example, the holes H130A and H130C may be formed in first auxiliary frames 610A and 610C or back covers 600A and 600C.

The first protrusion 810 of the spacer GC may be inserted into the hole H130C of the third display module, and the second protrusion 820 of the spacer GC may be inserted into the hole H130A of the first display module. In this instance, the spacer GC may prevent the misalignment of the first and third display modules.

The hole H130C of the third display module, into which the first protrusion 810 having the spirals is inserted, may have spirals.

A user may adjust a distance between the first and third display modules as a method for rotating the base plate 800 of the spacer GC.

Figure 35:
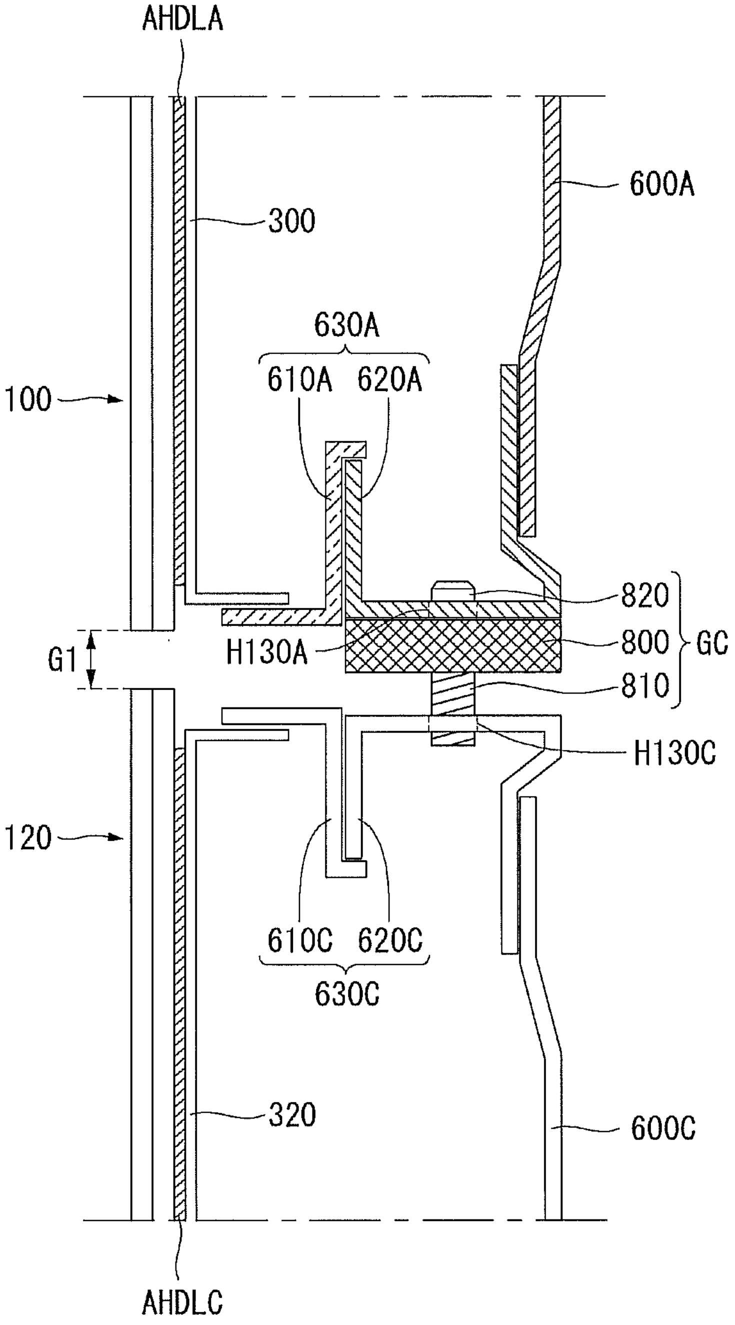
Figure 36:
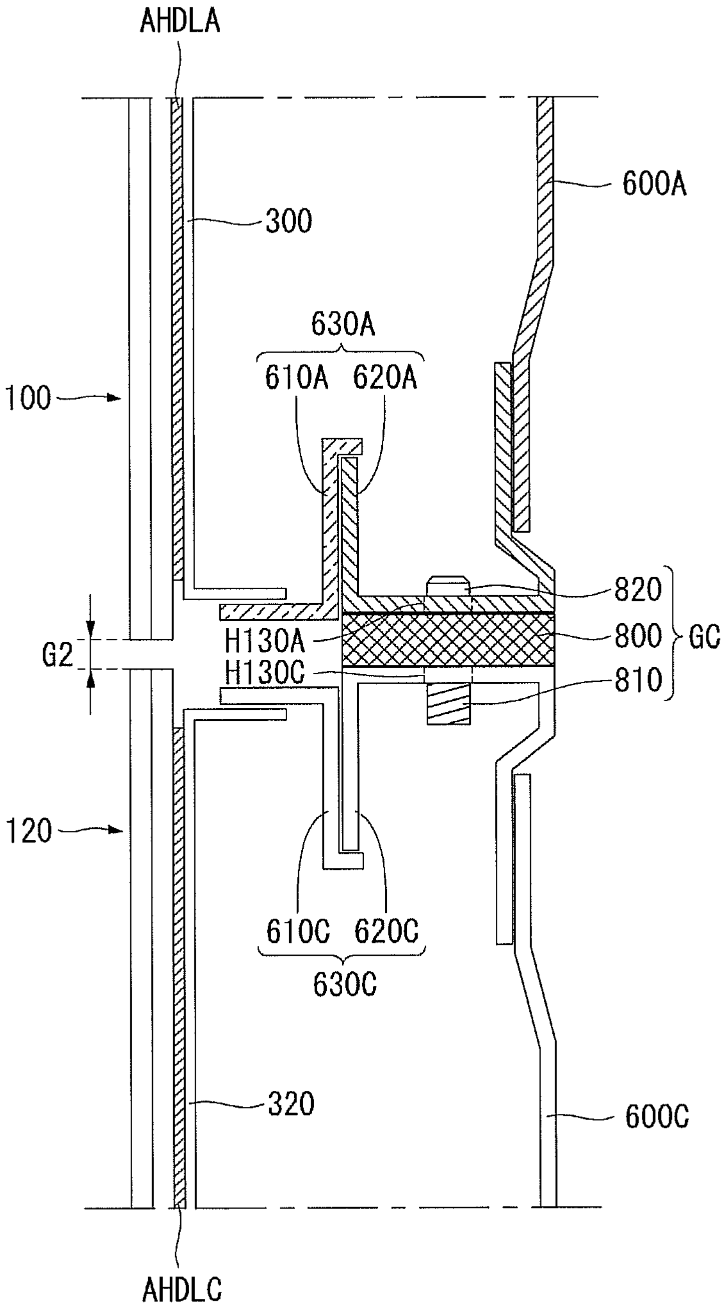

For example, as shown in FIG. 35, it is assumed that a distance between the first and third display panels 100 and 120 of the first and third display modules is set to 'G1' in a state where the spacer GC is positioned between the first and third display modules.

In this instance, the user may rotate the base plate 800 of the spacer GC. Because the first protrusion 810 having the spirals is more deeply inserted into the hole H130C of the structure 630C of the third display module, the distance between the first and third display panels 100 and 120 of the first and third display modules may be set to 'G2' less than 'G1'.

The base plate 800 of the spacer GC may contact the first display module. When the first protrusion 810 of the spacer GC is most deeply inserted into the hole H130C of the structure 630C of the third display module, the base plate 800 of the spacer GC may contact the first display module.

Figure 37:
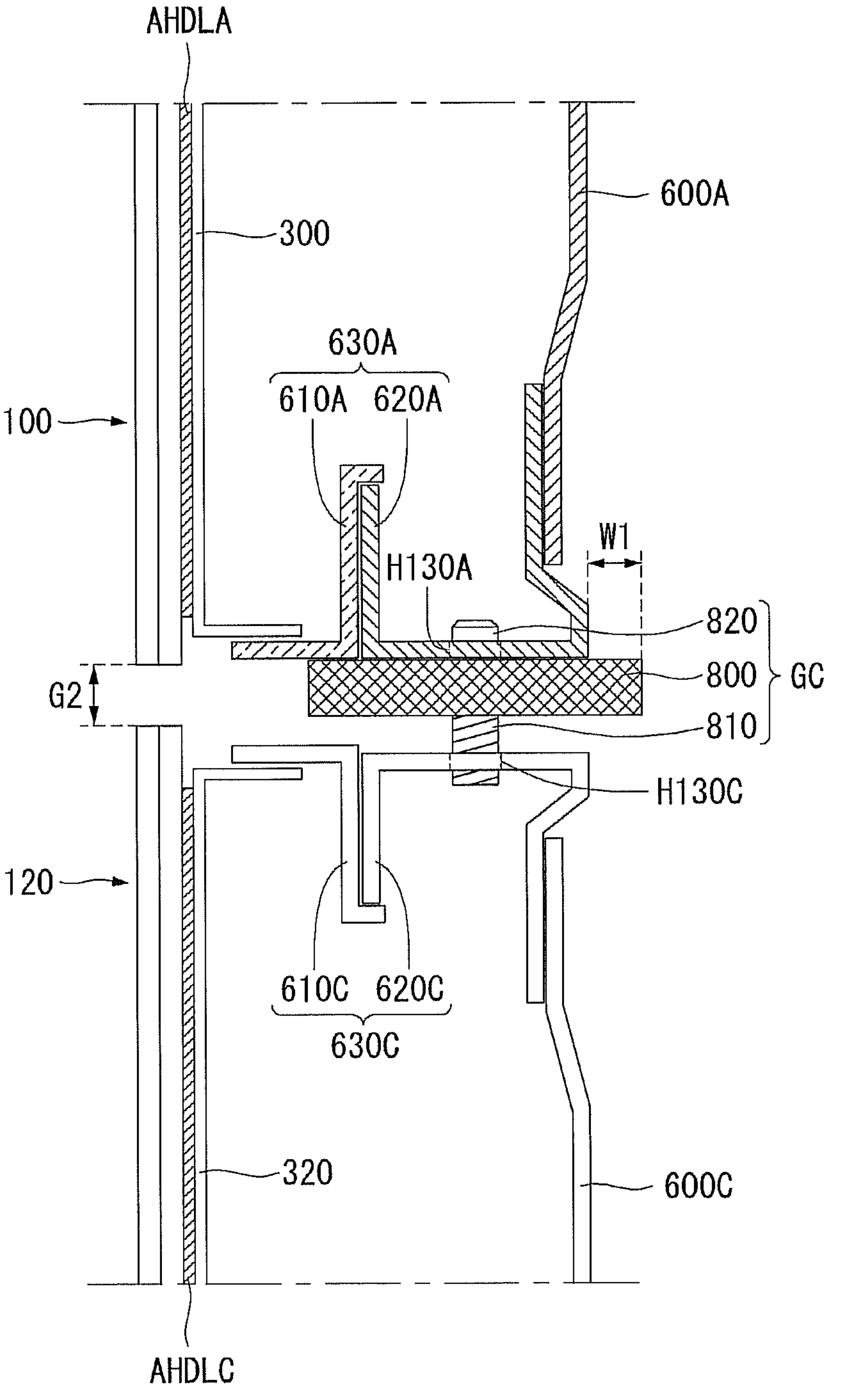

As shown in FIG. 37, the base plate 800 may include a portion, which protrudes further than the structures 630A and 630C to the backward by a predetermined length W1 at a boundary of the adjacent first and third display modules, so as to more easily rotate the base plate 800. Namely, the base plate 800 may include a portion protruding further than the structures 630A and 630C and/or the back covers 600A and 600C, so that the user can easily rotate the base plate 800 in the rear of the multi-display device.

Figure 38:
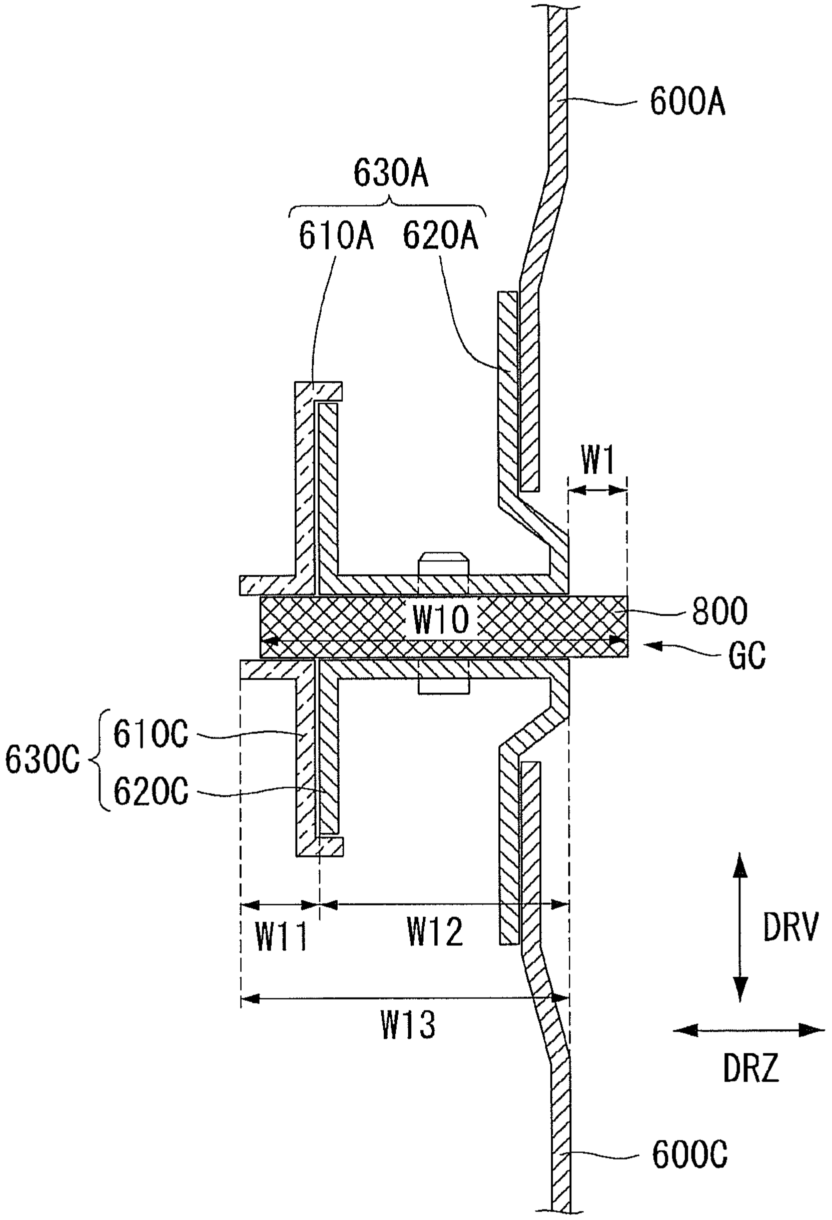

Alternatively, as shown in FIG. 38, a diameter W10 of the base plate 800 in a width direction (i.e., the third direction DRZ) of the display module MDL may be greater than a width W13 of the structures 630A and 630C. More specifically, the diameter W10 of the base plate 800 in the third direction DRZ may be greater than a width W11 of the first auxiliary frames 610A and 610C of the structures 630A and 630C and/or a width W12 of the second auxiliary frames 620A and 620C of the structures 630A and 630C. Further, the diameter W10 of the base plate 800 may be greater than a sum W13 (=W11+W12) of the width W11 of the first auxiliary frames 610A and 610C and the width W12 of the second auxiliary frames 620A and 620C. In this instance, the base plate 800 may sufficiently protrude to the backward.

Figure 39:
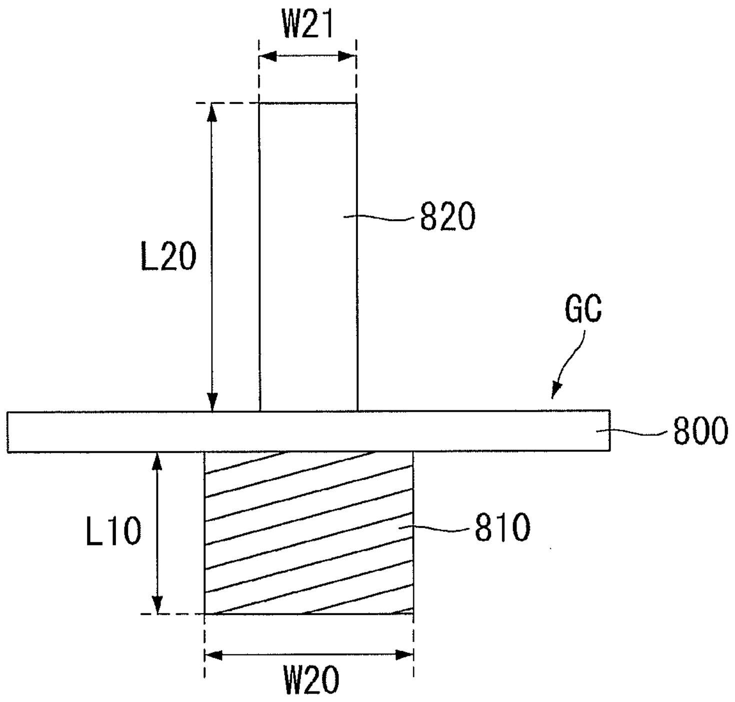

As shown in FIG. 39, a diameter W20 of the first protrusion 810 having the spirals may be greater than a diameter W21 of the second protrusion 820 not having the spiral.

Because the first protrusion 810 having the spirals is relatively strongly coupled with the hole H130C of the third display module, the first protrusion 810 may have the sufficient diameter. Thus, when the diameter W20 of the first protrusion 810 having the spirals is greater than the diameter W21 of the second protrusion 820 not having the spiral, the structural stability may be improved.

Further, because the first protrusion 810 having the spirals is relatively strongly coupled with the hole H130C of the third display module, a length L10 of the first protrusion 810 does not need to be excessively long.

On the other hand, the second protrusion 820 not having the spiral may have a sufficient length L20, so as to strongly couple with the hole H130A of the first display module.

Hence, the length L20 of the second protrusion 820 may be greater than the length L10 of the first protrusion 810. Alternatively, the length L20 of the second protrusion 820 may be substantially equal to the length L10 of the first protrusion 810.

Figure 40:
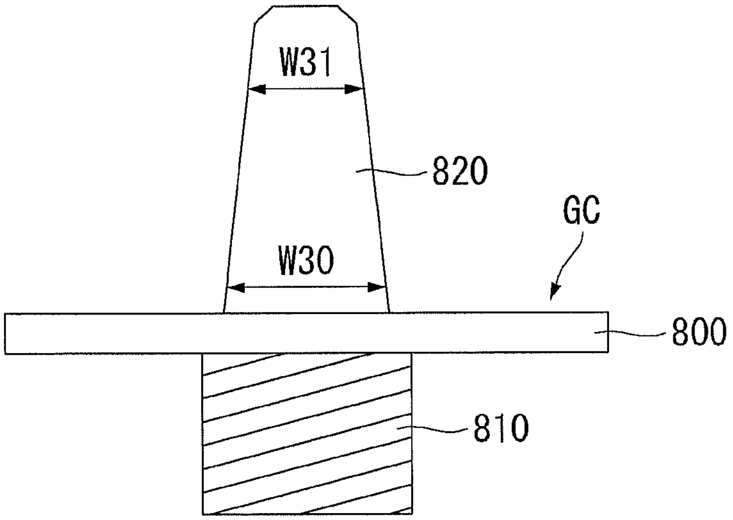

As shown in FIG. 40, the second protrusion 820 may include a portion which has a decreasing width as it goes from the bottom to the top. In other words, a width W30 of a lower portion (adjacent to the base plate 800) of the second protrusion 820 may be greater than a width W31 of an upper portion of the second protrusion 820.

In this instance, the second protrusion 820 may be easily inserted into the hole H130A of the first display module.

Figure 41:
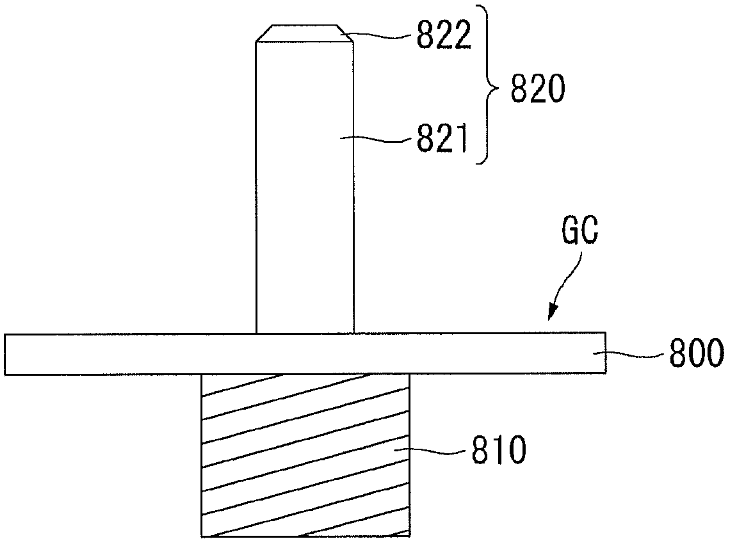

Alternatively, as shown in FIG. 41, the second protrusion 820 may include a lower portion 821 adjacent to the base plate 800 and an upper portion 822 positioned on the lower portion 821. The upper portion 822 may include a portion having a gradually decreasing width. The lower portion 821 may have the uniform width, Even in this instance, the second protrusion 820 may be easily inserted into the hole H130A of the first display module.

A spacer GC may be positioned between the two adjacent display modules MDL in the first direction (i.e., the horizontal direction) DRH, and may be positioned between the two adjacent display modules MDL in the second direction (i.e., the vertical direction) DRV.

Figure 42:
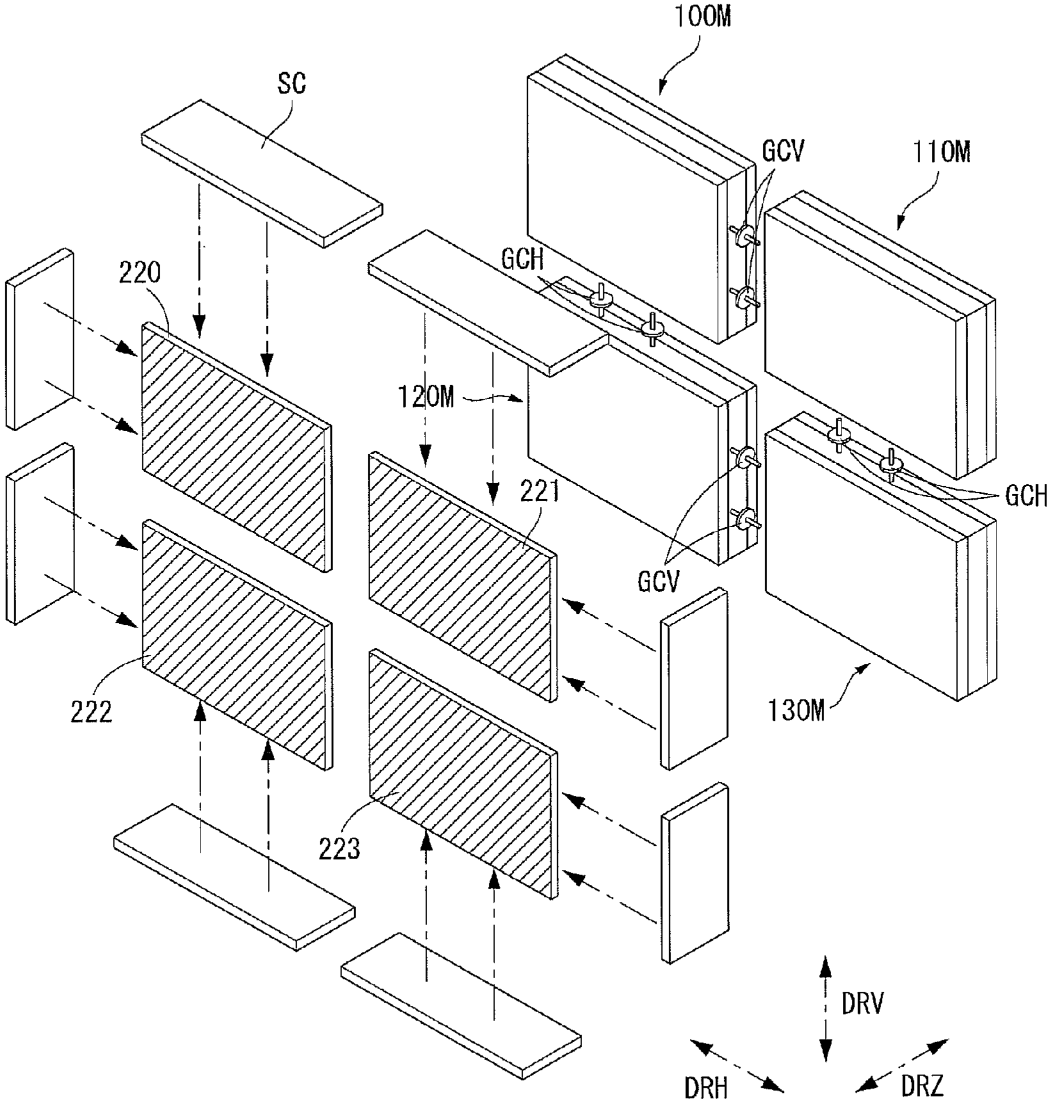

For example, as shown in FIG. 42, a plurality of first spacers GCH may be positioned parallel to one another between first and third display modules 100M and 120M and between second and fourth display modules 110M and 130M in the first direction DRH. Further, a plurality of second spacers GCV may be positioned parallel to one another between the first and second display modules 100M and 110M and between the third and fourth display modules 120M and 130M in the second direction DRV.

FIGS. 43 to 63 illustrate a method for supporting the plurality of display modules. In the following description, the descriptions of the configuration and the structure described above are omitted. For example, the structure described below may be applied to the descriptions of FIGS. 1 to 42.

Figure 43:
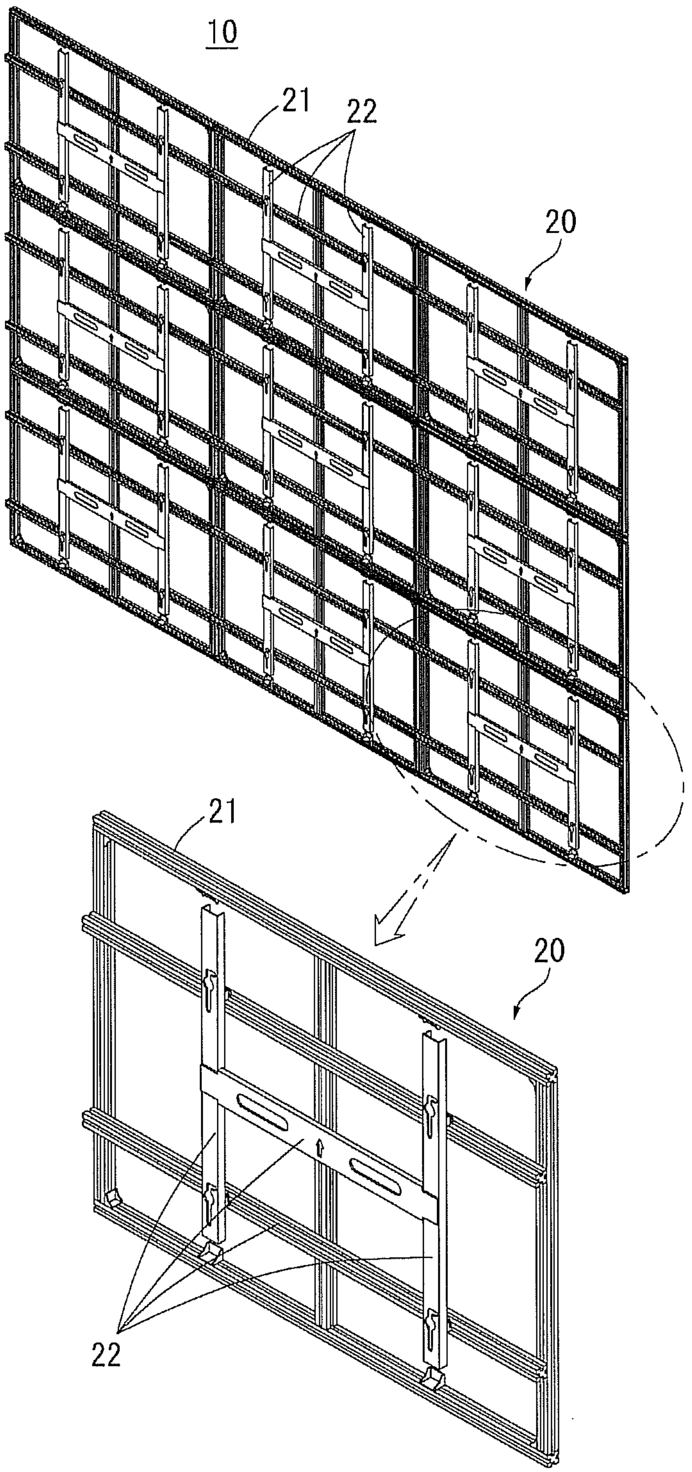
FIGS. 43 to 63 illustrate a method for supporting a plurality of display modules.
Figure 44:
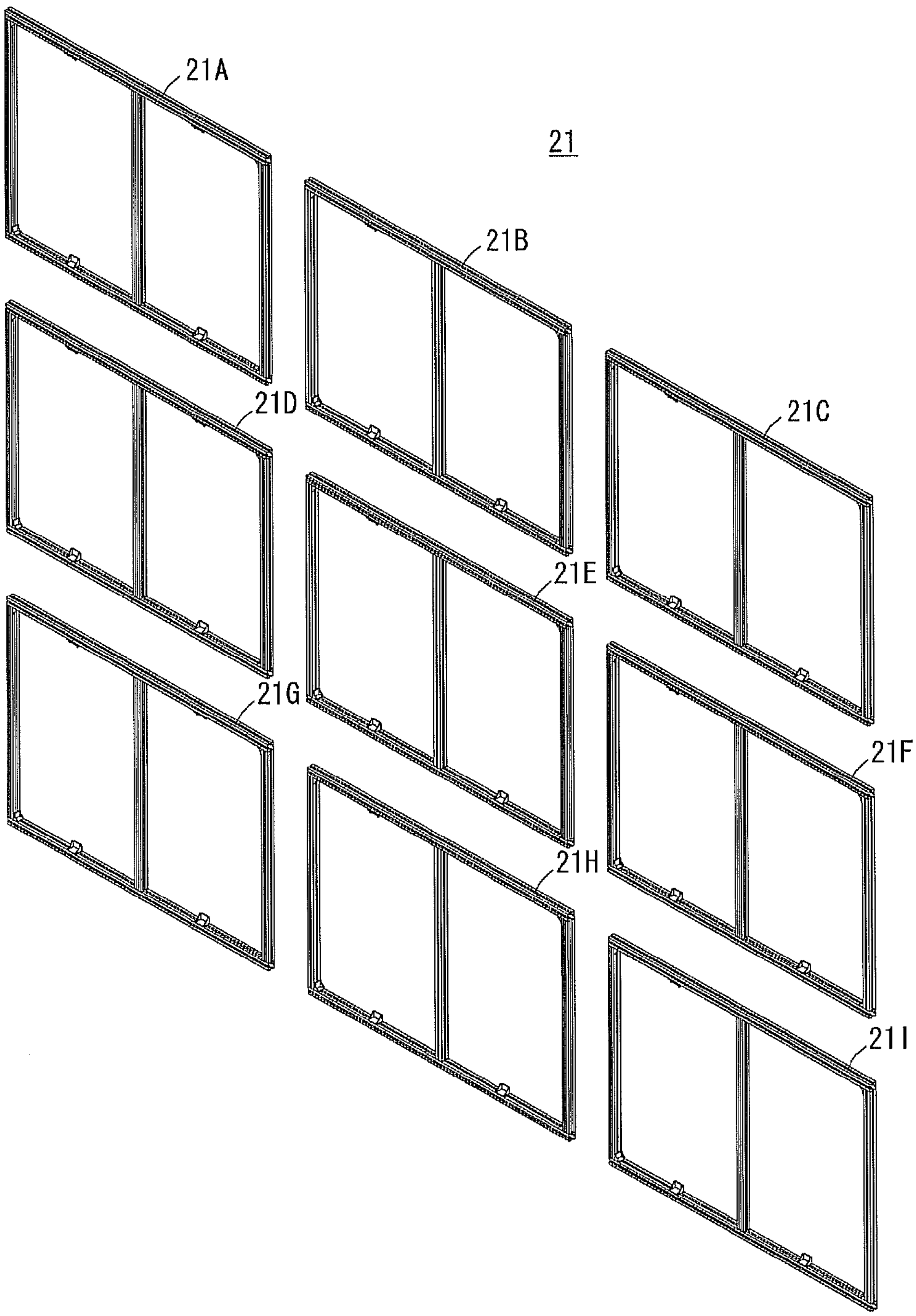

As shown in FIGS. 43 and 44, a multi-supporter 20, on which the plurality of display modules MDL are hang, may include a main frame 21 and a plurality of module supporters 22 connected to the main frame 21. The display module MDL may be hung on each module supporter 22.

As shown in FIG. 44, the main frame 21 may include a plurality of sub-main frames 21A to 21J. Namely, the plurality of sub-main frames 21A to 21J may configure one main frame 21.

The plurality of sub-main frames 21A to 21J may be connected to one another.

Figure 45:
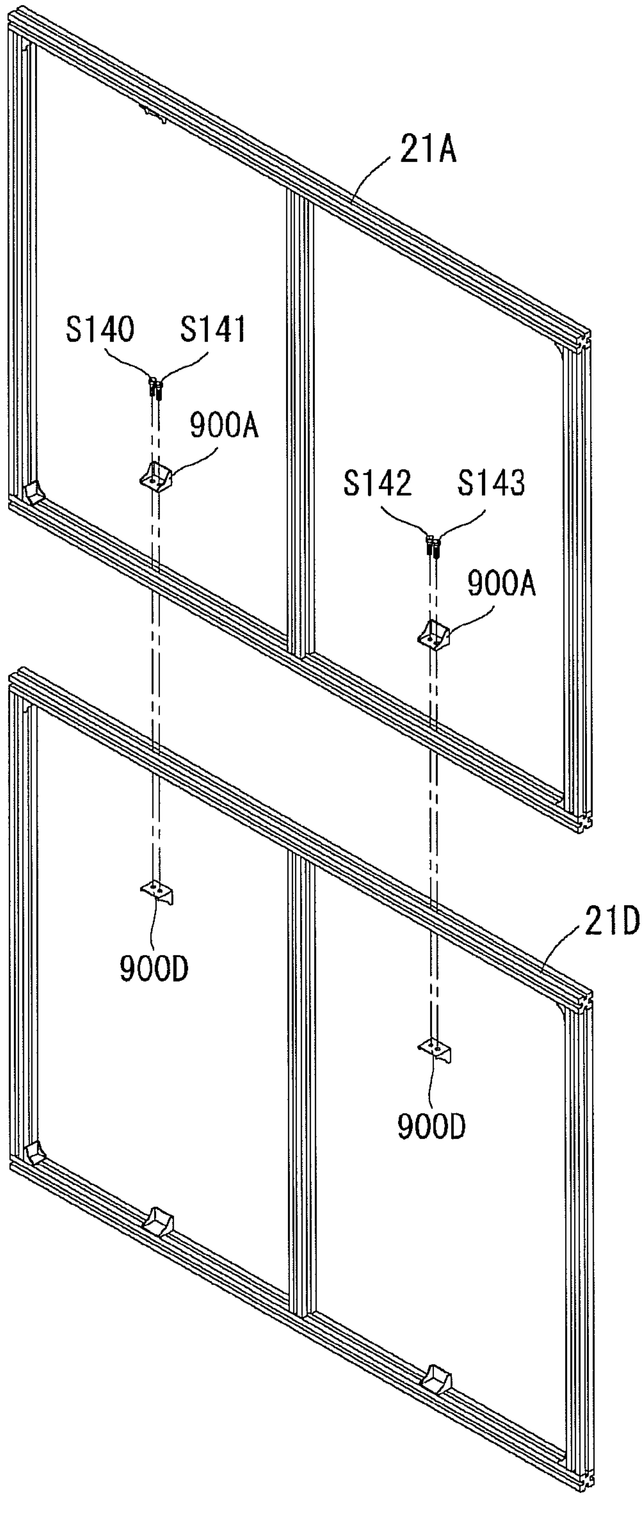

For example, as shown in FIG. 45, the adjacent first and fourth sub-main frames 21A and 21D may be connected to each other using predetermined fasteners S140 to S143.

More specifically, a first fastening structure 900A may be positioned on the first sub-main frame 21A, and a fourth fastening structure 900D may be positioned on the fourth sub-main frame 21D.

A hole for the fastening may be formed in the first fastening structure 900A and/or the fourth fastening structure 900D. A hole for the fastening may be formed in the first sub-main frame 21A and/or the fourth sub-main frame 21D.

The predetermined fasteners S140 to S143 may pass through the hole formed in the first fastening structure 900A and/or the fourth fastening structure 900D and the hole formed in the first sub-main frame 21A and/or the fourth sub-main frame 21D, thereby fastening the first sub-main frame 21A to the fourth sub-main frame 21D.

In the embodiment of the invention, the first fastening structure 900A and the fourth fastening structure 900D may be omitted.

Figure 46:
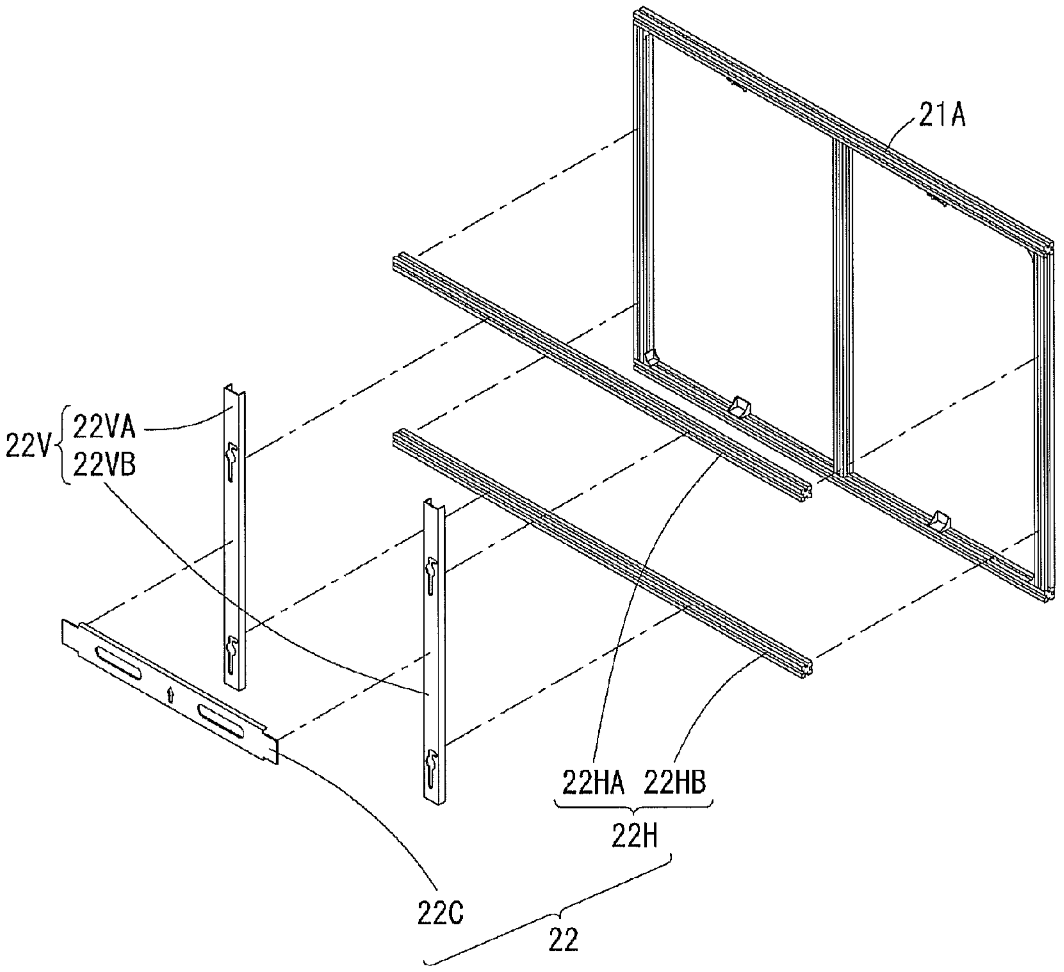
Figure 47:
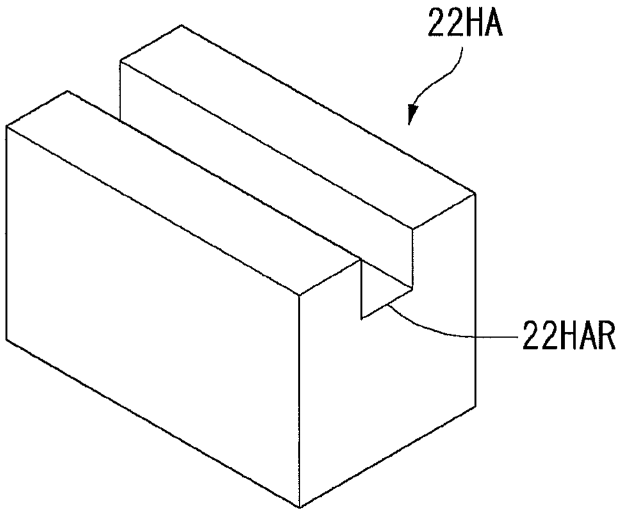
Figure 47:
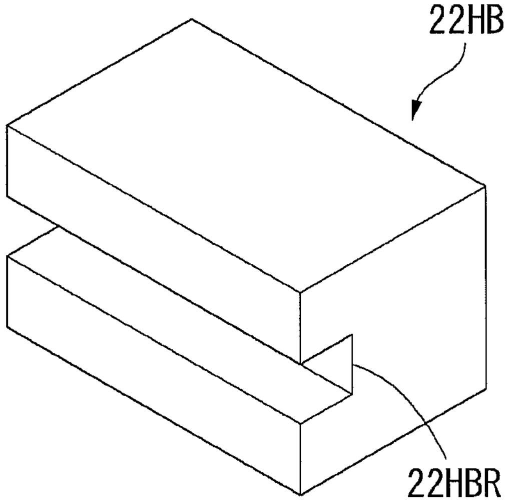

As shown in FIG. 46, the module supporter 22 may include at least one horizontal portion 22H connected to the first sub-main frame 21A of the main frame 21 in a horizontal direction (i.e., the first direction DRH) and at least one vertical portion 22V hanging in the second direction DRV vertical to the horizontal portion 22H.

For example, a first horizontal portion 22HA and a second horizontal portion 22HB may be positioned on the first sub-main frame 21A of the main frame 21. The first horizontal portion 22HA may be positioned above the second horizontal portion 22HB.

A first vertical portion 22VA and a second vertical portion 22VB may be hung parallel to each other on the first horizontal portion 22HA and the second horizontal portion 22HB. The first and second vertical portions 22VA and 22VB may include a portion hanging on the first horizontal portion 22HA and/or a portion hanging on the second horizontal portion 22HB.

The multi-supporter 20 may further include a connector 22C for connecting the first vertical portion 22VA to the second vertical portion 22VB. The connector 22C may connect the plurality of vertical portions.

The embodiment of the invention describes that the two horizontal portions 22H and the two vertical portions 22V are positioned on one sub-main frame. The number of horizontal portions 22H and/or the number of vertical portions 22V positioned on one sub-main frame are not limited.

A horizontal rail may be formed on the horizontal portion 22H. For example, as shown in (A) of FIG. 47, a first horizontal rail 22HAR may be formed on the first horizontal portion 22HA. As shown in (B) of FIG. 47, a second horizontal rail 22HBR may be formed on the second horizontal portion 22HB.

Figure 48:
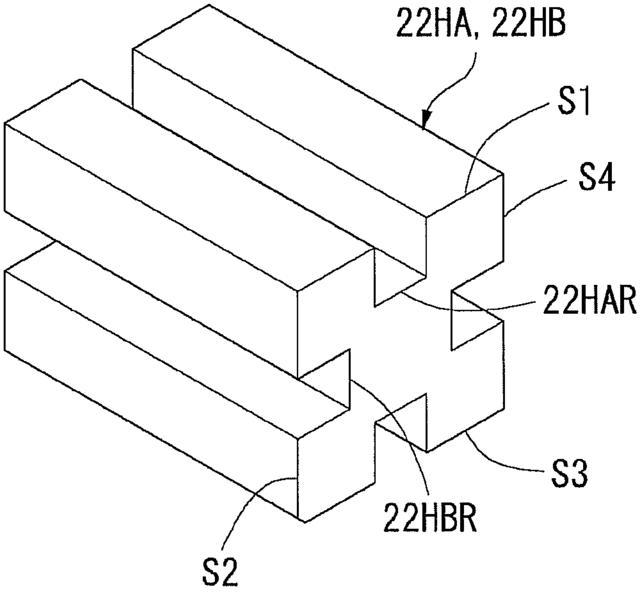

Alternatively, as shown in FIG. 48, both the first and second horizontal rails 22HAR and 22HBR may be formed on the first horizontal portion 22HA. For example, the first horizontal rail 22HAR may be formed on a first surface S1 of the first horizontal portion 22HA, and the second horizontal rail 22HBR may be formed on a second surface S2 adjacent to the first surface S1 of the first horizontal portion 22HA. A third surface S3 of the first horizontal portion 22HA is opposite to the first surface S1, and the second surface S2 is opposite to the third surface S3 and is adjacent to the first and fourth surfaces S1 and S4.

The second horizontal portion 22HB may substantially have the same structure as the first horizontal portion 22HA.

The vertical portion 22V of the module supporter 22 may have a plurality of holes.

Figure 49:
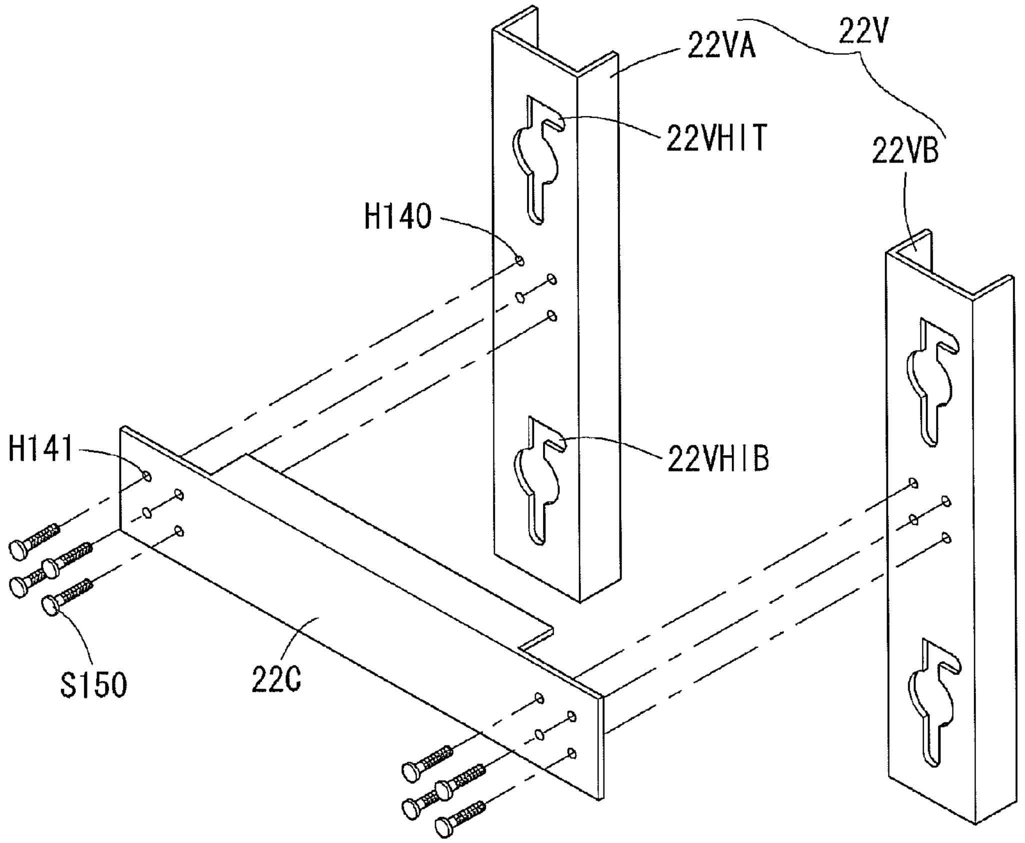

For example, as shown in FIG. 49, each of the first vertical portion 22VA and the second vertical portion 22VB may have an upper hole 22VH1T and a lower hole 22VH1B. The upper hole 22VH1T and the lower hole 22VH1B may be used to hang the display module MDL on the module supporter 22.

Figure 50:
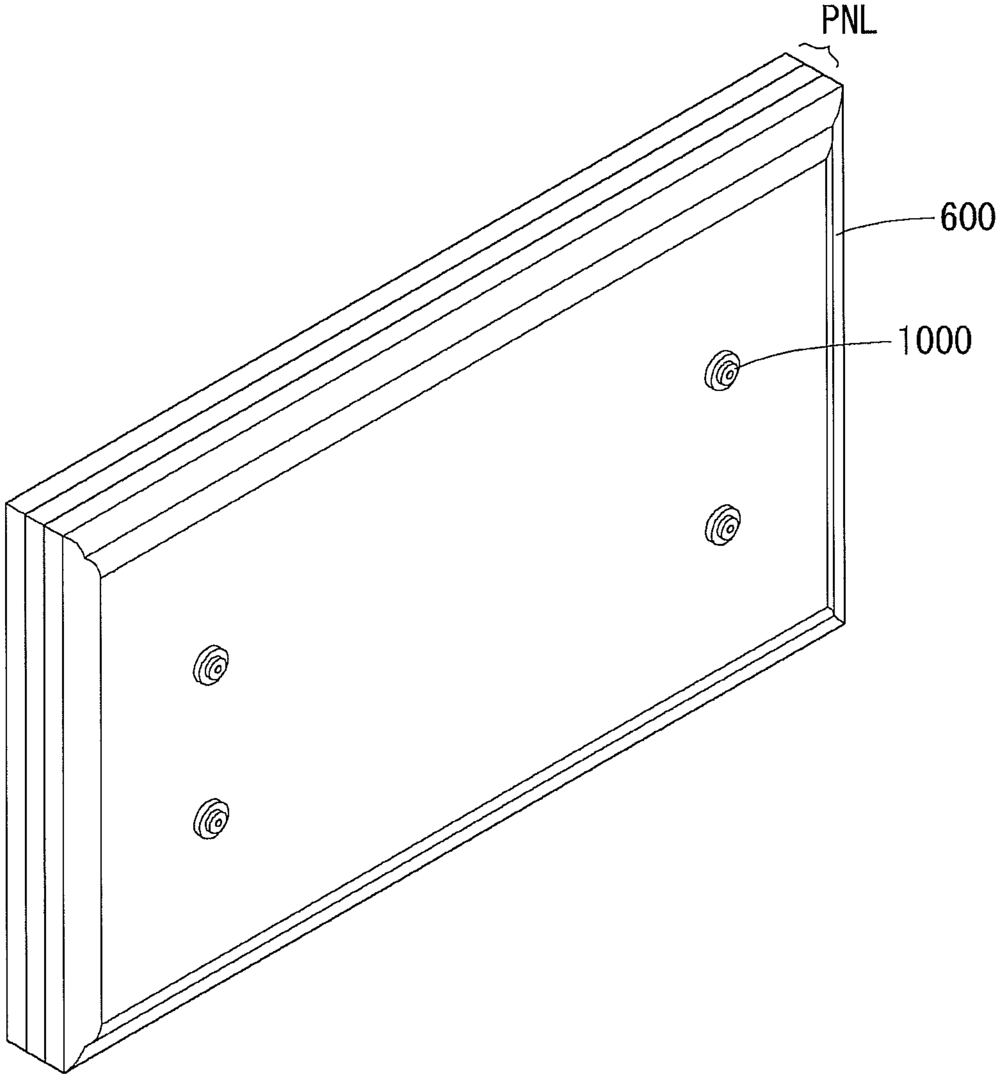

Each of the first and second vertical portions 22VA and 22VB may have a fastening hole H140 for the connection between the connector 22C and the first and second vertical portions 22VA and 22VB. The connector 22C may have holes H141 corresponding to the fastening holes H140. A predetermined fastener S150 may pass through the holes H141 of the connector 22C and the fastening holes H140, thereby connecting the connector 22C to the first and second vertical portions 22VA and 22VB As shown in FIG. 50, the display module MDL may include a plurality of protrusions 1000 formed on the back cover 600. Although not shown, the protrusions 1000 may be connected to the back cover 600 using a predetermined fastener.

Figure 51:
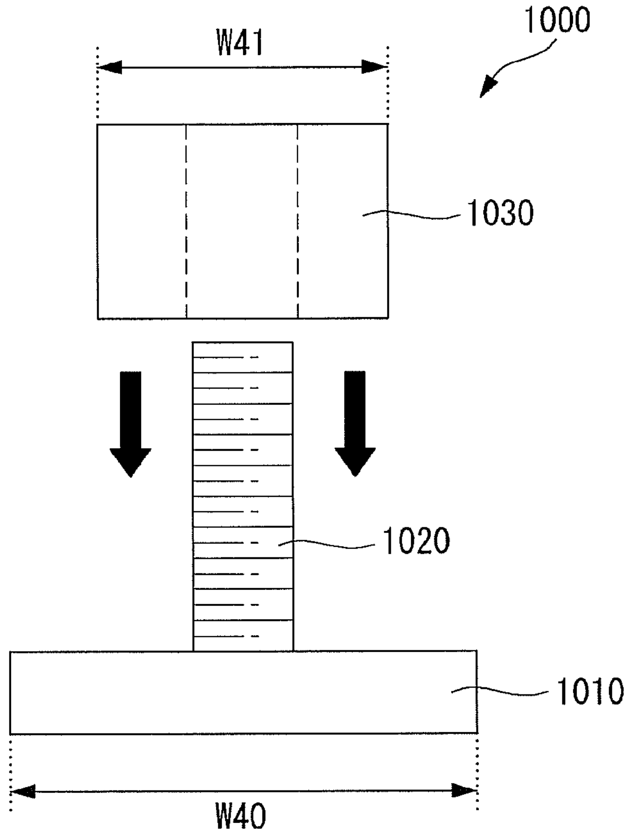

As shown in FIG. 51, each of the protrusions 1000 may include a stand 1010, a pillar 1020 positioned on the stand 1010, and a head 1030 coupled with the pillar 1020.

A width W41 of the head 1030 may be less than a width W40 of the stand 1010.

The pillar 1020 may include a male screw, and the head 1030 may include a female screw corresponding to the male screw of the pillar 1020. Hence, the pillar 1020 may be strongly coupled with the head 1030.

The stand 1010 of the protrusion 1000 may be connected to the back cover 600 of the display module MDL. For example, although not shown, the stand 1010 may be connected to the back cover 600 using a predetermined fastener. Alternatively, although not shown, the fastener for fastening the stand 1010 to the back cover 600 may be formed on the stand 1010.

The protrusions 1000 may be inserted into the upper hole 22VH1T and/or the lower hole 22VH1B of the vertical portion 22V of the module supporter 22, thereby hanging the display module MDL on the module supporter 22.

Figure 52:
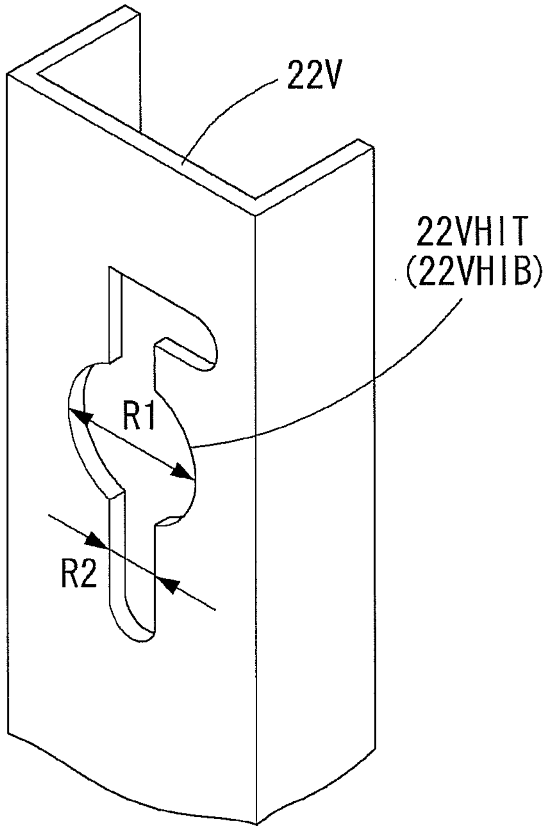

As shown in FIG. 52, the upper hole 22VH1T and/or the lower hole 22VH1B of the vertical portion 22V may include a portion having a diameter R1 greater than the width W41 of the head 1030 and a portion having a diameter R2 less than the width W41 of the head 1030, so as to easily insert the protrusions 1000 into the upper hole 22VH1T and/or the lower hole 22VH1B of the vertical portion 22V of the module supporter 22.

Figure 53:
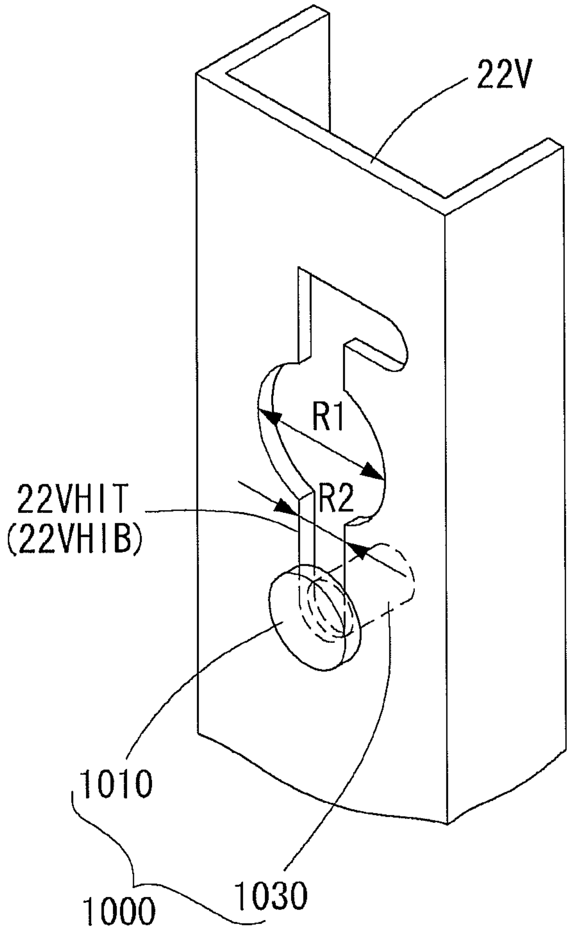
Figure 54:
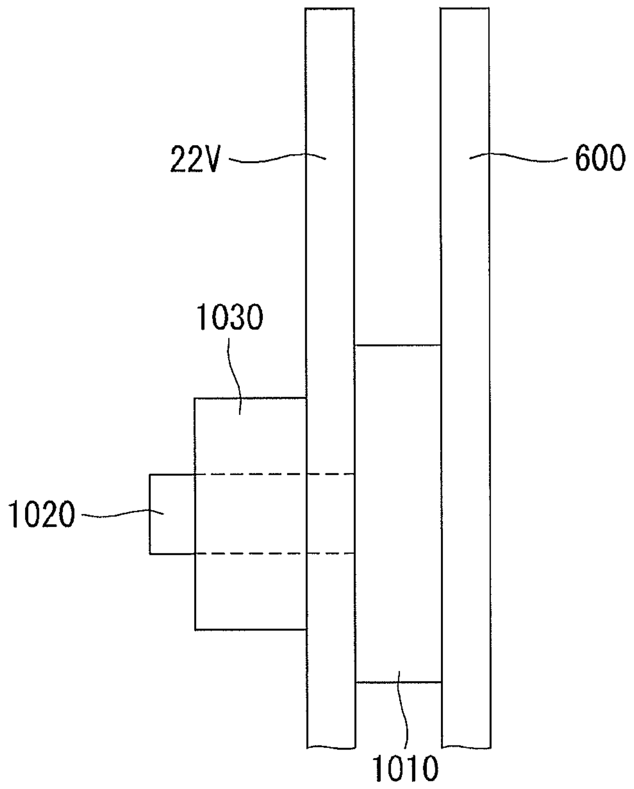

The head 1030 of the protrusion 1000 may enter into the portion having the diameter R1 of the upper hole 22VH1T and/or the lower hole 22VH1B of the vertical portion 22V. Hence, as shown in FIGS. 53 and 54, the head 1030 of the protrusion 1000 may be positioned in the front of the upper hole 22VH1T and/or the lower hole 22VH1B of the vertical portion 22V. The stand 1010 of the protrusion 1000 may be positioned on the opposite side of the head 1030, i.e., in the rear of the upper hole 22VH1T and/or the lower hole 22VH1B of the vertical portion 22V. Hence, the display module MDL may be hung on the vertical portion 22V of the module supporter 22.

Figure 55:
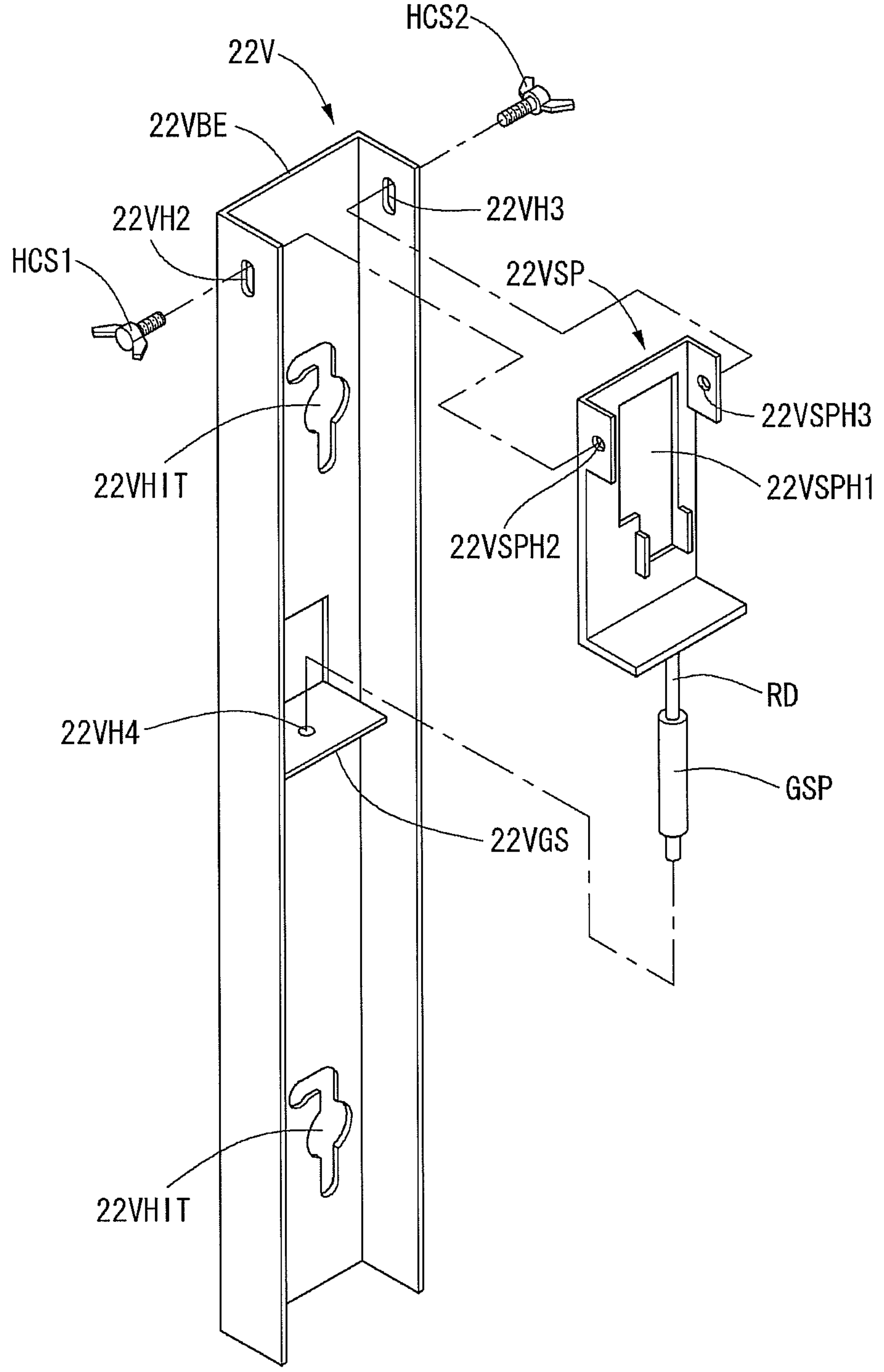

As shown in FIG. 55, the vertical portion 22V may include a base 22VBE having a plurality of holes, a spring part GSP fixed to the base 22VBE, and a supporter 22VSP, on which the protrusion 1000 passing through the holes of the base 22VBE is hung.

The vertical portion 22V may further include a connection rod RD for connecting the spring part GSP to the supporter 22VSP.

The vertical portion 22V may further include fixers HCS1 and HCS2 for fixing the supporter 22VSP to the base 22VBE. The fixers HCS1 and HCS2 may be a fastener such as a screw.

The base 22VBE of the vertical portion 22V may have the upper hole 22VH1T and the lower hole 22VH1B corresponding to the protrusion 1000. The upper hole 22VH1T and the lower hole 22VH1B were described in detail above.

The base 22VBE of the vertical portion 22V may have fixing holes 22VH2 and 22VH3 for fixing the supporter 22VSP.

A spring fixer 22VGS for disposing the spring part GSP may be formed on the base 22VBE of the vertical portion 22V. The spring fixer 22VGS may have a hole 22VH4 into which a portion of the spring part GSP is inserted.

The supporter 22VSP may have holes 22VSPH2 and 22VSPH3 used to fasten the supporter 22VSP to the base 22VBE.

The supporter 22VSP may have a support hole 22VSPH1 corresponding to the upper hole 22VH1T of the base 22VBE. The upper hole 22VH1T and the support hole 22VSPH1 may overlap each other. The size of the support hole 22VSPH1 may be greater than the size of the upper hole 22VHIT.

The spring part GSP may be at least one of a gas spring and a hydraulic spring.

Figure 56:
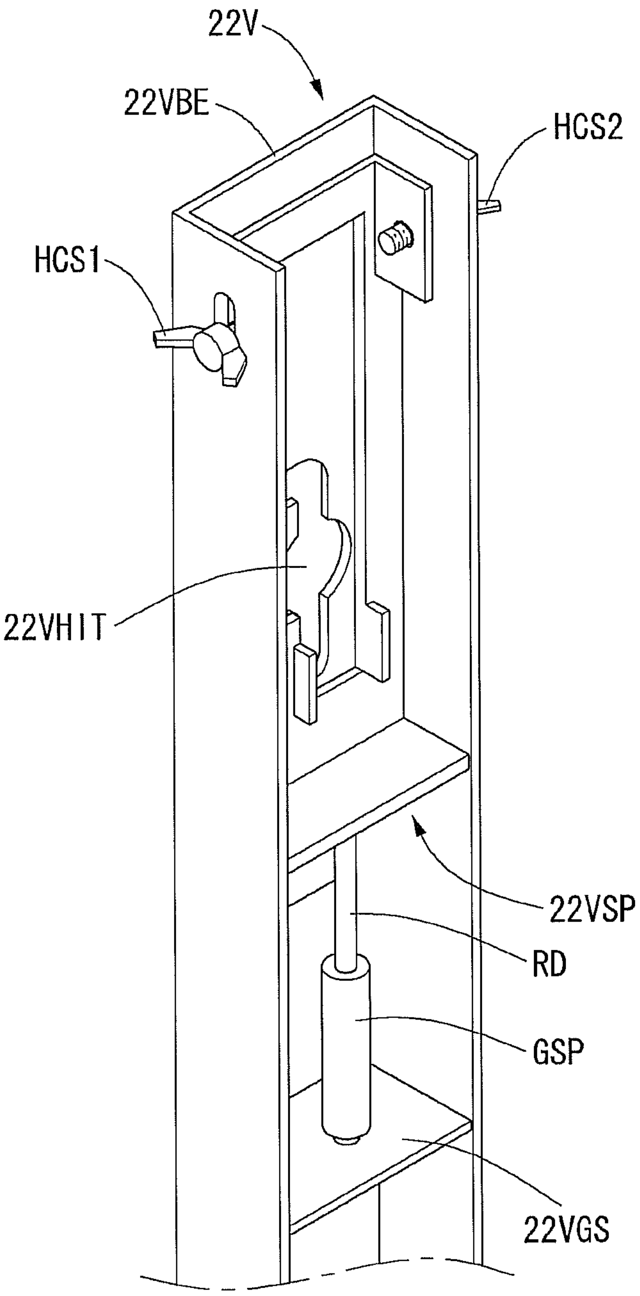

As shown in FIG. 56, when the spring part GSP is inserted into the hole 22VH4 of the spring fixer 22VGS and the supporter 22VSP is placed on the base 22VBE, the upper hole 22VH1T of the base 22VBE may correspond to the support hole 22VSPH1.

Figure 57:
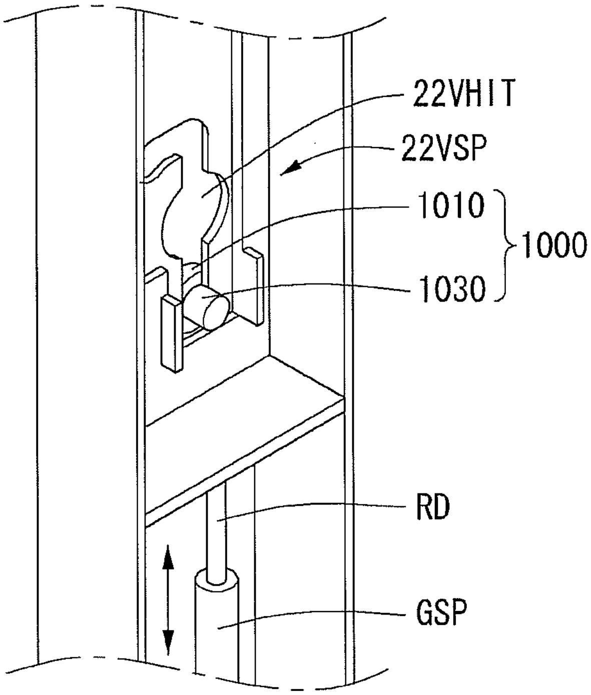

As shown in FIG. 57, when the protrusion 1000 is hung on the upper hole 22VHIT and the support hole 22VSPH1, the protrusion 1000 may pass through the upper hole 22VH1T and may be hung on the support hole 22VSPH1.

In this state, even if the user uses the small force because of the help of the spring part GSP, the user may easily lift the display module MDL. Hence, the user may easily install and dismantle the display module MDL.

In the multi-display device, the height of each of the display modules MDL may be easily adjusted.

After the height of each display module MDL is adjusted using the spring part GSP, the supporter 22VSP may be fixed to the base 22VBE of the vertical portion 22V using the fixers HCS1 and HCS2. For example, the fixers HCS1 and HCS2 may pass through the holes 22VSPH2 and 22VSPH3 of the supporter 22VSP and the fixing holes 22VH2 and 22VH3 of the base 22VBE, and thus the supporter 22VSP may be fixed to the base 22VBE of the vertical portion 22V.

The vertical portion 22V of the module supporter 22 may include at least one roller.

Figure 58:
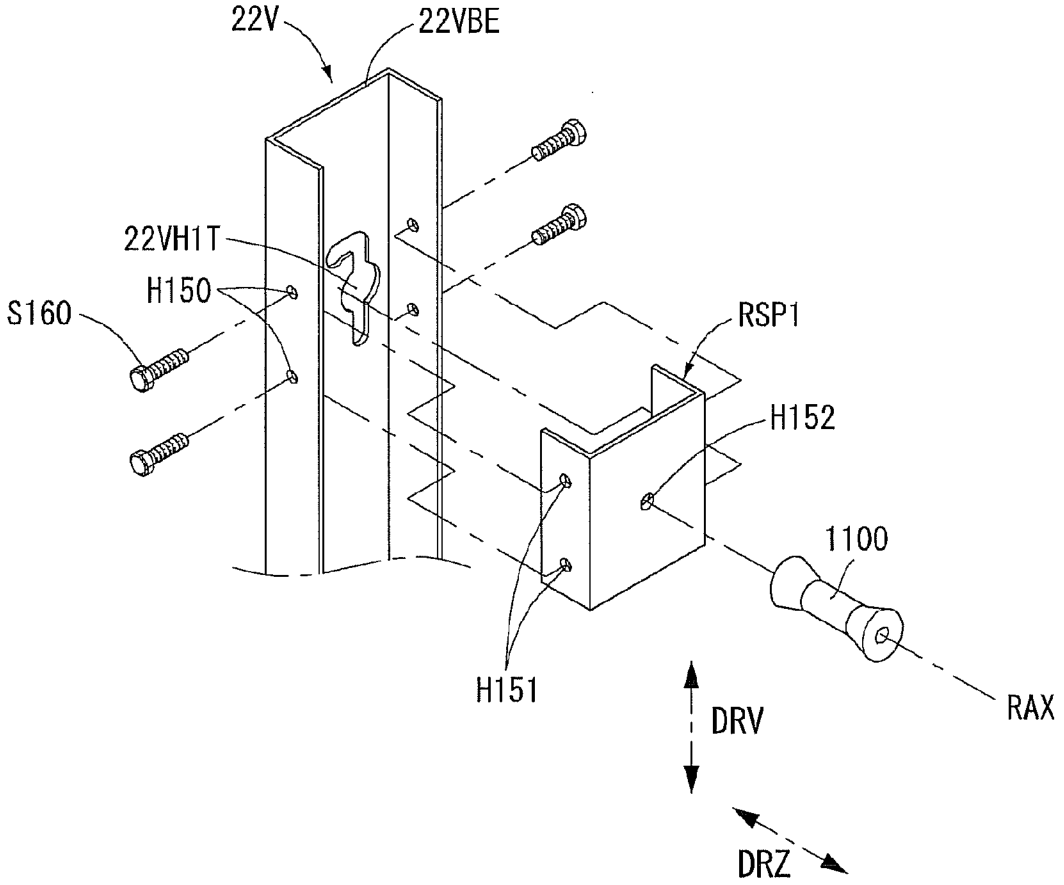

For example, as shown in FIG. 58, a first roller stand RSP1 may be connected to the base 22VBE of the vertical portion 22V, and a first roller 1100 may be positioned on the first roller stand RSP1. More specifically, the base 22VBE of the vertical portion 22V may have at least one hole H150 used to fasten the base 22VBE to the first roller stand RSP1, and the first roller stand RSP1 may have a hole H151 used to fasten the base 22VBE to the first roller stand RSP1. A predetermined fastener S160 may be inserted into the hole H150 of the base 22VBE and the hole H151 of the first roller stand RSP1 to connect the first roller stand RSP1 to the base 22VBE.

An axis RAX of the first roller 1100 may extend in the third direction DRZ. Hence, the first roller 1100 may rotate on the axis RAX extending in the third direction DRZ.

Figure 59:
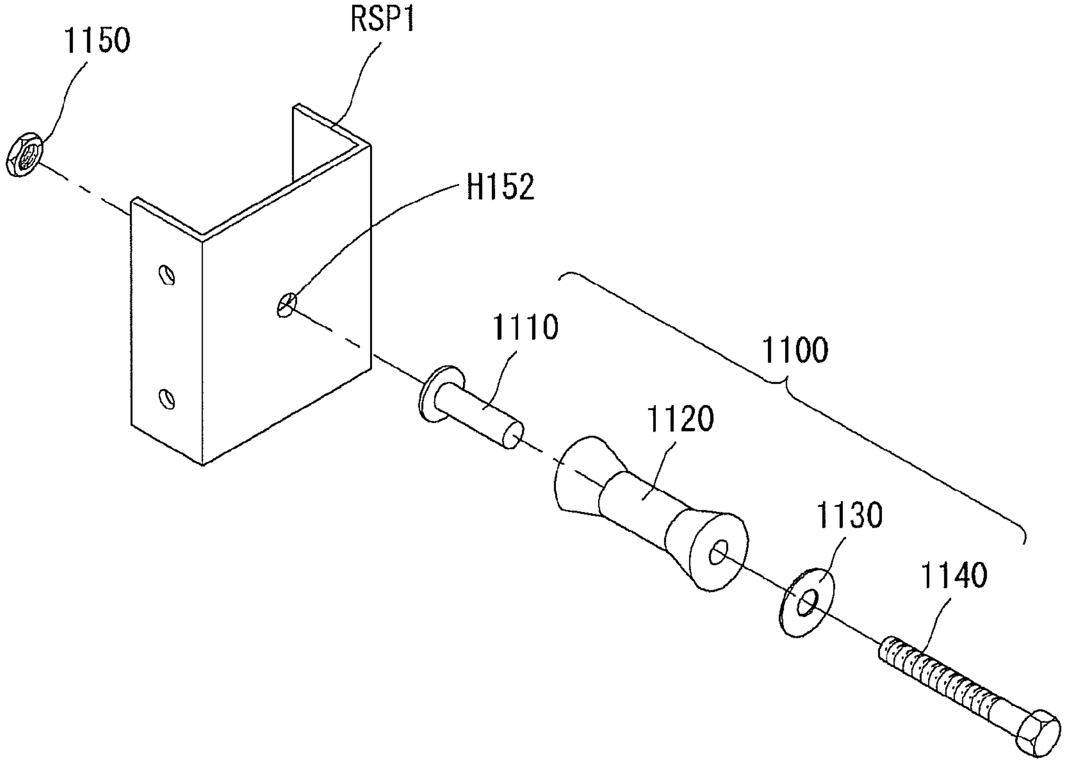

Further, as shown in FIG. 59, the first roller stand RSP1 may have a hole H152 for connecting the first roller 1100 to the first roller stand RSP1.

The first roller 1100 may include a first shaft 1110, a first caster 1120 inserted into the first shaft 1110, a first bolt 1140, a first nut 1150 coupled with the first bolt 1140, and a first washer 1130 positioned between the first bolt 1140 and the first caster 1120.

The first caster 1120 may rotate in a state the first caster 1120 is inserted into the first shaft 1110. The first washer 1130 may prevent a reduction in a rotational force of the first caster 1120 resulting from the contact between the first bolt 1140 and the first caster 1120.

The first bolt 1140 and the first nut 1150 may be replaced by other kinds of fasteners. For example, the first roller 1100 may be connected to the first roller stand RSP1 using a rivet.

The vertical portion 22V including the first roller 1100 may be hung on the horizontal portion 22H.

Figure 60:
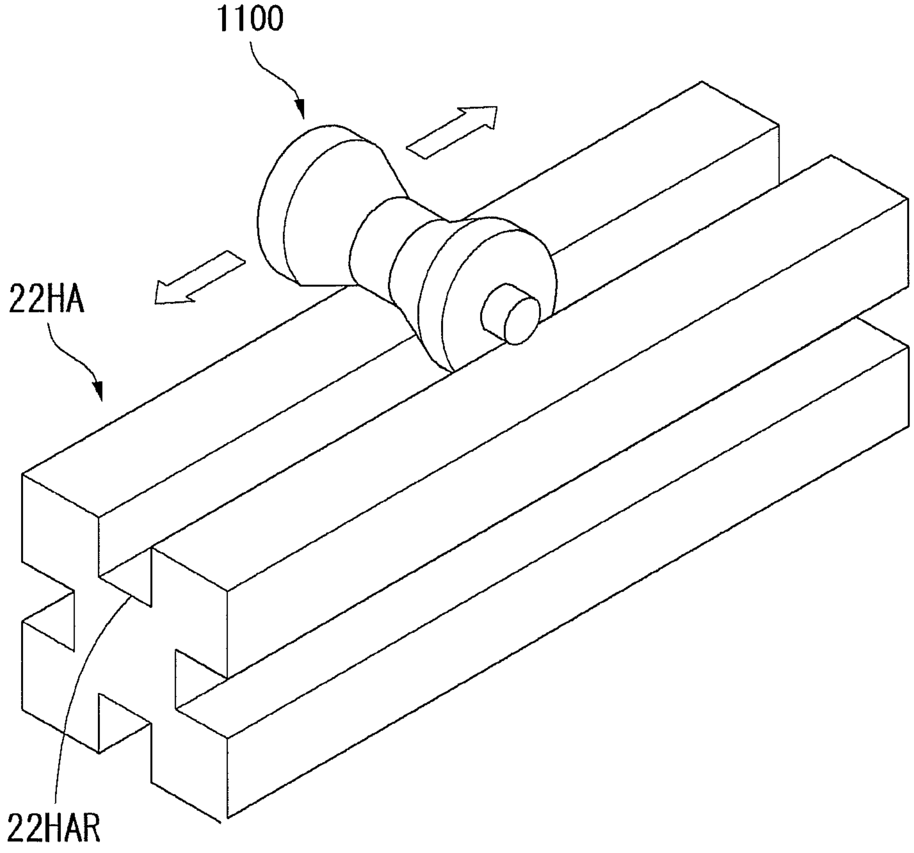

For example, as shown in FIG. 60, the first roller 1100 of the vertical portion 22V may be installed so that the first roller 1100 can move along the first horizontal rail 22HAR of the first horizontal portion 22HA.

The vertical portion 22V of the module supporter 22 may include a second roller 1200 different from the first roller 1100.

Figure 61:
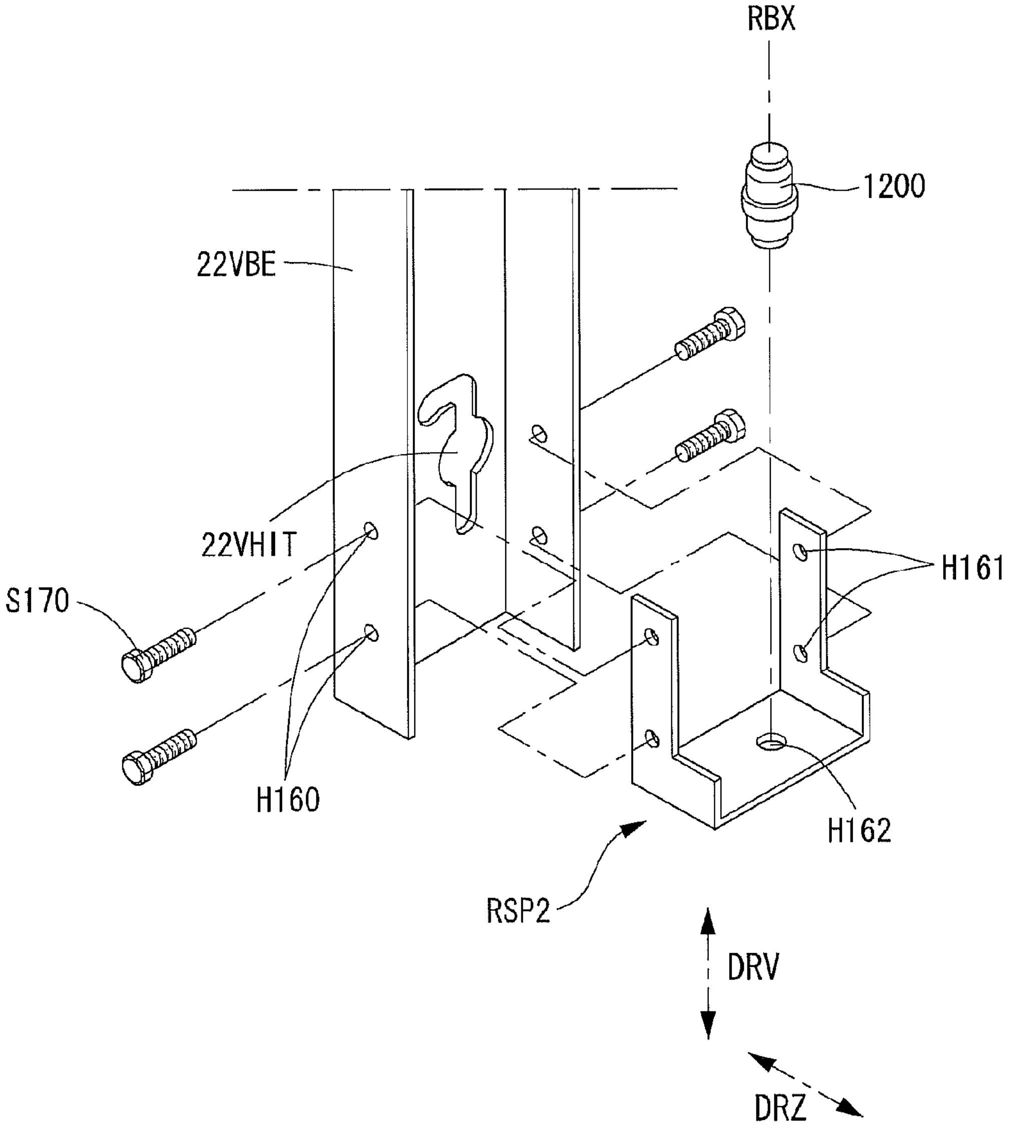

For example, as shown in FIG. 61, a second roller stand RSP2 may be connected to the base 22VBE of the vertical portion 22V, and the second roller 1200 may be positioned on the second roller stand RSP2. More specifically, the base 22VBE of the vertical portion 22V may have at least one hole H160 used to fasten the base 22VBE to the second roller stand RSP2, and the second roller stand RSP2 may have a hole H161 used to fasten the base 22VBE to the second roller stand RSP2. A predetermined fastener S170 may be inserted into the hole H160 of the base 22VBE and the hole H161 of the second roller stand RSP2 to connect the second roller stand RSP2 to the base 22VBE.

An axis RBX of the second roller 1200 may extend in the second (or vertical) direction DRV. Hence, the second roller 1200 may rotate on the axis RBX extending in the second direction DRV.

Figure 62:
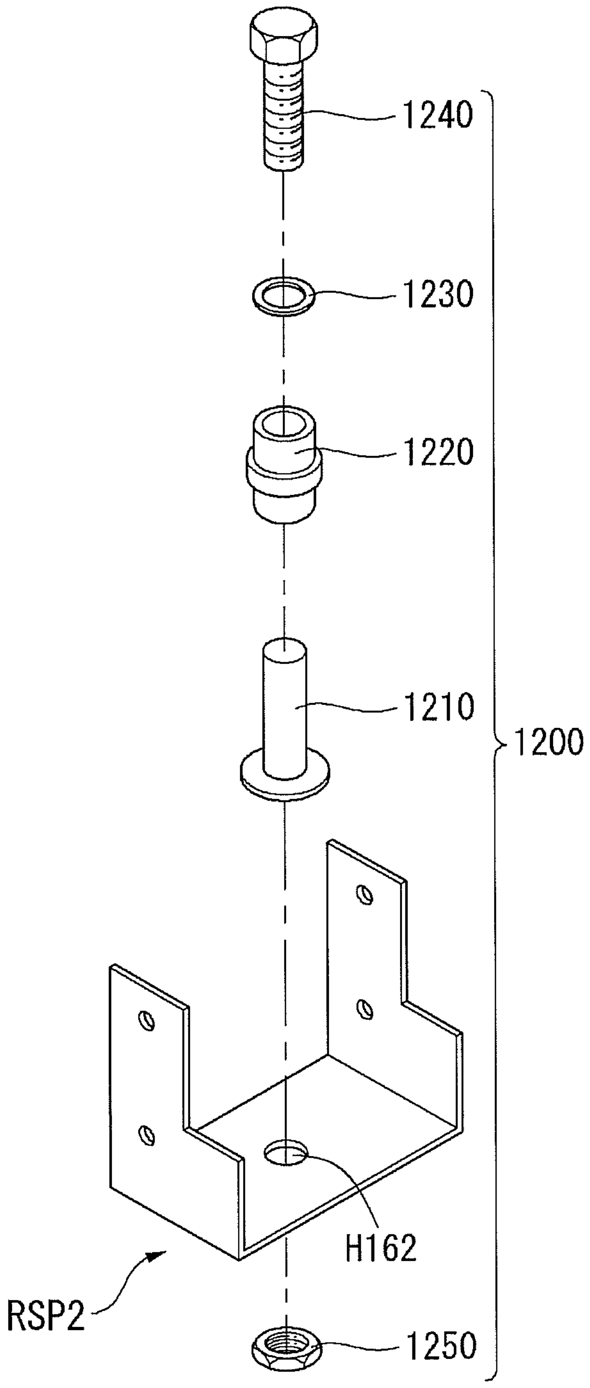

Further, as shown in FIG. 62, the second roller stand RSP2 may have a hole H162 for connecting the second roller 1200 to the second roller stand RSP2.

The second roller 1200 may include a second shaft 1210, a second caster 1220 inserted into the second shaft 1210, a second bolt 1240, a second nut 1250 coupled with the second bolt 1240, and a second washer 1230 positioned between the second bolt 1240 and the second caster 1220.

The second caster 1220 may rotate in a state the second caster 1220 is inserted into the second shaft 1210. The second washer 1230 may prevent a reduction in a rotational force of the second caster 1220 resulting from the contact between the second bolt 1240 and the second caster 1220.

The second bolt 1240 and the second nut 1250 may be replaced by other kinds of fasteners.

Figure 63:
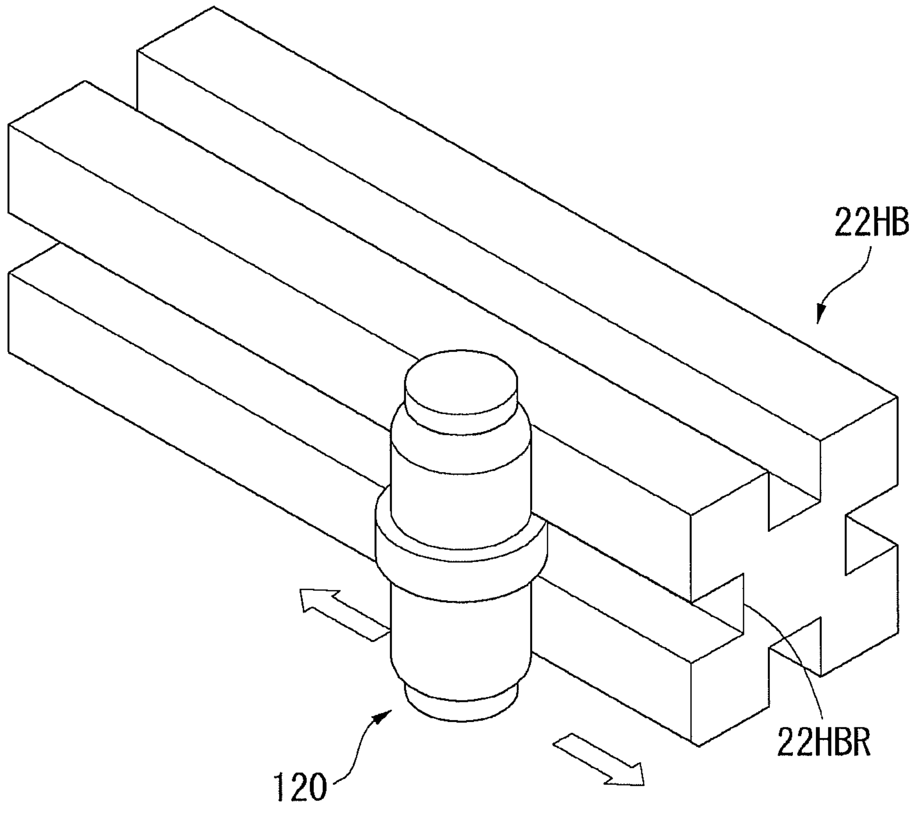

The vertical portion 22V including the first and second rollers 1100 and 1200 may be hung on the first and second horizontal portions 22HA and 22HB. Hence, as shown in FIG. 63, the second roller 1200 of the vertical portion 22V may be installed so that the second roller 1200 can move along the second horizontal rail 22HBR of the second horizontal portion 22HB.

Because the first roller 1100 is hung on the first horizontal portion 22HA as shown in FIG. 60, the second roller 1200 may not hung on the second horizontal portion 22HB.

As described above, when the first and second rollers 1100 and 1200 are used, the user may easily move each of the display modules MDL hung on the module supporter 22 in the horizontal direction. Further, the user may easily adjust the distance between the display modules MDL of the multi-display device in the horizontal direction.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A multi-display device comprising:

a main frame;

a plurality of module supporters disposed on the main frame;

a plurality of display modules which are hung on the plurality of module supporters, each of the plurality of display modules including a display panel; and a spacer positioned between the two adjacent display modules, wherein the spacer includes:

a base plate extending in a width direction of the display modules;

a first protrusion extending from a first surface of the base plate; and a second protrusion extending from a second surface opposite the first surface of the base plate, wherein the base plate includes a portion which protrudes further than the two adjacent display modules in the width direction of the display modules, wherein each of first and second display modules, which are adjacent to each other, has a hole, wherein the first protrusion is inserted into the hole of the first display module, and the second protrusion is inserted into the hole of the second display module, and wherein each of the first and second display modules includes:

the display panel;

a frame attached to a back surface of the display panel;

a back cover positioned in the rear of the frame; and a structure positioned between the frame and the back cover, the structure having a hole.

2. The multi-display device of claim 1, wherein the first protrusion has spirals, wherein a diameter of the first protrusion is greater than a diameter of the second protrusion, wherein a length of the second protrusion is equal to or greater than a length of the first protrusion.

3. The multi-display device of claim 1, wherein a surface roughness of a third surface adjacent to the first and second surfaces of the base plate is greater than a surface roughness of the first and second surfaces of the base plate.

4. The multi-display device of claim 1, wherein a diameter of the base plate in the width direction of the display modules is greater than a width of the structure in the width direction of the display modules.

5. The multi-display device of claim 1, wherein the base plate includes a portion, which protrudes further than the structure to the backward at a boundary of the first and second display modules in the width direction of the display modules.

6. The multi-display device of claim 1, further comprising:

a substrate positioned in the front of the display module; and a side cover which is positioned on the side of the display module and the side of the substrate and is connected to the display module and the substrate.

7. The multi-display device of claim 6, wherein the side cover includes an outer cover and an inner cover positioned between the outer cover and the substrate, wherein elasticity of the inner cover is greater than elasticity of the outer cover.

8. The multi-display device of claim 7, wherein the outer cover includes a first hole for fastening the outer cover to the display module and a first rail corresponding to the substrate, wherein the inner cover includes a second rail positioned on the first rail, wherein an end of the substrate is inserted into the second rail.

9. The multi-display device of claim 8, wherein a length of the inner cover is less than a length of the outer cover.

10. The multi-display device of claim 8, wherein the display module includes: the display panel;

a frame attached to a back surface of the display panel;

a back cover positioned in the rear of the frame; and a structure which is positioned between the frame and the back cover and connects the frame to the back cover, the structure having a second hole corresponding to the first hole of the outer cover.

11. The multi-display device of claim 8, wherein the plurality of substrates are inserted into the second rail of at least one of the plurality of inner covers.

12. The multi-display device of claim 8, wherein the number of substrates is equal to or less than the number of display modules.

13. The multi-display device of claim 1, wherein the plurality of module supporters include:

at least one horizontal portion connected to the main frame in a horizontal direction; and at least one vertical portion which is hung on the horizontal portion in a vertical direction.

14. The multi-display device of claim 13, wherein the at least one horizontal portion includes a horizontal rail formed in the horizontal direction, wherein the at least one vertical portion includes a roller which is movable along the horizontal rail.

15. The multi-display device of claim 14, wherein the at least one horizontal portion includes first and second horizontal portions, which are positioned on the main frame in the horizontal direction and are parallel to each other, the first horizontal portion being positioned above the second horizontal portion in the vertical direction, wherein the roller includes a first roller corresponding to the horizontal rail formed in the first horizontal portion and a second roller corresponding to the horizontal rail formed in the second horizontal portion.

16. The multi-display device of claim 15, wherein an axis of the first roller extends in a direction vertical to the horizontal direction and the vertical direction, wherein an axis of the second roller extends in the vertical direction.

17. The multi-display device of claim 13, wherein the at least one vertical portion includes:

a base having a hole;

a spring part fixed to the base; and a supporter connected to the spring part using a connection rod, a protrusion of the display module passing through the hole of the base and being hung on the supporter.

18. The multi-display device of claim 15, wherein the at least one vertical portion includes first and second vertical portions, which are hung on the first and second horizontal portions in the vertical direction and are positioned parallel to each other.

19. The multi-display device of claim 1, wherein an axis of the first protrusion is the same as an axis of the second protrusion.

* * * * *